(12) United States Patent
Sato

(10) Patent No.: US 7,618,277 B2
(45) Date of Patent: Nov. 17, 2009

(54) METHOD OF MOUNTING AND DEMOUNTING A SEMICONDUCTOR DEVICE, DEVICE FOR MOUNTING AND DEMOUNTING A SEMICONDUCTOR DEVICE USING THE SAME, AND SOCKET FOR A SEMICONDUCTOR DEVICE

(75) Inventor: Masaru Sato, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 121 days.

(21) Appl. No.: 11/212,706

(22) Filed: Aug. 29, 2005

(65) Prior Publication Data

US 2006/0043990 A1    Mar. 2, 2006

(30) Foreign Application Priority Data

Aug. 31, 2004  (JP) .............................. 2004-253342

(51) Int. Cl.
*H01R 13/62* (2006.01)
(52) U.S. Cl. .................. 439/331; 439/264; 439/265; 439/73
(58) Field of Classification Search ................ 439/331, 439/264, 330, 266, 73, 265, 259, 267
See application file for complete search history.

(56) References Cited

U.S. PATENT DOCUMENTS

| | | | |
|---|---|---|---|
| 4,715,823 A | 12/1987 | Ezura et al. |
| 4,887,969 A | 12/1989 | Abe |
| 4,889,499 A | 12/1989 | Sochor |
| 5,249,972 A | 10/1993 | Walker |
| 5,301,416 A | 4/1994 | Foerstel |
| 5,342,213 A | 8/1994 | Kobayashi |
| 5,342,214 A | 8/1994 | Hsu |
| 5,458,499 A | 10/1995 | Matsuoka |
| 5,482,471 A | 1/1996 | Mori et al. |
| 5,493,237 A | 2/1996 | Volz et al. |
| 5,518,410 A | 5/1996 | Masami |
| 5,531,608 A | 7/1996 | Abe |
| 5,573,427 A | 11/1996 | Sagano |
| 5,611,705 A | 3/1997 | Pfaff |
| 5,807,104 A | 9/1998 | Ikeya et al. |

(Continued)

FOREIGN PATENT DOCUMENTS

EP    0 969 710 A2    1/2000

(Continued)

OTHER PUBLICATIONS

Official Action from German Patent Office for German Patent Application No. 10223502.3-55, which is a corresponding application of U.S. Appl. No. 10/153,638, which issued as U.S. Patent No. 6,739,894.

(Continued)

*Primary Examiner*—Xuong M Chung-Trans
(74) *Attorney, Agent, or Firm*—Finnegan, Henderson, Farabow, Garrett & Dunner, LLP

(57) ABSTRACT

A cover member 34 is moved upward when a semiconductor device 26 disposed in a positioning member 44 is held by an absorption pad 24 to pinch an electrode portion 26a of the semiconductor device 26 with movable contact portions 46M and 46F of a contact terminal 46ai.

14 Claims, 57 Drawing Sheets

U.S. PATENT DOCUMENTS

| | | | |
|---|---|---|---|
| 5,923,179 A | 7/1999 | Taylor | |
| 6,027,355 A | 2/2000 | Ikeya | |
| 6,106,319 A | 8/2000 | Fukunaga et al. | |
| 6,126,467 A | 10/2000 | Ohashi | |
| 6,149,449 A | 11/2000 | Abe | |
| 6,155,859 A | 12/2000 | Choy | |
| 6,213,806 B1 | 4/2001 | Choy | |
| 6,243,267 B1 | 6/2001 | Chuang | |
| 6,261,114 B1 | 7/2001 | Shimada | |
| 6,280,219 B1 * | 8/2001 | Sano et al. | 439/268 |
| 6,280,222 B1 | 8/2001 | Walkup | |
| 6,283,780 B1 | 9/2001 | Yamamoto et al. | |
| 6,296,504 B1 | 10/2001 | Ohashi | |
| 6,296,505 B1 | 10/2001 | Fukunaga et al. | |
| 6,322,384 B1 * | 11/2001 | Ikeya | 439/331 |
| 6,328,587 B1 | 12/2001 | Hsu | |
| 6,350,138 B1 * | 2/2002 | Atobe et al. | 439/266 |
| 6,371,782 B1 | 4/2002 | Ohashi | |
| 6,371,783 B1 | 4/2002 | Ohashi et al. | |
| 6,383,002 B1 | 5/2002 | Ohashi | |
| 6,402,537 B2 | 6/2002 | Ikeya | |
| 6,439,897 B1 | 8/2002 | Ikeya | |
| 6,443,741 B1 | 9/2002 | Watanabe | |
| 6,461,182 B1 | 10/2002 | Hsu | |
| 6,517,370 B2 | 2/2003 | Fukunaga | |
| 6,609,923 B2 | 8/2003 | Sato et al. | |
| 6,707,309 B2 * | 3/2004 | Sato et al. | 324/755 |
| 6,739,894 B2 | 5/2004 | Ogura | |
| 6,752,645 B2 | 6/2004 | Nakamura et al. | |
| 6,758,684 B2 | 7/2004 | Oikawa et al. | |
| 6,776,641 B2 | 8/2004 | Hachuda | |
| 6,776,643 B2 | 8/2004 | Nakano | |
| 6,793,512 B2 | 9/2004 | Abe et al. | |
| 6,796,823 B1 | 9/2004 | Nakano et al. | |
| 6,976,863 B2 * | 12/2005 | Sato | 439/266 |
| 7,118,386 B2 * | 10/2006 | Sato et al. | 439/73 |
| 7,165,978 B2 | 1/2007 | Sato et al. | |
| 7,204,708 B2 | 4/2007 | Sato et al. | |
| 7,230,830 B2 | 6/2007 | Ujike et al. | |
| 2006/0228915 A1 | 10/2006 | Sato et al. | |

FOREIGN PATENT DOCUMENTS

| | | |
|---|---|---|
| EP | 0 969 711 A2 | 1/2000 |
| EP | 1 111 724 A2 | 6/2001 |
| JP | 57-125632 | 1/1984 |
| JP | 60-189977 | 12/1985 |
| JP | 62-160676 | 7/1987 |
| JP | 63-299257 A | 12/1988 |
| JP | 02-049381 | 2/1990 |
| JP | 02-119378 | 5/1990 |
| JP | 03-072548 | 3/1991 |
| JP | 04-135190 | 5/1992 |
| JP | 05-029050 A | 2/1993 |
| JP | 5-047445 | 2/1993 |
| JP | 05-020286 | 3/1993 |
| JP | 06-020752 A | 1/1994 |
| JP | 06-020753 A | 1/1994 |
| JP | 06-203936 A | 7/1994 |
| JP | 06-290839 A | 10/1994 |
| JP | 7-239362 | 9/1995 |
| JP | 08-046335 | 2/1996 |
| JP | 8-138812 | 5/1996 |
| JP | 08-273777 A | 10/1996 |
| JP | 09-92421 A | 4/1997 |
| JP | 2665419 | 6/1997 |
| JP | 09-199217 | 7/1997 |
| JP | 09-199250 A | 7/1997 |
| JP | 09-211067 | 8/1997 |
| JP | 9-245920 | 9/1997 |
| JP | 10-073635 | 3/1998 |
| JP | 10-256764 | 9/1998 |
| JP | 10-302925 A | 11/1998 |
| JP | 11-097818 | 4/1999 |
| JP | 11-126671 A | 5/1999 |
| JP | 11-238566 A | 8/1999 |
| JP | 2973406 B1 | 9/1999 |
| JP | 2000-048923 A | 2/2000 |
| JP | 2000-113954 A | 4/2000 |
| JP | 2000-150092 A | 5/2000 |
| JP | 2000-182739 A | 6/2000 |
| JP | 2000-182740 | 6/2000 |
| JP | 2000-182740 A | 6/2000 |
| JP | 2000-340324 A | 12/2000 |
| JP | 2001-13207 A | 1/2001 |
| JP | 2001-43947 A | 2/2001 |
| JP | 2001-066346 | 3/2001 |
| JP | 2001-151234 | 6/2001 |
| JP | 2001-185313 | 7/2001 |
| JP | 2001-326045 A | 11/2001 |
| JP | 3257994 | 12/2001 |
| JP | 3257994 B | 12/2001 |
| JP | 2002-063975 A | 2/2002 |
| JP | 2002-202729 | 7/2002 |
| JP | 2003-007942 | 1/2003 |
| JP | 2003-123926 | 4/2003 |
| JP | 2004-014873 | 1/2004 |

OTHER PUBLICATIONS

Office Action from Japanese Patent Office in Japanese Patent Application No. 2001-171133, which is a corresponding application of U.S. Appl. No. 10/161,641, which issued as U.S. Patent No. 6,758,684.

Office Action from Japanese Patent Office in Japanese Patent Application No. 2001-241318, which is a corresponding application of U.S. Appl. No. 10/212,875, which issued as U.S. Patent No. 6,752,645.

Official Letter from Japanese Patent Office for Japanese Patent Application No. 2001-157657 with English translation, which is a corresponding application of U.S. Appl. No. 10/153,638, which issued as U.S. Patent No. 6,739,894.

Official Notice of Rejection of Japanese Patent Office for Japanese Patent Application No. 2003-393067, dated Jul. 5, 2005, which is a corresponding application of U.S. Appl. No. 10/735,882, which is published as U.S. Patent Application Publication No. 2004/0248435 A1.

Office Action in related U.S. Appl. No. 10/153,638 dated Jun. 30, 2003, which now issued as U.S. Patent No. 6,739,894.

Office Action in related U.S. Appl. No. 10/161,641 dated May 5, 2003, which now issued as U.S. Patent Application No. 6,758,684.

Office Action in related U.S. Appl. No. 10/161,641 dated Oct. 17, 2003, which now issued as U.S. Patent Application No. 6,758,684.

Office Action in related U.S. Appl. No. 10/187,624 dated Aug. 29, 2003, which now issued as U.S. Patent No. 6,776,643.

Office Action in related U.S. Appl. No. 10/187,624 dated Dec. 30, 2003, which now issued as U.S. Patent No. 6,776,643.

Office Action in related U.S. Appl. No. 10/187,624 dated May 30, 2003, which now issued as U.S. Patent No. 6,776,643.

Office Action in related U.S. Appl. No. 10/212,875 dated Aug. 21, 2003, which now issued as U.S. Patent No. 6,752,645.

Office Action in related U.S. Appl. No. 10/214,714 dated Aug. 8, 2003, which now issued as U.S. Patent No. 6,793,512.

Office Action in related U.S. Appl. No. 10/214,714 dated Feb. 17, 2004, which now issued as U.S. Patent No 6,793,512.

Office Action in related U.S. Appl. No. 10/358,288 dated Nov. 5, 2003, which now issued as U.S. Patent No. 6,796,823.

Office Action in related U.S. Appl. No. 10/735,882 dated May 11, 2005, which now issued as U.S. Patent No. 6,796,823.

Office Action in related U.S. Appl. No. 10/735,882 dated Nov. 3, 2005, which now issued as U.S. Patent No. 6,796,823.

Office Action of related U.S. Appl. No. 10/358,288 dated Apr. 23, 2003.

Official Action from German Patent Office for German Patent Application No. 10223502.3-55.
Official Letter from Japanese Patent Office for Japanese Patent Application No. 2001-203790.
Official Letter from Japanese Patent Office for Japanese Patent Application No. 2001-157657.

Office Action dated Oct. 23, 2007 in corresponding Japanese Patent Application No. 2004-253342.
Official Letter from Korean Patent Office, dated Sep. 18, 2004, for corresponding Korean Patent Application No. 10-2002-0038155.

* cited by examiner

METHOD OF MOUNTING AND DEMOUNTING A SEMICONDUCTOR DEVICE, DEVICE FOR MOUNTING AND DEMOUNTING A SEMICONDUCTOR DEVICE USING THE SAME, AND SOCKET FOR A SEMICONDUCTOR DEVICE

This application claims priority from Japanese Patent Application No. 2004-253342 filed Aug. 31, 2004, which are hereby incorporated by reference herein.

BACKGROUND OF THE INVENTION

1. Field of the Invention

The present invention relates to a method of mounting and demounting a semiconductor device, a device for mounting and demounting a semiconductor device using the same, and a socket for a semiconductor device.

2. Description of the Related Art

Various tests are conducted on a semiconductor device to be mounted in an electronic apparatus or the like to eliminate any potential defect of the same at a stage prior to the mounting. A socket for a semiconductor device used in such a test is generally referred to as an IC socket. For example, as described in Japanese Patent Application Laid-open Hei 8-138812 (1996), such a socket is disposed on a printed wiring board having an input/output portion to which a predetermined test voltage is supplied and which transmits an abnormality detection signal indicating a short circuit and the like from a semiconductor device.

For example, as described in Japanese Patent Application Laid-open Hei 8-138812 (1996), a socket for a semiconductor device comprises a socket main body secured on a printed wiring board and having a housing portion for housing a contact operating member to be described later such that it can be moved relative to a pair of movable contact portions of contact terminals, a guide member having a housing portion in which a semiconductor device, e.g., a BGA type (Ball Grid Array) semiconductor device is mounted, for guiding the semiconductor device to the housing portion and positioning the semiconductor device relative to the contact terminals, a contact operating member provided in the socket main body so as to be moved reciprocally along a predetermined direction, the contact operating member for moving one of the movable contact portions of the contact terminals toward or away from the other movable contact portion, and a cover member which transmits an applied operating force to the contact operating member as a driving force through a driving mechanism of the contact operating member.

The socket main body has the housing portion therein from which a pair of movable contact portions of a plurality of contact terminals protrudes. Each of the contact terminals comprises a fixed terminal on a base end thereof which is provided on the socket main body in association with electrode portions of a semiconductor device that is mounted and a pair of movable contact portions which selectively pinch or release the electrode portions of the semiconductor device coupled to the terminal. According to a movement of the contact operating member, the pair of movable contact portions approach each other to pinch the electrode portions of the semiconductor device or move away from each other to release the electrode portions of the semiconductor device.

The contact operating member is disposed in the housing portion of the socket main body such that it can move along the moving directions of the movable contact portions of each contact terminal. For example, as described in Japanese Patent No. 3257994, there is a proposal in which the contact operating member is disposed such that it can move along a direction substantially orthogonal to the moving directions of the movable contact portions of each contact terminal.

The contact operating member has an opening therein from which the movable contact portions of each contact terminal protrude. Openings in different rows are partitioned by respective partition walls.

In the contact operating member, a movable contact pressing portion is provided at each of adjoining pairs of openings in the same row from which the movable contact portions of the contact terminal protrude, the pressing portion being formed so as to separate one of the movable contact portions from the other movable contact portion.

Further, an urging member for urging the contact operating member back to an initial position is provided between one end of the contact operating member and an inner circumferential part of the housing portion of the socket main body.

Further, the contact operating member is linked with a driving mechanism constituted by a lever and a pin as disclosed in Japanese Patent Application Laid-open Hei 8-138812 (1996) and Japanese Patent Application Laid-open Hei 9-245920 (1997). One end of the lever of the driving mechanism touches on an end of the cover member.

Thus, when the contact operating member is moved against the urging force of the urging means as the cover member is moved downward, the movable contact pressing portions are made to move such that one of the movable contact portions of each contact terminal is moved away from the other contact portion. On the contrary, the contact operating member is made to move by the urging force of the urging means and a restoring force of the one of the movable contact portions as the cover member is moved upward.

The cover member has an opening therein, the opening encircling the outer circumference the guide member. The cover member is supported on the socket main body such that it can be moved up and down relative to the socket main body.

In such a configuration, when a semiconductor device held by a hand of a transportation robot that is omitted in the illustration is mounted in the housing portion of the guide member through the opening in the cover member, the cover member is first moved down to its lowermost position by a pressing portion of the transportation robot and the semiconductor device is also moved downward.

Thus, the contact operating member is made to move against the urging force of the urging means.

Next, the semiconductor device is dropped to be placed in the housing portion of the guide member in the condition in which the movable contact pressing portions have been moved such that one of the movable contact portions of each contact terminal is moved away from the other movable contact portion and then held, and an electrode portion of the semiconductor device is thus positioned between one of the movable contact portions of each contact terminal and the other movable contact portion.

When the cover member is moved upward with each electrode of the semiconductor device disposed between the pair of movable contact portions of the respective contact terminal, the contact operating member is moved to the initial position by the urging force of the urging means and the restoring force of the one of the movable contact portions, whereby the movable contact pressing portion is moved away from the one of the movable contact portion to be put close to the other movable contact portion.

Therefore, each electrode portion of the semiconductor device is pinched by the pair of movable contact portions of the respective contact terminal, and each electrode portion of the semiconductor device is thereby electrically connected to the respective contact terminal.

In such a socket for a semiconductor device, when a semiconductor device is mounted on the guide member, the semiconductor device placed on the guide member may be jumped up if each electrode portion of the semiconductor device is pinched between the pair of movable contact portions of the respective contact terminal in an insufficient state of insertion or if the printed wiring board vibrates due to deflection of the same attributable to the operation of moving the cover member up and down.

As a measure to take in such a situation, as described in Japanese Patent No. 3257994 by way of example, it has been proposed to provide a latch mechanism having a presser member for holding the semiconductor device placed on the guide member by pressing it against each contact terminal. The presser member of the latch mechanism is configured to assume a holding position and a standby position in conjunction with the upward and downward movements of the cover member.

SUMMARY OF THE INVENTION

When the socket for a semiconductor device having a latch mechanism as described above is the type in which the contact operating member moves up and down or the type in which the contact operating member moves reciprocally along the moving directions of the pair of movable contact portions of a contact terminal, in order to avoid a jump of the semiconductor device as described above, it is necessary to adjust the timing when the presser member of the latch mechanism assumes the holding position and the timing when the pair of movable contact portion of a contact terminal come close to each other.

Especially, when the contact operating member has a relatively small upward/downward stroke or when the pair of movable contact portions of a contact terminal opens in a relatively small predetermined amount, the pair of movable contact portions of the contact terminal may come close to each other, for example, at timing immediately before the presser member of the latching mechanism reaches the holding position. In such a case, the timing at which the pair of movable contact portions of the contact terminal come close to each other may be properly adjusted by adjusting the strokes of the cover member and the contact operating member and the dimensions of the above-described lever.

However, it is troublesome to perform such an adjusting operation for each socket for a semiconductor device in accordance with the type of each semiconductor device.

Taking the above-described problems into consideration, it is an object of the invention to provide a method of mounting and demounting a semiconductor device, a device for mounting and demounting a semiconductor device utilizing the same, and a socket for a semiconductor device which make it possible to avoid a jump of a semiconductor device at the time of mounting without any need for a troublesome adjusting operation.

In order to achieve the above-described object, a method of mounting and demounting a semiconductor device according to the present invention comprises the steps of causing a holding operation of a semiconductor device handling portion for holding or releasing a semiconductor device to mount and demount it relative to a socket main body portion in and from which the semiconductor device is to be mounted and demounted; and conducting an operation of bringing a pair of contact portions of a contact terminal close to each other and pinching an electrode portion of the semiconductor device by the pair of contact portions while carrying out an operation of moving the semiconductor device handling portion holding the semiconductor device to hold the electrode portion of the semiconductor device between the pair of contact portions of the contact terminal that is provided on the socket main body portion.

A device for mounting and demounting a semiconductor device according to the present invention comprises a contact terminal drive controlling mechanism portion disposed at a socket main body portion in and from which the semiconductor device is mounted and demounted, for causing an operation of pinching an electrode portion of a semiconductor device with a pair of contact portions or an operation of releasing the same to be performed by a contact terminal driving portion for performing a connecting operation at a contact terminal having a pair of contact portions, the contact portions selectively pinching the electrode portion of the semiconductor device to establish electrical connection; a handling support mechanism portion for supporting a semiconductor device handling portion such that the handling portion can relatively move respect to the socket main body portion, the handling portion for holding or releasing the semiconductor device to mount and demount it in and from the socket main body portion; and a control portion for causing the semiconductor device handling portion to perform the operation of holding the semiconductor device when the pair of contact portions of the contact terminal is kept in a release state by the contact terminal drive controlling mechanism portion and for causing the contact terminal drive controlling mechanism portion to perform the operation of pinching the electrode portion of the semiconductor device with the pair of contact portions while causing the handling support mechanism portion to perform the operation of moving the semiconductor device handling portion to hold the semiconductor device between the contact portions of the contact terminal of the socket main body portion.

Further, a socket for a semiconductor device according to the present invention comprises a socket main body portion having a contact terminal with a pair of contact portions for selectively pinching an electrode portion of a semiconductor device to establish electrical connection; a slider movably disposed at the socket main body portion to bring the pair of contact portions of the contact terminal close to each other or moving them away from each other; a latch mechanism for selectively holding or releasing the semiconductor device with the electrode portion of the semiconductor device disposed between the pair of contact portions of the contact terminal; and a timing adjustment mechanism portion for adjusting the slider such that the timing at which the contact portions come close to each other to establish electrical connection with the electrode portion of the semiconductor device disposed between the pair of contact portions of the contact terminal is delayed from the timing at which the semiconductor device is held by the latch mechanism.

As apparent from the above description, according to the present invention, the operation of bringing the pair of contact portions of the contact terminal close to each other to pinch the electrode portion of the semiconductor device by the pair of contact portions is performed while performing the operation of moving the semiconductor device handling portion holding the semiconductor device to hold the electrode portion of the semiconductor device between the pair of contact portions of the contact terminal that is provided on the socket main body portion. It is therefore possible to avoid a jump of the semiconductor device at the time of mounting without a need for a troublesome adjusting operation.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
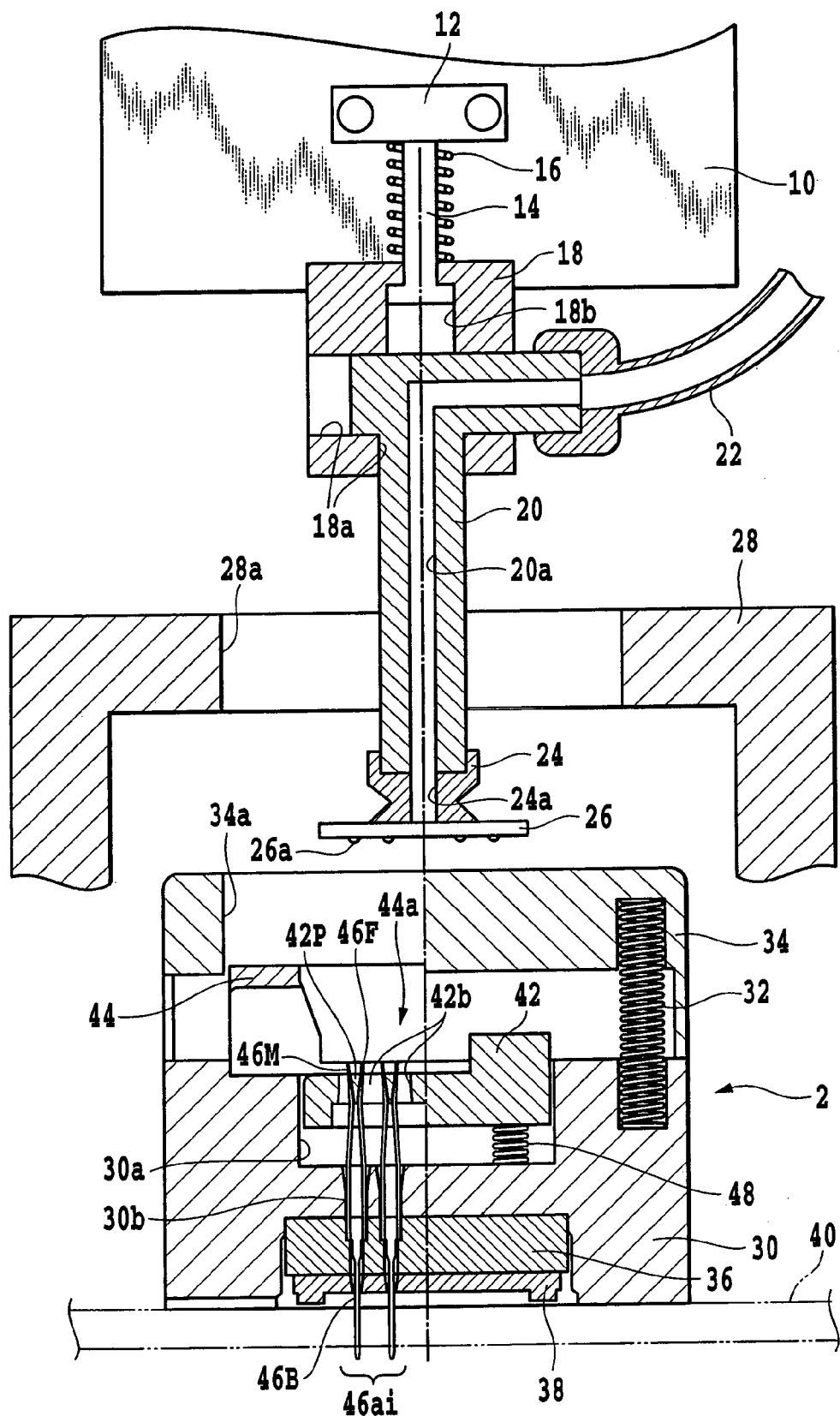
FIG. 2 is a block diagram for explaining the operation of the example shown in FIG. 1.

FIG. 2 schematically shows a first embodiment of a device for mounting and demounting a semiconductor device employing an example of a method of mounting and demounting a semiconductor device according to the present invention.

Referring to FIG. 2, a plurality of sockets 2 for semiconductor devices in and from which semiconductor devices to be tested are mounted and demounted is arranged in the longitudinal and transverse directions of a predetermined printed wiring board 40. In FIG. 2, they are represented by one socket 2 for a semiconductor device.

The socket 2 for a semiconductor device is, for example, an open top type socket, and the socket primarily comprises a socket main body 30 secured on the printed wiring board 40; a plurality of contact terminals 46$ai$ (i=1 to n where n represents a positive integer) which is disposed in a contact housing portion 30$a$ in the middle of the interior of the socket main body 30 and which electrically connect a semiconductor device to be described later and a conductive layer of the printed wiring board 40; a cover member 34 which is supported on the socket main body 30 such that it can be moved up and down and which transmits an operating force to a slider 42 to be described later; a positioning member 44 which houses the semiconductor device as an object to be tested and which positions electrode portions of the semiconductor device relative to the contact terminals 46$ai$; and a slider 42 for bringing a pair of contact portions of the plurality of contact terminals 46$ai$ close to each other or moving them away from each other.

A semiconductor device 26 subjected to such a socket for a semiconductor device is, for example, a substantially square semiconductor element of BGA type which has an electrode surface on which a plurality of electrode portions 26$a$ are formed in the longitudinal and transverse directions thereof.

In a predetermined position of the printed wiring board 40, a group of electrodes, which are electrically connected to an input/output portion of the board through a conductive layer, are formed corresponding to the plurality of contact terminals 46$ai$ of the socket main body 30. As shown in FIG. 2, terminals 46B at base ends of the plurality of contact terminals 46$ai$ provided on the socket main body 30 disposed on the printed wiring board 40 are connected to the group of electrodes.

Provided inside the socket main body 30 is a housing portion 30$a$ from which movable contact portions 46M and 46F of the plurality of contact terminals 46$ai$ protrude. In the socket main body 30, a support hole 30$b$ into which the proximal end portion of each contact terminal 46$ai$ is inserted is provided at the bottom of the housing portion 30. One open end of each support hole 30$b$ opens into the interior of the housing portion 30$a$.

Each contact terminal 46$ai$ comprises a terminal 46B on the proximal end side thereof provided on the socket main body 30 corresponding to each electrode portion 26$a$ of the semiconductor device 26 mounted and a pair of movable contact portions 46F and 46M which is coupled with the terminal 46B and which selectively pinches each electrode portion 26$a$ of the semiconductor device 26. In accordance with a movement of the slider 42, the pair of movable contact portions 46F and 46M come close to each other to pinch each electrode portion 26$a$ of the semiconductor device 26 or move away from each other to release each electrode portion 26$a$ of the semiconductor device 26.

The terminals 46B are supported by a contact support member 36 and an aligning plate 38 which are disposed in a part of the socket main body 30 under the housing portion 30$a$.

The slider 42 which forms a part of a contact terminal driving portion is disposed in the housing portion 30$a$ of the socket main body 30 such that it can move in a direction substantially orthogonal to the moving directions of the movable contact portions 46M and 46F of each contact terminal 46$ai$. That is, the slider 42 as a contact operating member is disposed such that it can move along the direction in which the cover member 34 of the socket main body 30 moves up and down.

The slider 42 has openings 42$b$ therein provided in the longitudinal and transverse directions thereof, the openings which the movable contact portions 46M and 46F of each contact terminal 46$ai$ protrude through the openings. Openings 42$b$ in different rows are partitioned from each other by partition walls, respectively. The partition walls are formed in a direction substantially perpendicular to the plane of the drawing at predetermined intervals in association with each contact terminal 46$ai$.

A movable contact pressing portion 42P is provided in the slider 42 between each pair of the openings 42$b$ in each row, the pressing portion being formed to serve as a partition between the openings 42$b$ and to serve as a partition between the movable contact portion 46M and the movable contact portion 46F. Further, a return spring 48 for urging the slider 42 so as to return it from the position shown in FIG. 5 to the position shown in FIG. 2 is provided between a lower end surface of the slider 42 and a bottom surface of the housing portion 30$a$ of the socket main body 30.

As shown in FIG. 2, an upper part of the slider 42 protrudes a predetermined amount outside an upper end surface of the socket main body 30 in its initial position. At this time, the movable contact portion 46M and the movable contact portion 46F of the contact terminal 46$ai$ are close to each other.

Figure 5:
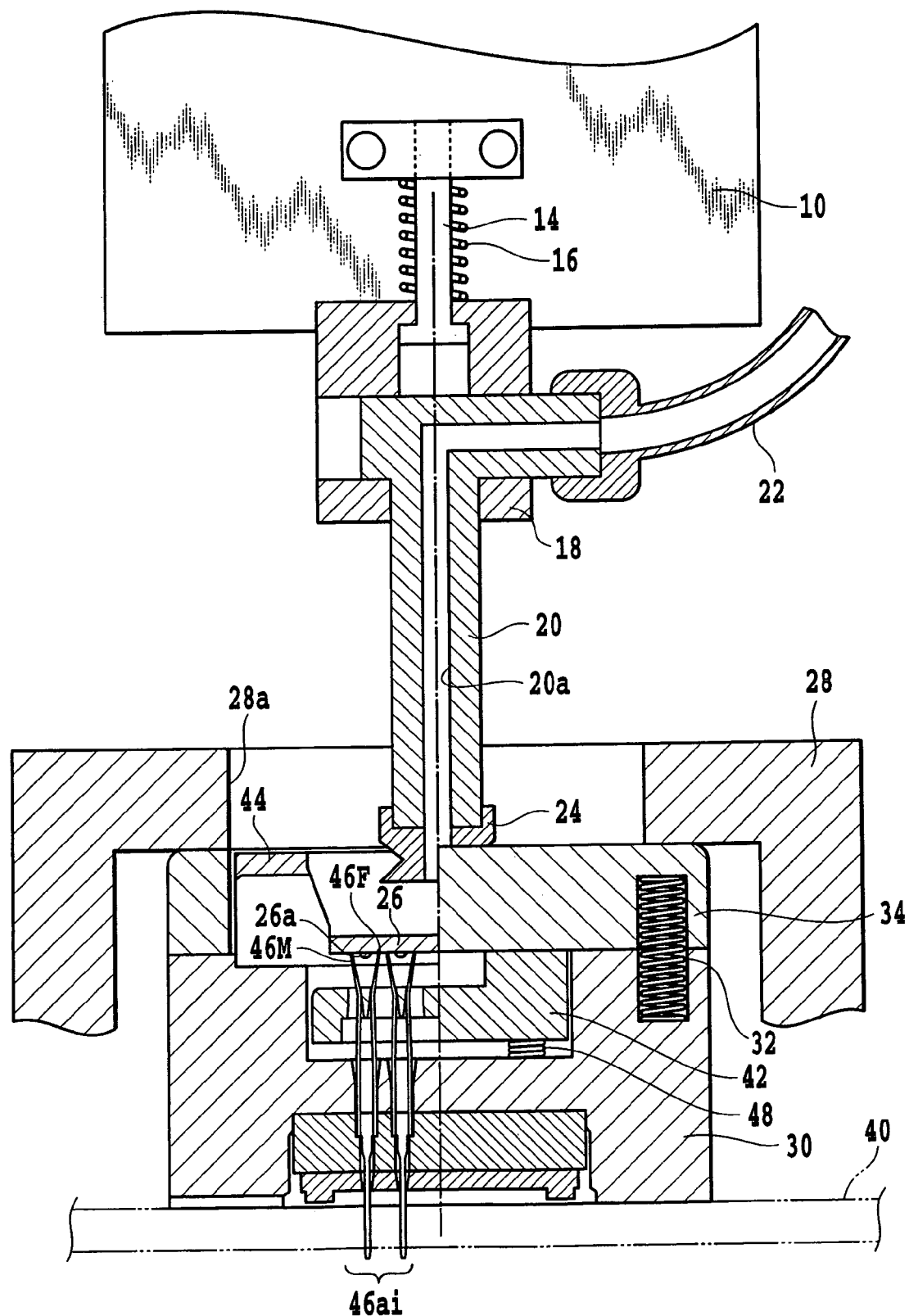
FIG. 5 is a block diagram for explaining the operation of the example shown in FIG. 1.

As shown in FIG. 5, when the cover member 34 is moved down toward the socket main body 30, the upper end face of the slider 42 touching on the lower end surface of the cover member 34 is pushed into the housing portion 30$a$ against the urging force of the return spring 48 to become flush with the upper end face of the socket main body 30. At this time, the movable contact portion 46M and the movable contact portion 46F of the contact terminal 46$ai$ are away from each other.

Thus, when the slider 42 is moved downward against the urging force of the return spring 48 as a result of the operation of moving the cover member 34 downward, the movable contact pressing portions 42P are moved such that the movable contact portion 46M and the movable contact portion 46F of each contact terminal 46$ai$ are moved away from each other. The slider 42 is moved by the urging force of the return spring 48 and the restoring force of the movable contact portions 46M and the movable contact portions 46F as a result of the operation of moving the cover member 34 upward.

As shown in FIG. 2, in the middle of the positioning member 44, a housing portion 44$a$ is provided, in which a semiconductor device 26 is removably mounted. For example, after a semiconductor device 26 held by an absorption pad 24 of a material handling portion 10 of a transport robot is released, the semiconductor device drops into the housing portion 44a from a predetermined height, and it is automatically guided and positioned in the housing portion 44a.

An inner circumferential surface of the housing portion 44a is formed by flat surfaces facing respective end faces of the substantially square semiconductor device 26, inclined surfaces connecting an upper end face and the flat surfaces, and a bottom surface that crosses the flat surfaces. The dimensions of the inner circumferential surface of the housing portion 44a are set greater than the outline dimensions of the semiconductor device 26 which is mounted with a predetermined common difference.

The cover member 34 forming a part of a contact terminal drive controlling mechanism portion has an opening 34a therein, the opening encircling the outer circumference of the positioning member 44. The cover member 34 is supported on the socket main body 30 such that it can move upward and downward relative to the socket main body 30. A coil spring 32 for urging the cover member 34 in the direction of moving it away from the socket main body 30 or upward is provided in each of gaps between a plurality of recesses provided inside the cover member 34 around the opening 34a and recesses in the socket main body 30.

An IC socket operating member (IOM) 28 for moving the cover member 34 up and down is disposed above the socket 2 for a semiconductor device. Thus, a contact terminal drive controlling mechanism portion is formed by the IC socket operating member 28 and the cover member 34.

The IC socket operating member 28 is supported such that it can be moved up and down by an elevating mechanism (not shown) provided around each of the sockets 2 for a semiconductor device. The IC socket operating member 28 has an opening 28a which is in communication with the opening 34a of the cover member 34 described above.

For example, the elevating mechanism is driven by an air cylinder. The air cylinder is controlled by a control unit which will be described later. Thus, the IC socket operating member 28 can move between the position above the cover member 34 shown in FIG. 2 and the lowermost position shown in FIG. 5 in which it touches on the upper end face of the cover member 34 to press the cover member 34.

When a semiconductor device 26 is mounted and demounted in and from a socket 2 for a semiconductor device, the semiconductor device 26, which is held by the absorption pad 24 secured to a lower end of a suction pipe 20 of the material handling portion 10, passes through the opening 28a of the IC socket operating member 28.

As shown in FIG. 2, the material handling portion (MH) 10 comprising a floating member 18 including the suction pipe 20 is secured to an arm portion of the transport robot which is omitted in the illustration. The transport robot moves between the sockets 2 for a semiconductor device and a predetermined tray along a path of movement according to a predetermined program. A predetermined number of semiconductor devices 26 to be tested are disposed on the tray.

The material handling portion (MH) 10 can be moved toward or away from the IC socket operating member 28 and the sockets 2 for a semiconductor device, or can be moved up and down in a predetermined stroke.

The material handling portion (MH) 10 primarily comprises the suction pipe 20 which has the absorption pad 24 for holding or releasing one semiconductor device 26, the floating member 18 which supports the suction pipe 20, and a floating portion support shaft 14 which movably supports the floating member 18.

For example, the absorption pad 24 is made of an elastic material, and the pad has an absorbing surface for absorbing a semiconductor device 26 on one end face thereof. The absorption pad 24 has a through hole 24a therein, the through hole forming a part of a suction channel and opening on the absorbing surface. Another end of the absorption pad 24 is coupled to one end of the L-shaped suction pipe 20. A channel 20a forming a part of the suction channel is formed inside the suction pipe 20. One end of a tube 22 connected to a suction pump, which is omitted in the illustration, is connected to another end of the suction pipe 20. The operation of the suction pump is controlled by the control unit to be described later. Therefore, when the suction pump is operated, a semiconductor device 26 to be tested is absorbed and held at the absorbing surface of the absorption pad 24 by a suction pressure supplied through a suction channel that is formed of the tube 22, the channel 20a, and the through hole 24a.

The floating member 18 has an internal recess 18a in which a bent part of the suction pipe 20 is secured. A hole 18b is formed adjacent to the recess 18a, one end of the floating portion support shaft 14 being slidably fitted in the hole. The hole 18b includes a large-diameter part in which a flange part on one end of the floating portion support shaft 14 is slidably fitted and a small-diameter part in which a shaft part of the floating portion support shaft 14 is slidably fitted. The depth of the large-diameter part is set according to a predetermined stroke of the floating member 18 to be described later. The floating member 18 is supported on one end of the floating portion support shaft 14 such that the axis of the floating portion support shaft 14 and the center axes of the hole 18b and the suction pipe 20 are coaxial.

Another end of the floating portion support shaft 14 is secured to a securing portion 12 provided in the material handling portion (MH) 10. For example, the securing portion 12 has a hole in which the other end of the floating portion support shaft 14 is fitted. The hole is provided with a female thread extending in the radial direction thereof, into which a machine screw is screwed, although not shown. Thus, the other end of the floating portion support shaft 14 is secured to the securing portion 12 by screwing the machine screw into the female thread. A coil spring 16 for urging the floating member 18 in the direction of moving away from the securing portion 12 is wound around the floating portion support shaft 14 between the securing portion 12 and the floating member 18.

Figure 3:
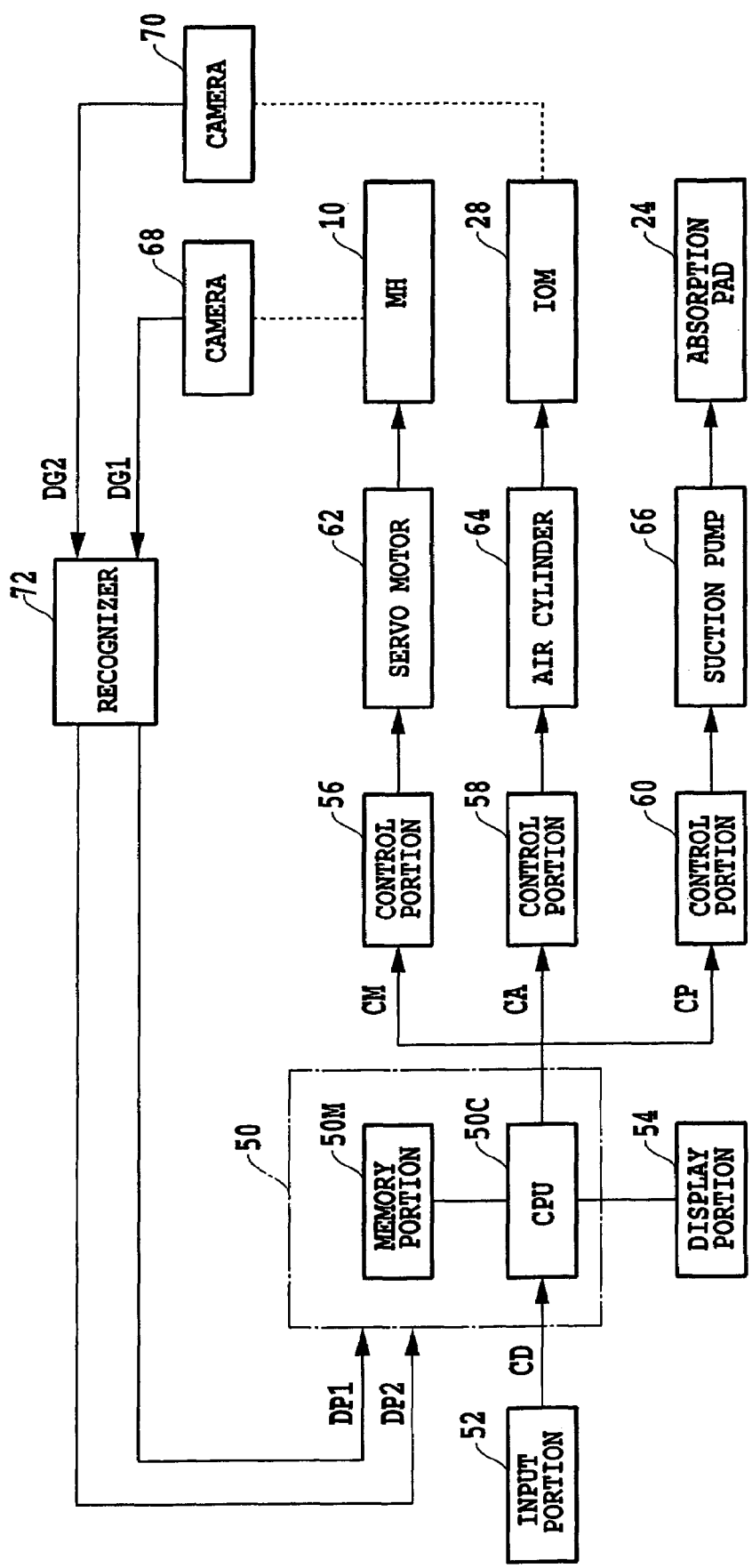
FIG. 3 is a control block diagram representing a control unit provided in the example shown in FIG. 1.

As shown in FIG. 3, the first embodiment of a device for mounting and demounting a semiconductor device according to the present invention further includes a control unit 50 for controlling the elevation and the absorbing operation of the material handling portion (MH) 10 and the operation of the IC socket operating member (IOM) 28.

Referring to FIG. 3, data DP1 representing the position of the material handling portion (MH) 10 and data DP2 representing the position of the IC socket operating member (IOM) 28 from a recognizer 72 to be described later and a control command data group CD from a data input portion 52 are supplied to the control unit 50.

The control unit 50 comprises a central processing unit (CPU) 50C which forms a control signal based on the data DP1 and DP2 and the control command data group CD supplied as described above and supplies the signal to control portions 56, 58, and 60 to be described later and a memory portion 50M for storing program data for controlling the operations of the material handling portion (MH) 10 and the IC socket operating member (IOM) 28 and data representing the type, quantity, and the like of semiconductor devices 26 to be tested. The memory portion 50M also stores data on positions and attitudes that the above-described transport robot and material handling portion (MH) 10 assume along trajectories specified in advance using predetermined teaching.

The data input portion 52 is connected to the control unit 50. For example, the data input portion 52 is an input portion constituted by a keyboard, and it supplies the control command data group CD comprising command data for mounting of a semiconductor device 26, test starting command data, test ending command data, and the like to the control unit 50 at predetermined timing. A recognizer 72 which forms the relative position data DP1 and DP2 is connected to the control unit 50. The recognizer 72 is continually supplied with photographic data DG2 from a camera 70 which photographs the attitude of the IC socket operating member (IOM) 28 and photographic data DG1 from a camera 68 which photographs the attitude of the material handling portion (MH) 10. For example, each of the cameras 68 and 70 is a CCD camera.

The recognizer 72 performs predetermined image extraction and image conversion processes based on the photographic data DG2 to obtain two-dimensional or three-dimensional relative position data DP2 and performs predetermined image extraction and image conversion processes based on the photographic data DG1 to obtain two-dimensional or three-dimensional relative position data DP1.

A display portion 54 is connected to the control unit 50. The display portion 54 displays that a test is in progress and that a test has been completed based on display signals from the central processing unit (CPU) 50C.

Further, a motor control portion 56, an air cylinder control portion 58, and a suction pump control portion 60 are connected to the control unit 50.

When a semiconductor device is mounted in a socket 2 for a semiconductor device in such a configuration, the control unit 50 forms control signals CM and CP and supplies them to the motor control portion 56 and the suction pump control portion 60, respectively, such that the transport robot having the material handling portion (MH) 10 will move down to the semiconductor device 26 on a tray based on control command data group CD representing a mount command when the robot is moved to a position directly above the tray from a predetermined home position and such that the absorption pad 24 of the material handling portion (MH) 10 will hold the semiconductor device 26 and will thereafter move upward.

Thus, the suction pump 66 is actuated, and the absorption pad 24 of the material handling portion (MH) 10 holds the semiconductor device 26. At this time, the center axis of the absorption pad 24 coincides with the center axis of the semiconductor device 26.

Then, the transport robot is moved to a position directly above the socket 2 for a semiconductor device as shown in FIG. 2.

Figure 4:
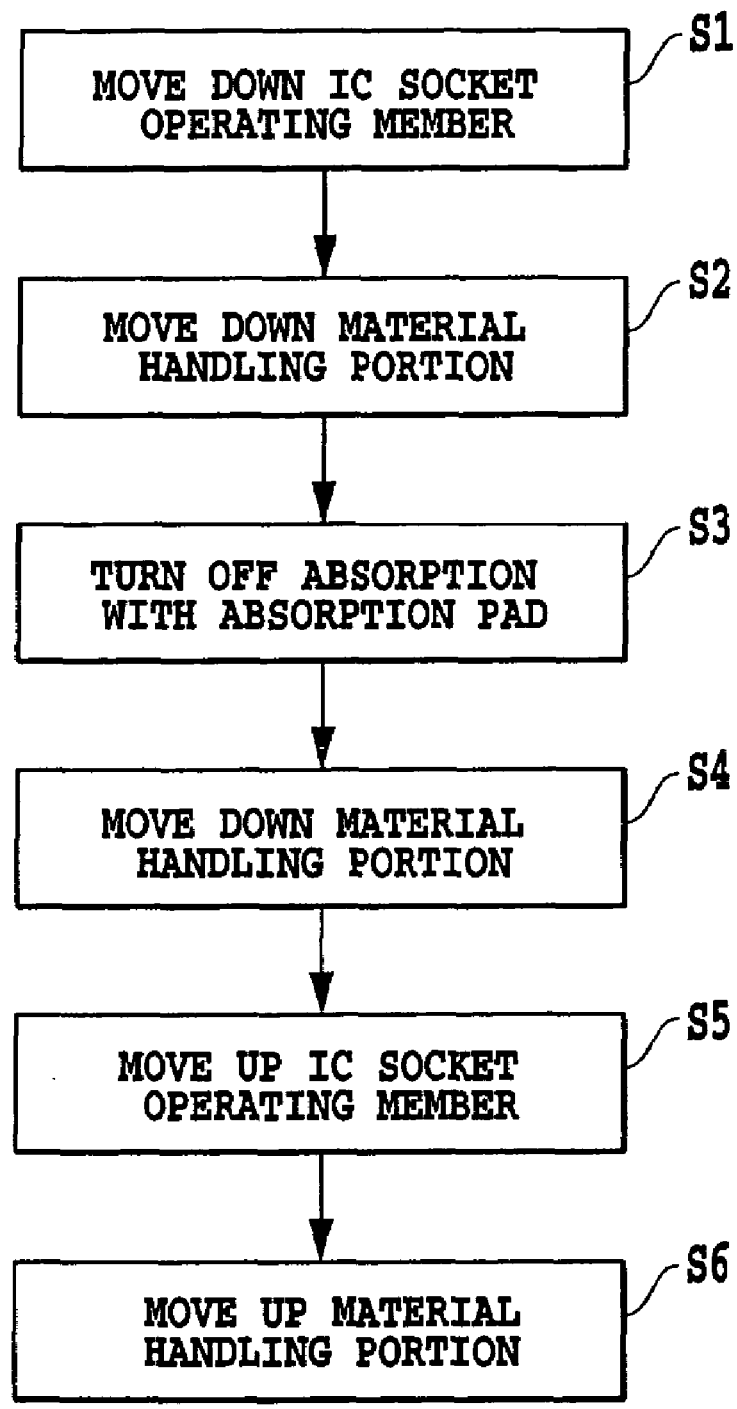
FIG. 4 is a process drawing showing each process of the operation of the example shown in FIG. 1.

First, when it is determined at step S1 (see FIG. 4) based on the data DP1 that the absorption pad 24 is in the state shown in FIG. 2 by the control unit 50, the control unit 50 forms a control signal CA and supplies it to the air cylinder control portion 58 such that the cover member 34 will be moved down a predetermined amount and held at the lower end as shown in FIG. 5 with the IC socket operating member 28 kept touching on the top surface of the cover member 34 of the socket 2 for a semiconductor device.

Thus, the cover member 34 is moved down to the lowermost position, and the slider 42 is consequently moved down against the urging force of the return spring 48. Thus, the movable contact portions 46M and 46F of the contact terminal 46 are moved away from each other.

Next, at step S2 (see FIG. 4), the control unit 50 forms a control signal CM and supplies it to the motor control portion 56 to move the material handling portion (MH) 10 down to a predetermined position and thereafter stops supplying the control signal CP to the suction pump control portion 60 (step S3). As a result, as shown in FIG. 5, a servo motor 62 is actuated; the suction pump 66 stops operating; and the semiconductor device 26 is released from the absorption pad 24 and is guided to be dropped and placed on the bottom of the positioning member 34. At this time, each electrode portion 26a of the semiconductor device 26 is disposed between the movable contact portions 46M and 46F of a contact terminal 46.

Figure 6:
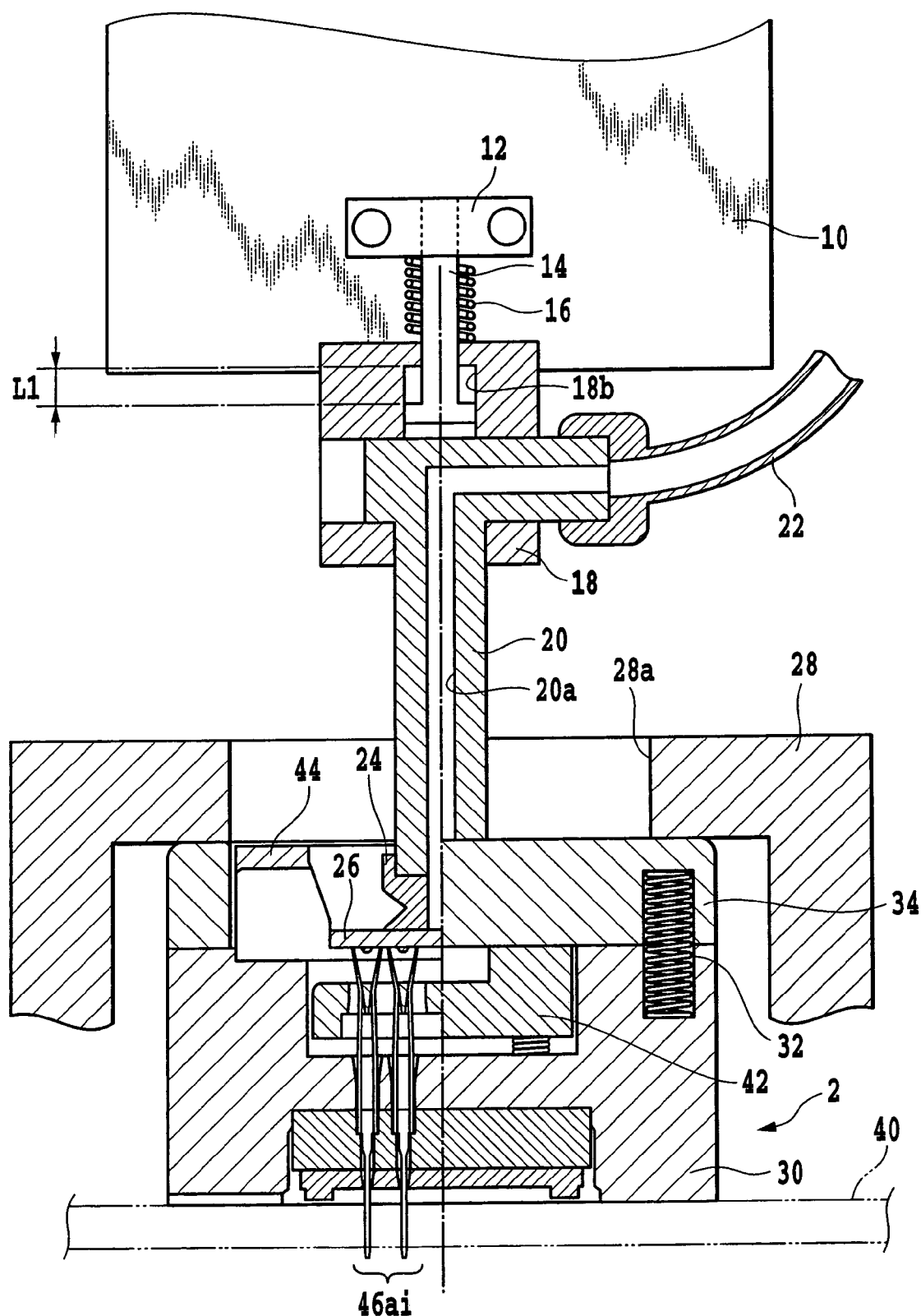
FIG. 6 is a block diagram for explaining the operation of the example shown in FIG. 1.

Subsequently, at step S4 (see FIG. 4), the control unit 50 forms a control signal CM and supplies it to the motor control portion 56 such that the material handling portion (MH) 10 will be moved down further to press the semiconductor device 26 with the absorption pad 24 by a predetermined length L1 against the urging force of the coil spring 16. As a result, as shown in FIG. 6, a gap having the predetermined length L1 is formed between the inner circumferential surface of the floating member 18 that forms the recess 18b therein and the flange portion of the floating portion support shaft 14. At this time, a jump of the semiconductor device 26 is prevented by the absorption pad 24.

Figure 1:
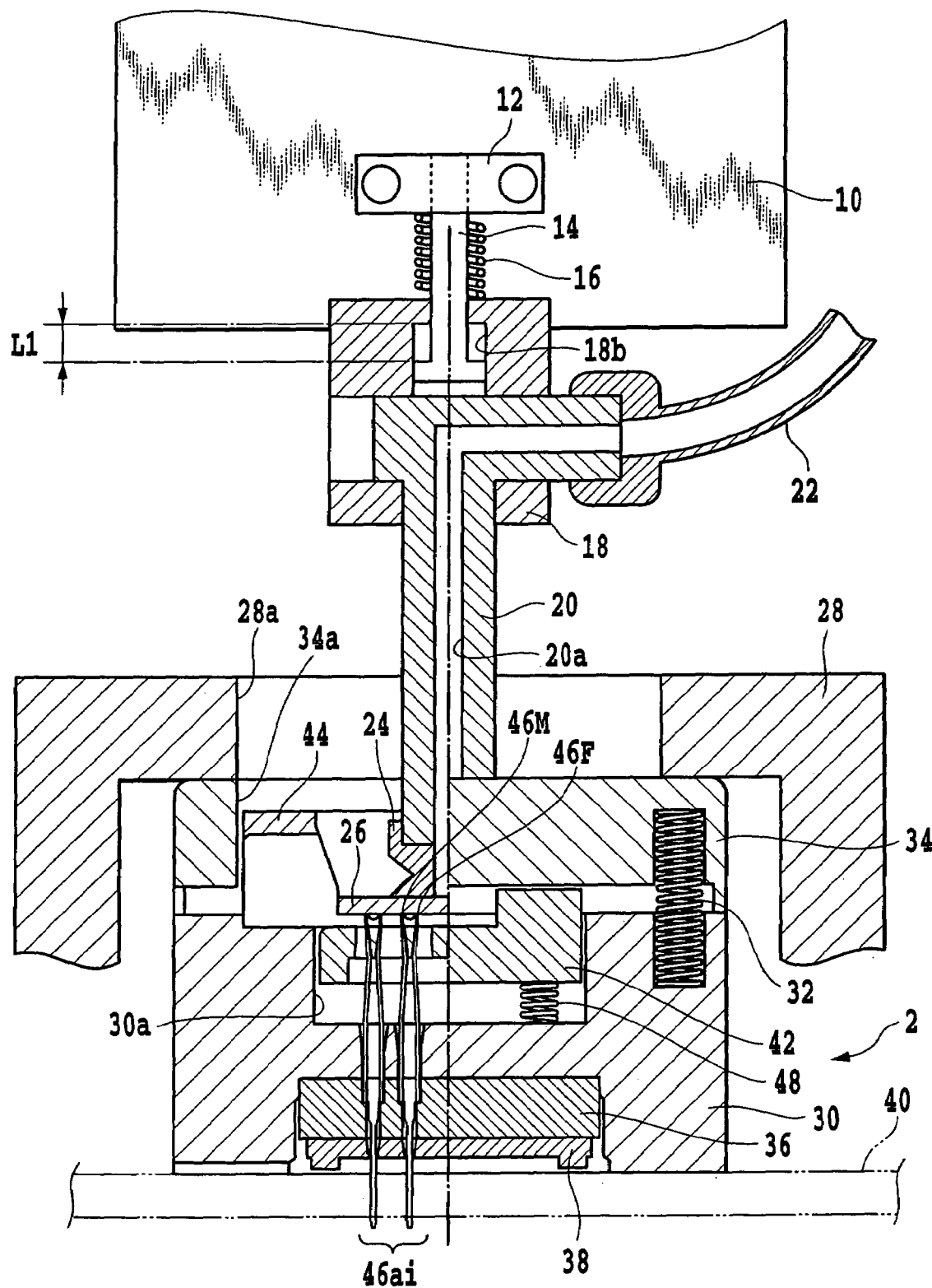
FIG. 1 is a block diagram schematically showing a configuration of a first embodiment of a device for mounting and demounting a semiconductor device employing an example of a method for mounting and demounting a semiconductor device according to the present invention.

Subsequently, at step 5 (see FIG. 4), in order to pinch each electrode portion 26a of the semiconductor device 26 held by the absorption pad 24 with the movable contact portions 46M and 46F of the respective contact terminal 46, the control unit 50 forms a control signal CA and supplies it to the air cylinder control portion 58 to move the IC socket operating member 28 and the cover member 34 upward as shown in FIG. 1.

As a result, the slider 42 is moved upward by the urging force of the return spring 48, and the cover member 34 is moved away from the upper end of the slider 42, whereby the movable contact portions 46M and 46F of each contact terminal 46 pinch the respective electrode portion 26a of the semiconductor device 26. Thus, the mounting of the semiconductor device 26 to be tested is completed, and each electrode portion 26a of the semiconductor device 26 is electrically connected to the movable contact portions 46M and 46F.

Figure 7:
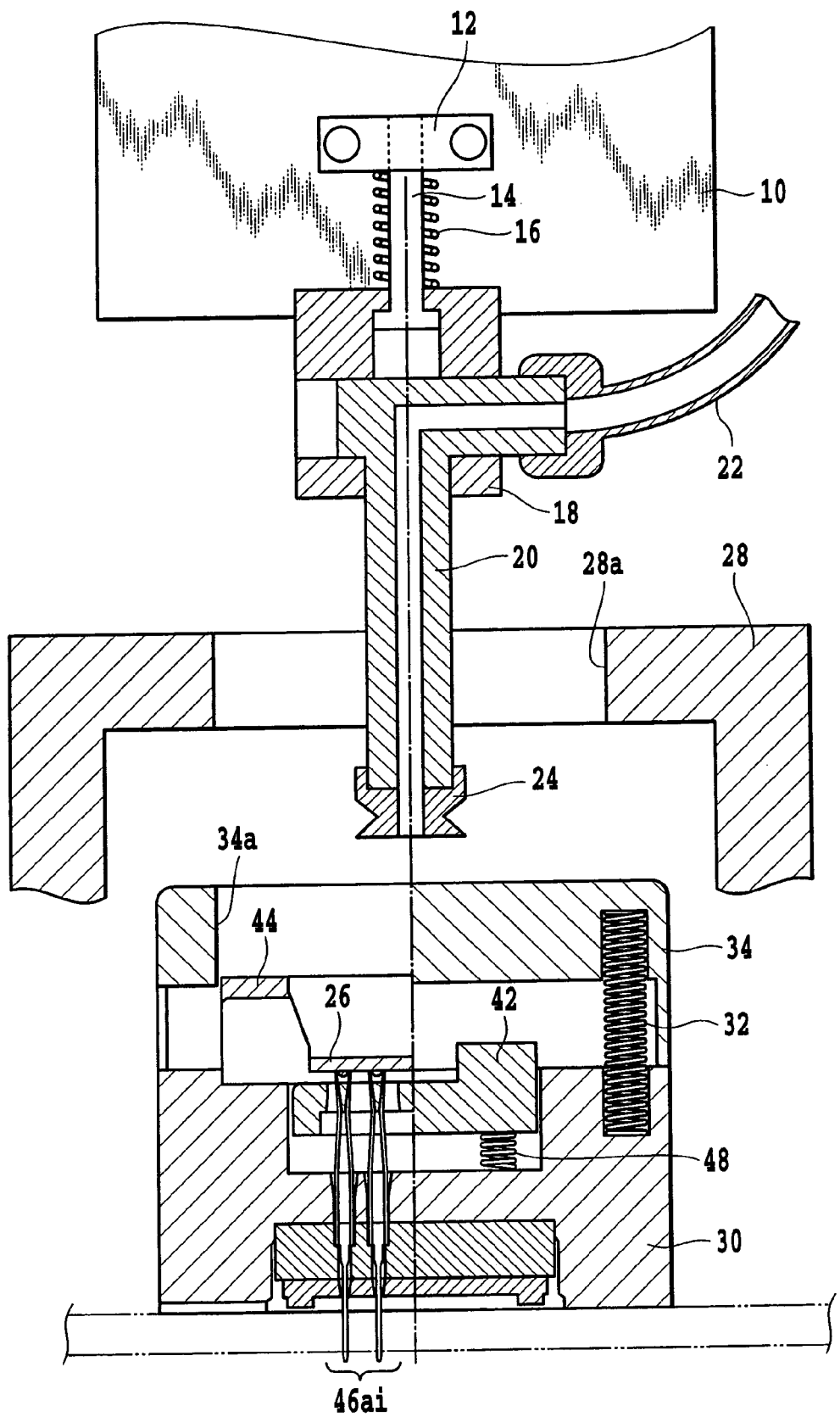
FIG. 7 is a block diagram for explaining the operation of the example shown in FIG. 1.

Subsequently, at step S6 (see FIG. 4), the control unit 50 forms control signals CM and CA based on the data DP1 and DP2 and supplies them to the motor control portion 56 and the air cylinder control portion 58 to move up the material handling portion (MH) 10 and the IC socket operating portion 28 to the position shown in FIG. 7 based on test starting command data before stating a test. Thus, the cover member 34 is made to move up to its uppermost position by the urging force of the coil spring 32.

Subsequently, after the period of a predetermined test on the socket 2 for a semiconductor device passes, in order to remove the semiconductor device which has been tested from the socket 2 for a semiconductor device, the control unit 50 forms control signals CM, CA, and CP based on the data DP1 and DP2 and supplies them to the motor control portion 56, the air cylinder control portion 58, and the suction pump control portion 60 to move the IC socket operating member 28 and the material handling portion (MH) 10 down to the position shown in FIG. 5, to absorb and hold the semiconductor device which has been tested with the absorption pad 24, and to thereafter move up the IC socket operating member 28 and the material handling portion (MH) 10 with the semiconductor device held thereon based on test ending command data.

Thus, the semiconductor device which has been test is removed from the socket 2 for a semiconductor device.

Such an embodiment provides the following advantages.

1) Since there is no need for a latch mechanism or the like which is provided in a conventional IC socket, an IC socket can be manufactured at a superior cost per performance because the IC socket has a reduced number of components and a simple configuration. 2) A wide variety of semiconductor device can be tested with a single IC socket. 3) Timing at which the movable contact portions of a contact terminal pinch a solder ball of, for example, a BGA type semiconductor device can be freely adjusted by the material handling portion. Therefore, even in case that a change is made in the diameter of a solder ball of a semiconductor device to be used with an existing IC socket, a test can respond with the existing IC socket. As a result, existing IC sockets can be used by making simple software changes and the like without making changes in facility.

Figure 8:
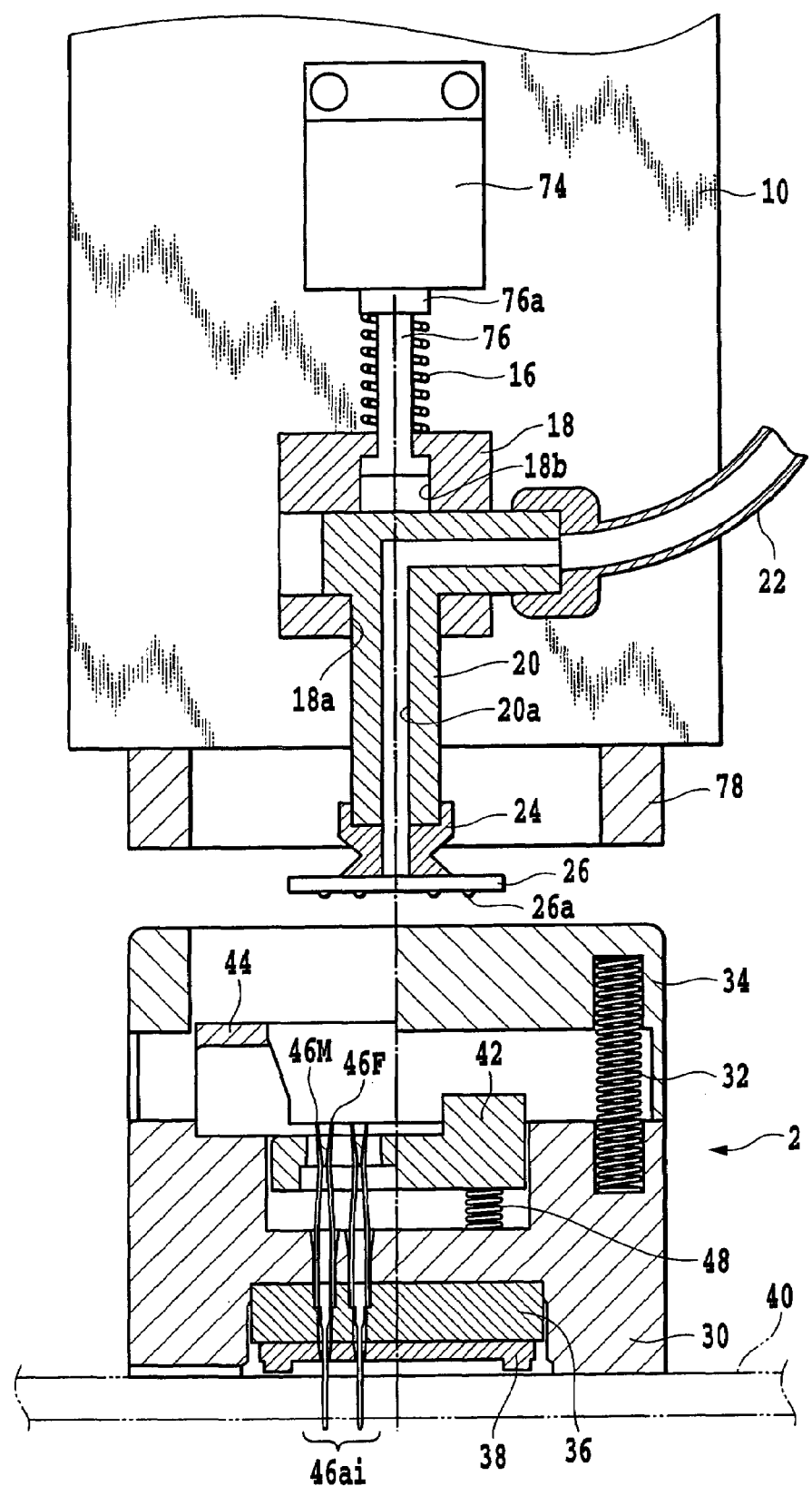
FIG. 8 is a block diagram schematically showing a configuration of a second embodiment of a device for mounting and demounting a semiconductor device employing an example of a method for mounting and demounting a semiconductor device according to the present invention.

FIG. 8 schematically shows a second embodiment of a device for mounting and demounting a semiconductor device according to the invention. In FIG. 8, elements identical to those in the example shown in FIG. 1 are indicated by like reference numerals, and the description will omit them to avoid duplication.

The IC socket operating member 28 is driven by the air cylinder 64 which is a source of driving separate from the material handling portion 10 in the example shown in FIG. 1. On the contrary, in the example shown in FIG. 8, a frame-shaped IC socket operating member 78 is secured at the lower end of the material handling portion 10. The example shown in FIG. 1 employs a configuration in which the floating portion support shaft 14 supporting the floating member 18 is secured to the material handling portion 10. In the example shown in FIG. 8, a piston rod 76 of an air cylinder 74 provided in a predetermined position of the material handling portion 10 and supporting the floating member 18 can be moved relative to the material handling portion 10.

Figure 11:
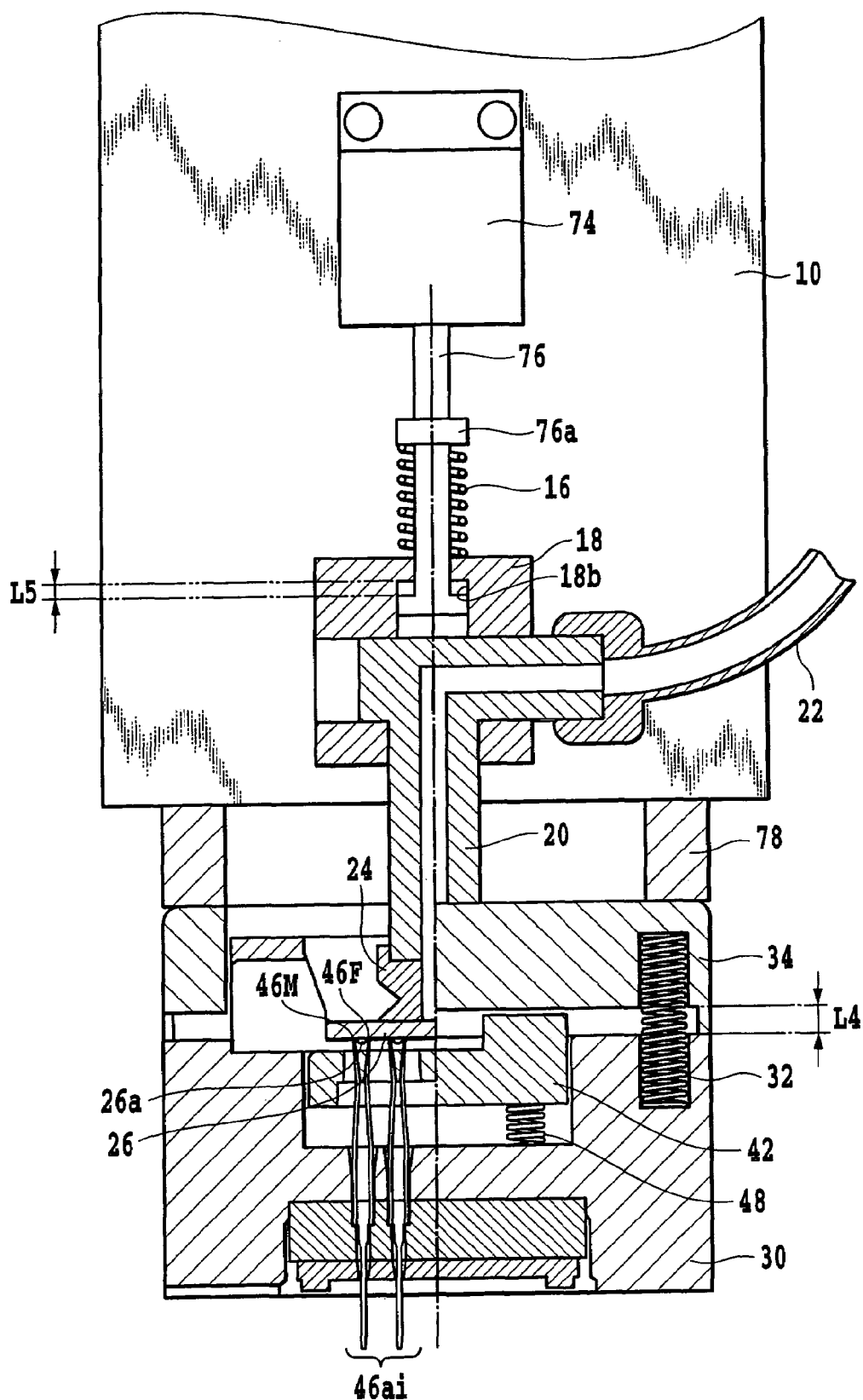
FIG. 11 is a block diagram for explaining the operation of the example shown in FIG. 8.

As shown in FIG. 11, a flange portion provided on one end of the piston rod 76 of the air cylinder 74 is movably fitted in the large-diameter part of the recess 18*b* of the floating member 18. The coil spring 16 is wound between an annular part 76*a* provided in the middle of the piston rod 76 and the upper end of the floating member 18.

Figure 13:
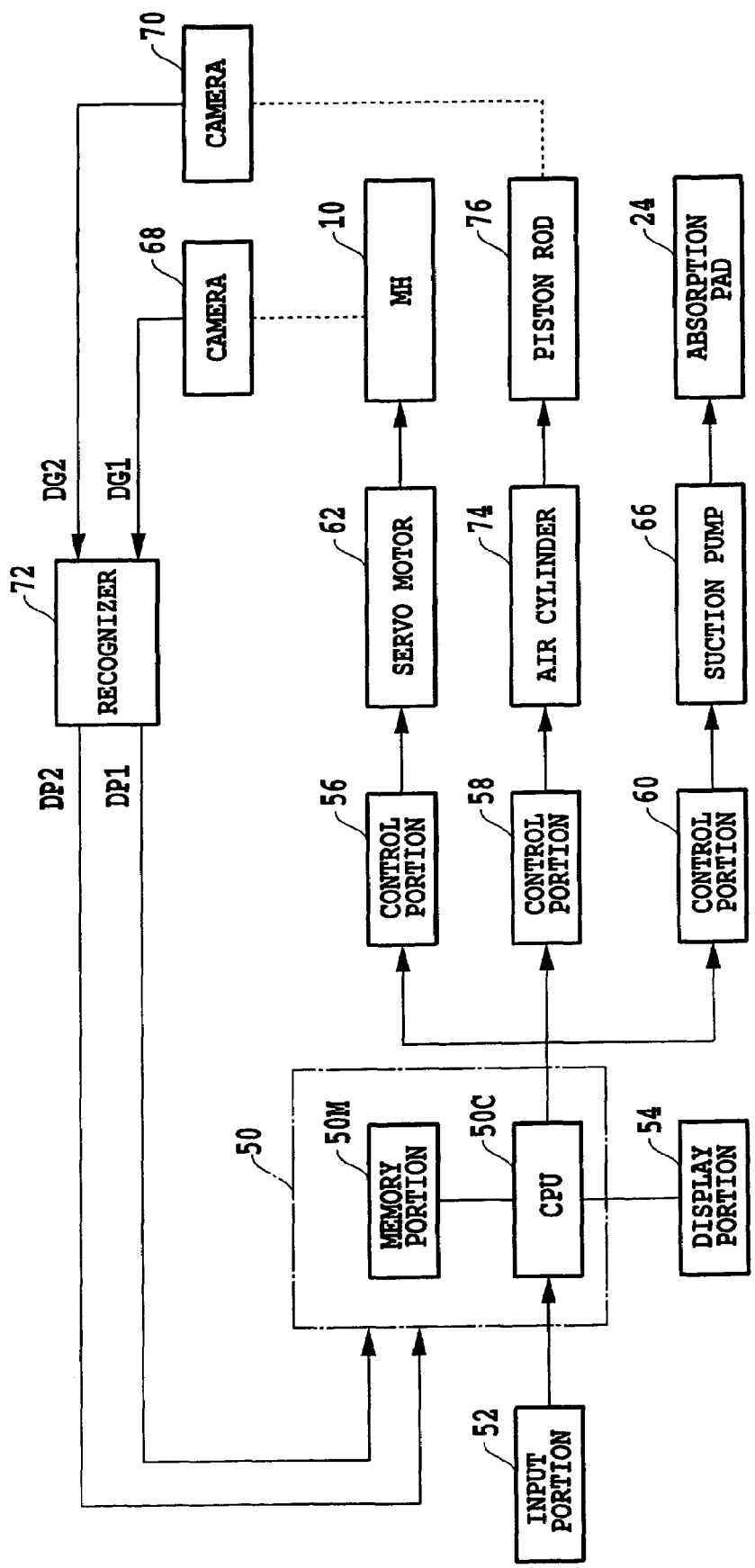
FIG. 13 is a control block diagram representing a control unit provided in the example shown in FIG. 8.

In addition to such a configuration, as shown in FIG. 13, there is provided a control unit 50 which controls the elevation and absorbing operation of the material handling portion (MH) 10 and the operation of the air cylinder 74.

In FIG. 13, elements identical to those in FIG. 3 are indicated by like reference numerals, and the description will omit them to avoid duplication.

When a semiconductor device is mounted in a socket 2 for a semiconductor device in such a configuration, the control unit 50 forms control signals CM and CP and supplies them to the motor control portion 56 and the suction pump control portion 60, respectively, such that the transport robot having the material handling portion (MH) 10 will move down to the semiconductor device 26 on a tray based on control command data group CD representing a mount command when the robot is moved to a position directly above the tray from a predetermined home position and such that the absorption pad 24 of the material handling portion (MH) 10 will hold the semiconductor device 26 and will thereafter move upward.

Thus, the servo motor 62 and the suction pump 66 are actuated, and the absorption pad 24 of the material handling portion (MH) 10 holds the semiconductor device 26. At this time, the center axis of the absorption pad 24 coincides with the center axis of the semiconductor device 26.

Then, the transport robot is moved to a position directly above the socket 2 for a semiconductor device as shown in FIG. 8.

Figure 9:
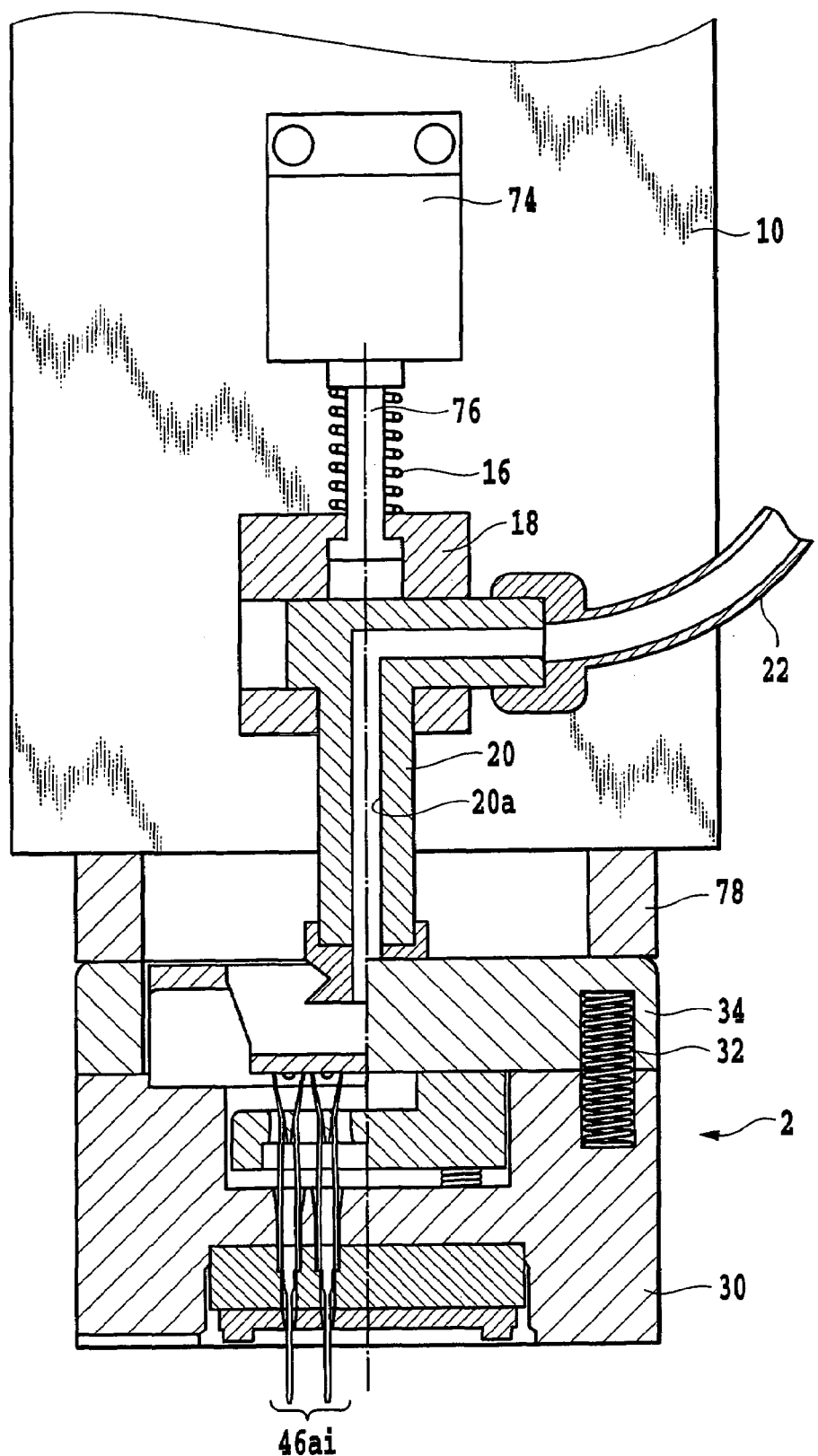
FIG. 9 is a block diagram for explaining the operation of the example shown in FIG. 8.
Figure 14:
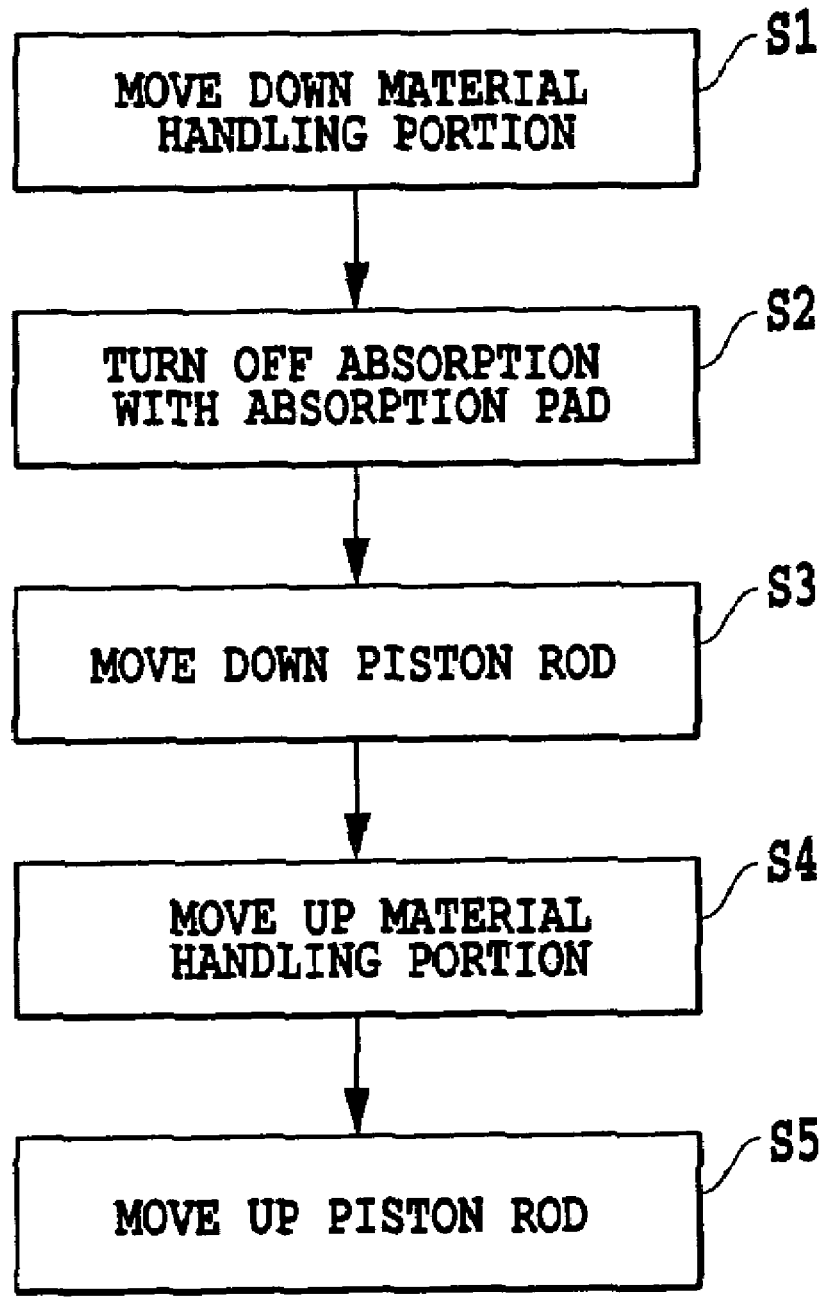
FIG. 14 is a process drawing showing each process of the operation of the example shown in FIG. 8.

First, when it is determined at step S1 (see FIG. 14) based on the data DP1 that the absorption pad 24 is in the state shown in FIG. 8, the control unit 50 forms a control signal CM and supplies it to the motor control portion 56 such that the cover member 34 will be moved down a predetermined amount and held at the lower end as shown in FIG. 9 with the IC socket operating member 78 of the material handling portion (MH) 10 kept touching on the top surface of the cover member 34 of the socket 2 for a semiconductor device.

Thus, the cover member 34 is moved down to the lowermost position, and the slider 42 is consequently moved down against the urging force of the return spring 48. The movable contact portions 46M and 46F of the contact terminal 46 are thus moved away from each other.

Next, at step S2 (see FIG. 14), the control unit 50 stops supplying the control signal CP to the suction pump control portion 60. As a result, as shown in FIG. 9, the semiconductor device 26 is released from the absorption pad 24 and is guided to be dropped and placed on the bottom of the positioning member 44. At this time, each electrode portion 26*a* of the semiconductor device 26 is disposed between the movable contact portions 46M and 46F of a contact terminal 46*ai*.

Figure 10:
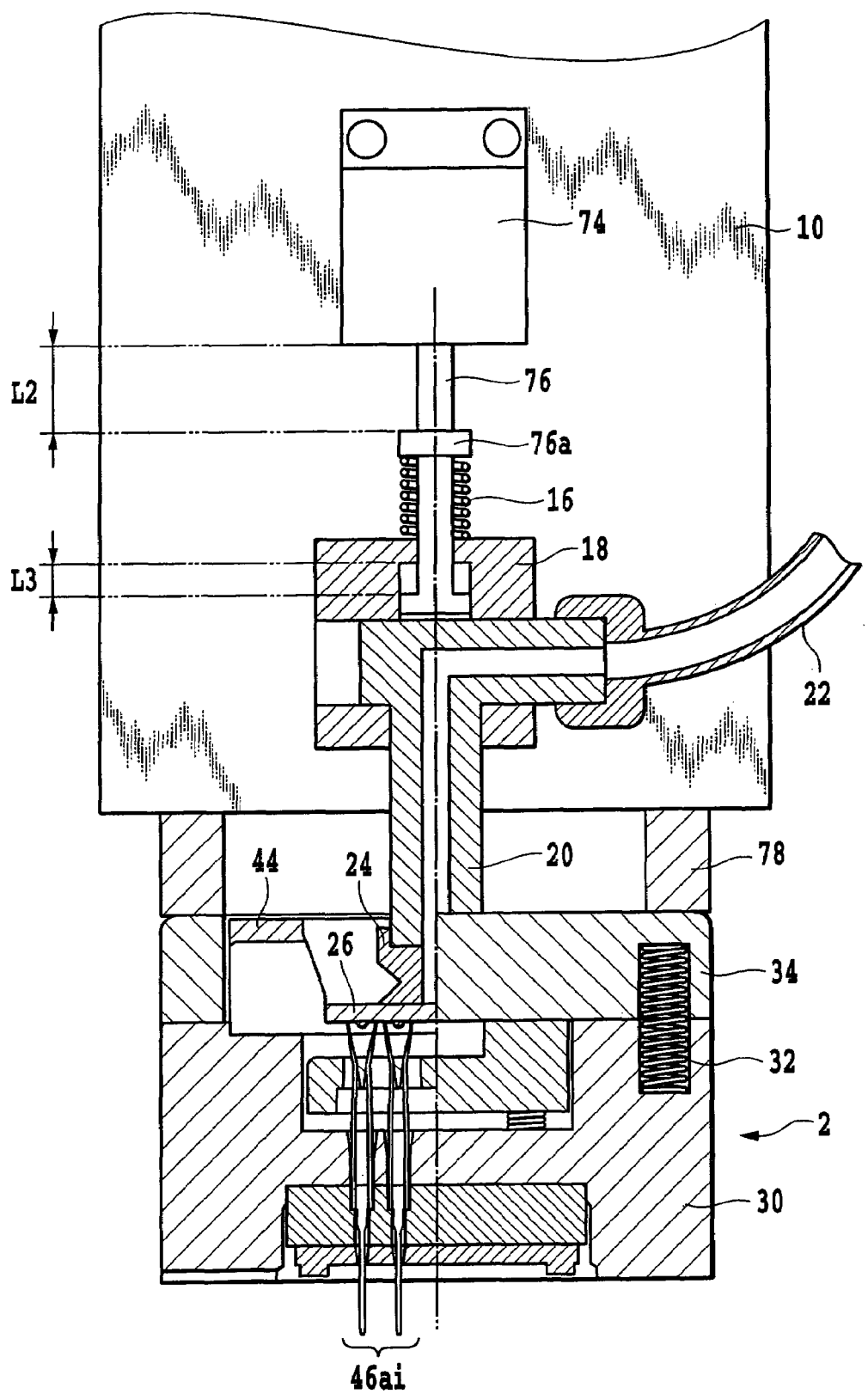
FIG. 10 is a block diagram for explaining the operation of the example shown in FIG. 8.

Subsequently, at step S3 (see FIG. 14), the control unit 50 forms a control signal CA and supplies it to the air cylinder control portion 58 such that the absorption pad 24 will be moved down further in touch on the surface of the semiconductor device 26 to urge the same by a predetermined length L3 against the urging force of the coil spring 16 while extending (moving down) the piston rod 76 further by a predetermined length L2. As a result, as shown in FIG. 10, a gap having the predetermined length L3 is formed between the inner circumferential surface of the floating member 18 that forms the recess 18*b* and the flange portion of the floating portion support shaft 14. At this time, a jump of the semiconductor device 26 is prevented by the absorption pad 24.

Subsequently, at step S4 (see FIG. 14), in order to pinch each electrode portion 26*a* of the semiconductor device 26 held by the absorption pad 24 with the movable contact portions 46M and 46F of the respective contact terminal 46, the control unit 50 forms a control signal CM and supplies it to the motor control portion 56 to move the material handling portion (MH) 10, the IC socket operating member 78, and the cover member 34 upward a predetermined distance L4 as shown in FIG. 11.

As a result, the slider 42 is moved upward by the urging force of the return spring 48, and the cover member 34 is moved away from the upper end of the slider 42, whereby the movable contact portions 46M and 46F of each contact terminal 46 pinch the respective electrode portion 26*a* of the semiconductor device 26. Thus, the mounting of the semiconductor device 26 to be tested is completed, and each electrode portion 26*a* of the semiconductor device 26 is electrically connected to the movable contact portions 46M and 46F. At this time, as shown in FIG. 11, a gap having a length L5 smaller than the predetermined length L3 is formed between the inner circumferential surface of the floating member 18 forming the recess 18*b* and the flange portion of the floating portion support shaft 14.

Figure 12:
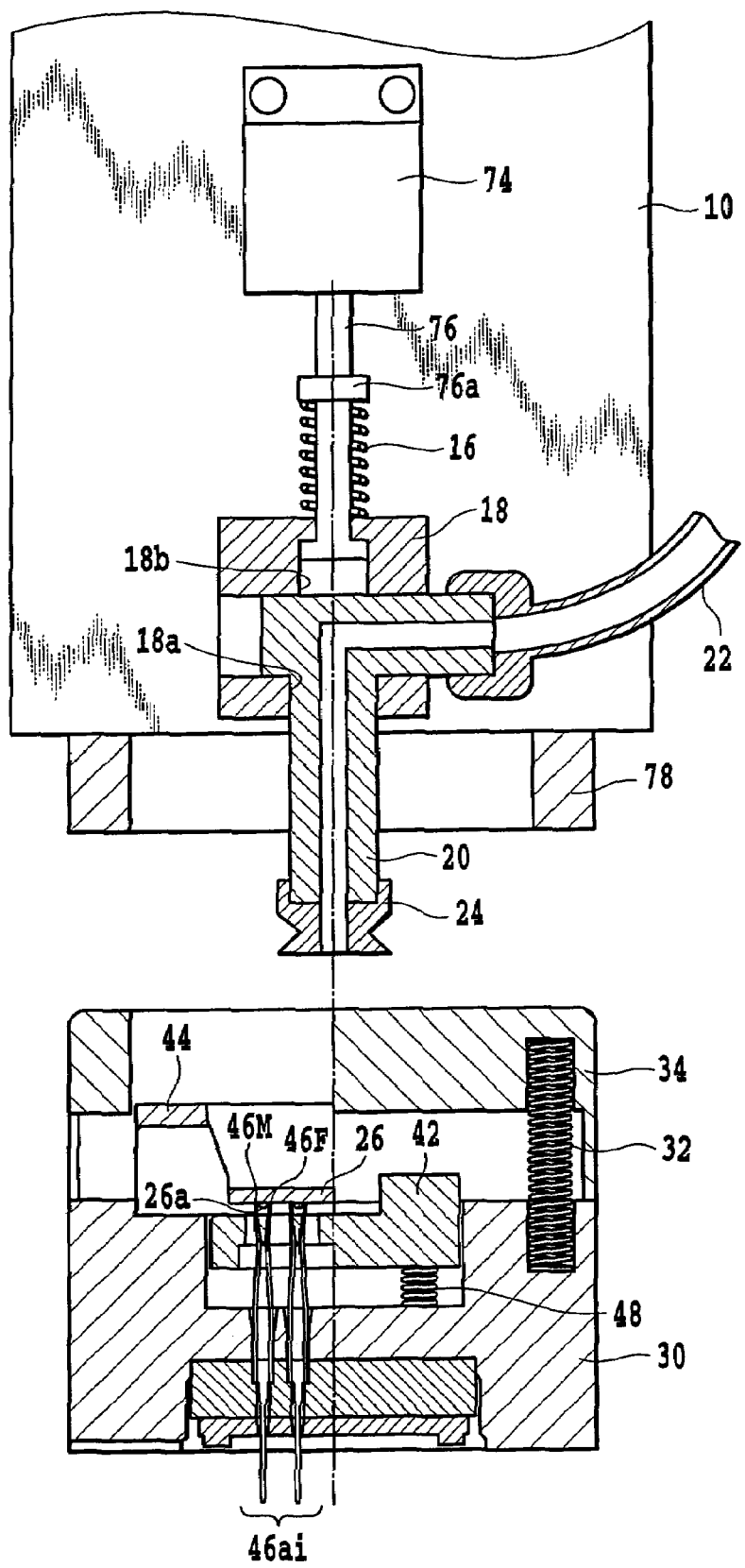
FIG. 12 is a block diagram for explaining the operation of the example shown in FIG. 8.

Subsequently, at step S5 (see FIG. 14), the control unit 50 forms a control signal CM based on the data DP1 and DP2 and supplies it to the motor control portion 56 to move up the material handling portion (MH) 10 and the IC socket operating portion 78 to a predetermined position shown in FIG. 12 based on test starting command data before stating a test.

Thus, the cover member 34 is moved up to its uppermost position by the urging force of the coil spring 32.

Subsequently, after the period of a predetermined test on the socket 2 for a semiconductor device passes, in order to remove the semiconductor device which has been tested from the socket 2 for a semiconductor device, the control unit 50 forms control signals CM and CP based on test ending command data and supplies them to the motor control portion 56 and the suction pump control portion 60 to move the IC socket operating member 78 and the material handling portion (MH) 10 down to the position shown in FIG. 10, to absorb and hold the semiconductor device which has been tested with the absorption pad 24, and to thereafter move up the IC socket operating member 78 and the material handling portion (MH) 10 with the semiconductor device held thereon based on the data DP1 and DP2.

Thus, the semiconductor device which has been test is removed from the socket 2 for a semiconductor device.

Figure 15:
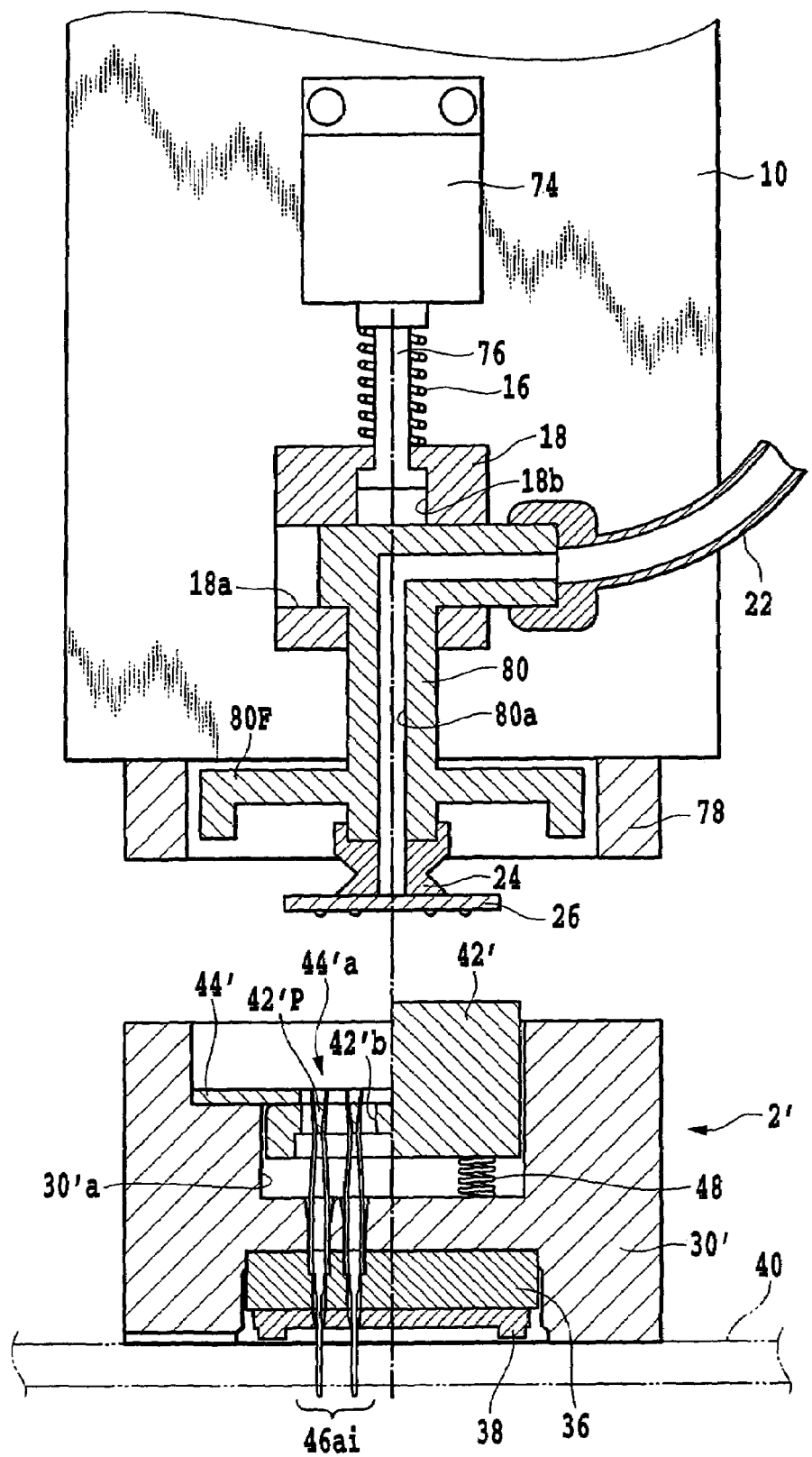
FIG. 15 is a block diagram schematically showing a configuration of a third embodiment of a device for mounting and demounting a semiconductor device employing an example of a method for mounting and demounting a semiconductor device according to the present invention.

FIG. 15 schematically shows a third embodiment of a device for mounting and demounting a semiconductor device according to the invention. In FIG. 15, elements identical to those in the example shown in FIG. 8 are indicated by like reference numerals, and the description will omit them to avoid duplication.

While the socket 2 for a semiconductor device in the example shown in FIG. 8 has the cover member 34 which moves the slider 42 up and down, in the example shown in FIG. 15, the function of the cover member 34 is provided by the IC socket operating member 78. Further, in the example shown in FIG. 15, a flanged suction pipe 80 is provided in place of the suction pipe 20 shown in FIG. 8.

A socket 2' for a semiconductor device primarily comprises a socket main body 30' secured on a printed wiring board 40; a plurality of contact terminals 46$ai$ (i=1 to n where n represents a positive integer) which is disposed in a contact housing portion 30'$a$ in the middle of the interior of the socket main body 30' and which electrically connect a semiconductor device 26 to be described later and a conductive layer of the printed wiring board 40; a positioning member 44' which houses the semiconductor device 26 to be tested and which positions electrode portions 26$a$ of the semiconductor device 26 relative to the contact terminals 46$ai$; and a slider 42' for bringing a pair of contact portions of the plurality of contact terminals 46$ai$ close to each other or moving them away from each other.

The slider 42' which forms a part of a contact terminal driving portion is disposed in the housing portion 30'$a$ of the socket main body 30' such that it can move in a direction substantially orthogonal to the moving directions of movable contact portions 46M and 46F of each contact terminal 46$ai$.

The slider 42' has openings 42'$b$ therein provided in the longitudinal and transverse directions thereof, the movable contact portions 46M and 46F of each contact terminal 46$ai$ protruding through the openings. Openings 42'$b$ in different rows are partitioned from each other by partition walls. The partition walls are formed in a direction substantially perpendicular to the plane of the drawing at predetermined intervals in association with each contact terminal 46$ai$.

A movable contact pressing portion 42'P is provided on the slider 42' between each pair of the openings 42'$b$ in each row, the pressing portion being formed to serve as a partition between the openings 42'$b$ and to serve as a partition between the movable contact portion 46M and the movable contact portion 46F. Further, a return spring 48 for urging the slider 42' so as to return it from the position shown in FIG. 17 to the position shown in FIG. 15 is provided between a lower end face of the slider 42' and a bottom surface of the housing portion 30'$a$ of the socket main body 30'.

As shown in FIG. 15, an upper part of the slider 42' protrudes a predetermined amount above an upper end face of the socket main body 30' in its initial position. At this time, the movable contact portion 46M and the movable contact portion 46F of the contact terminal 46$ai$ are close to each other.

Figure 16:
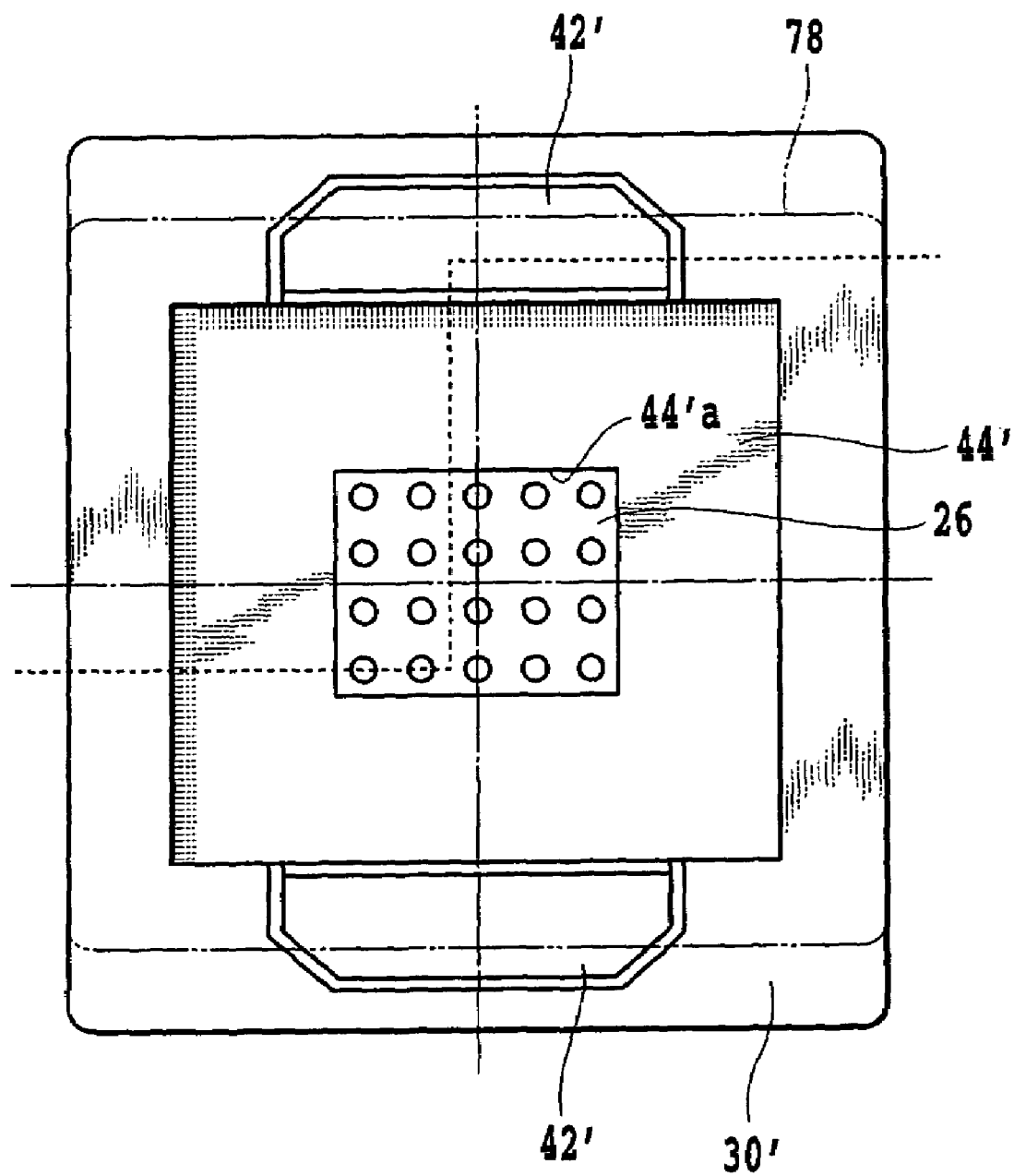
FIG. 16 is a plan view of the example shown in FIG. 15.
Figure 17:
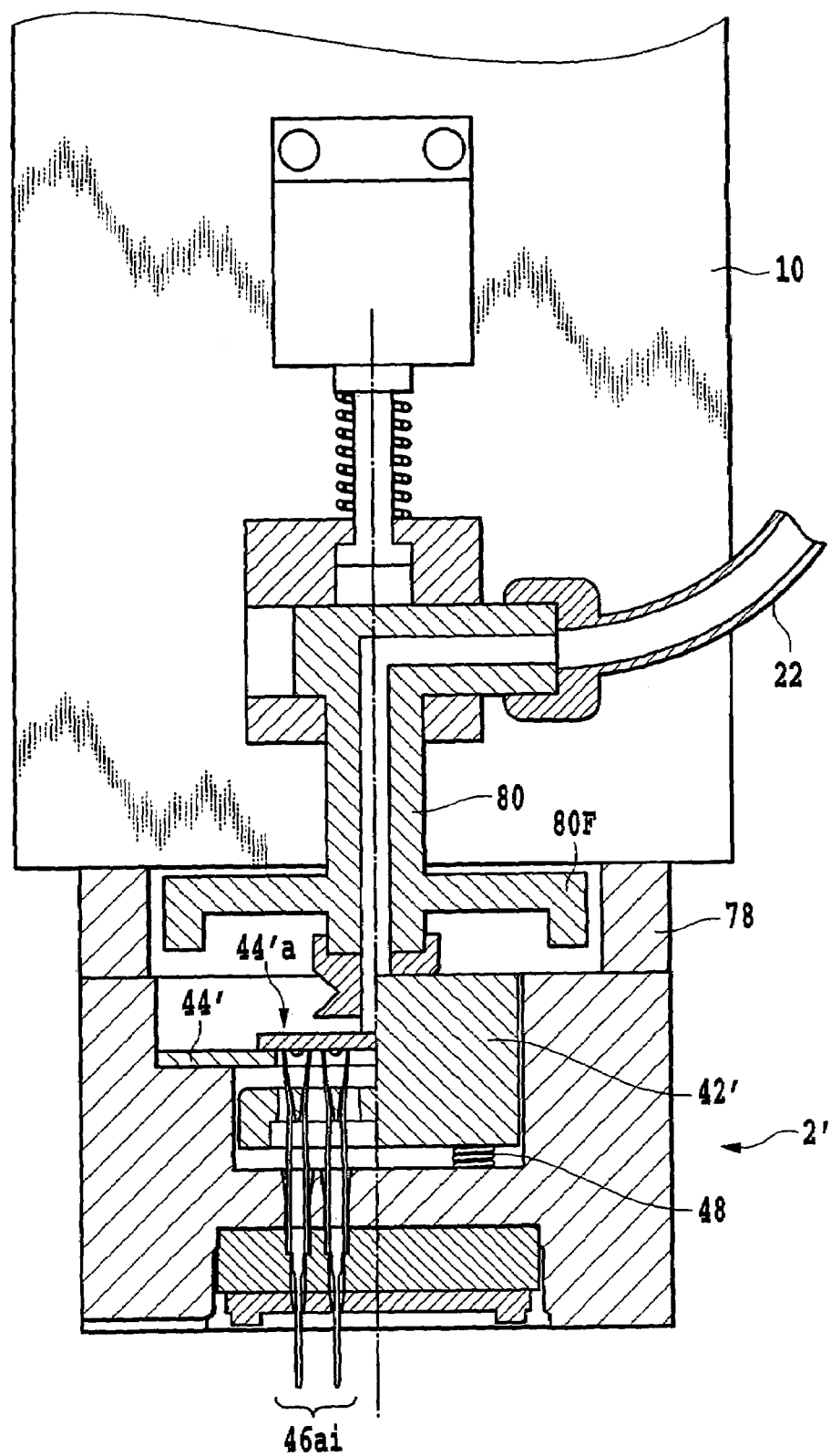
FIG. 17 is a block diagram for explaining the operation of the example shown in FIG. 15.

As shown in FIGS. 16 and 17, when the IC socket operating member 78 is moved down toward the socket main body 30', the upper end face of the slider 42' touching on the lower end face of the IC socket operating member 78 is pushed into the housing portion 30'$a$ against the urging force of the return spring 48 to become coplanar with the upper end face of the socket main body 30'. At this time, the movable contact portion 46M and the movable contact portion 46F of the contact terminal 46$ai$ are spaced from each other.

Thus, when the slider 42' is moved downward against the urging force of the return spring 48 as a result of the operation of moving the IC socket operating member 78 downward, the movable contact pressing portions 42'P are moved such that the movable contact portion 46M and the movable contact portion 46F of each contact terminal 46$ai$ are moved away from each other. The slider 42' is moved by the urging force of the return spring 48 and the restoring force of the movable contact portions 46M and the movable contact portions 46F as a result of the operation of moving the IC socket operating member 78 upward.

As shown in FIG. 15, in the middle of the positioning member 44', a mounting portion 44'$a$ is provided, on which a semiconductor device 26 is removably mounted. The mounting portion 44'$a$ is formed with an opening, and electrode portions located at four corners of a semiconductor device 26 engage the periphery of the opening at the respective corners thereof to position the semiconductor device 26.

For example, after a semiconductor device 26 held by the absorption pad 24 of the material handling portion 10 of the transport robot is released, the semiconductor device drops onto the mounting portion 44'$a$ from a predetermined height, and it is automatically guided and positioned.

The other end of the absorption pad 24 is coupled with one end of the L-shaped suction pipe 80. A channel 80$a$ forming a part of a suction channel is formed in the flanged suction pipe 80. One end of the tube 22 connected to the suction pipe, which is omitted in the illustration, is connected to another end of the flanged suction pipe 80. A flange portion 80F is provided at an outer circumferential end portion of the flanged suction pipe 80 on the side of the absorption pad 24. The flange portion 80F serving as a position regulating member has a diameter smaller than the inner diameter of the IC socket operating member 78 and an edge slightly greater than an outer dimension of the positioning member 44'.

Figure 21:
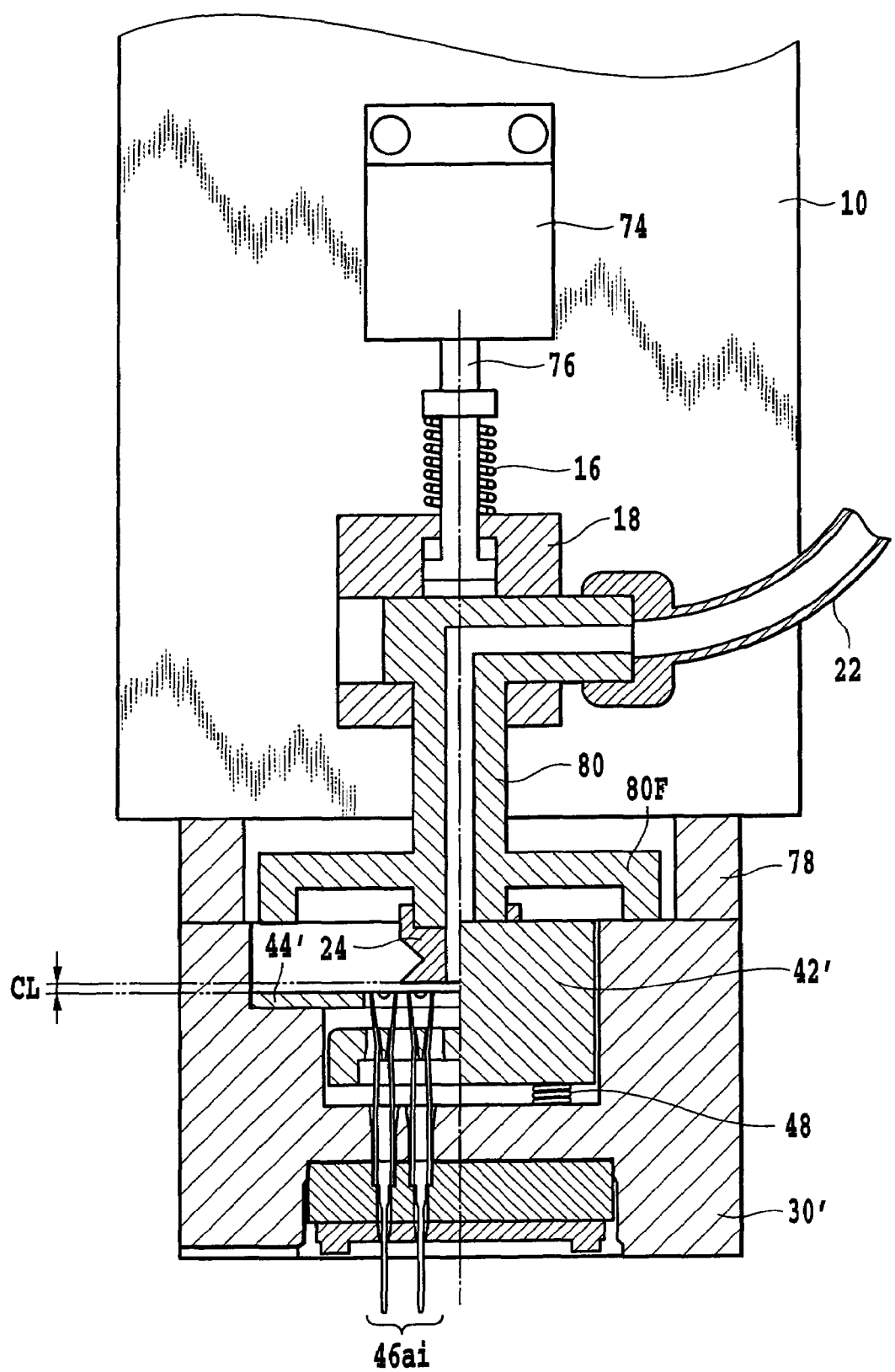
FIG. 21 is a block diagram for explaining the operation of the example shown in FIG. 15.

The outer circumferential edge of the flange portion 80F is bent in a predetermined length toward the socket main body 30'. For example, as shown in FIG. 21, the bending length is set such that a predetermined gap CL is formed between an end face of the absorption pad 24 and a top surface of the positioning member 44' or tips of the contact terminals 46$ai$ when end faces of the IC socket operating member 78 and the flange portion 80F touch on an upper end of the socket main body 30'. For example, the gap CL is set at a dimension in the excess of zero and smaller than the thickness of the semiconductor device 26 or dimension equal to the thickness of the semiconductor device 26.

Figure 22:
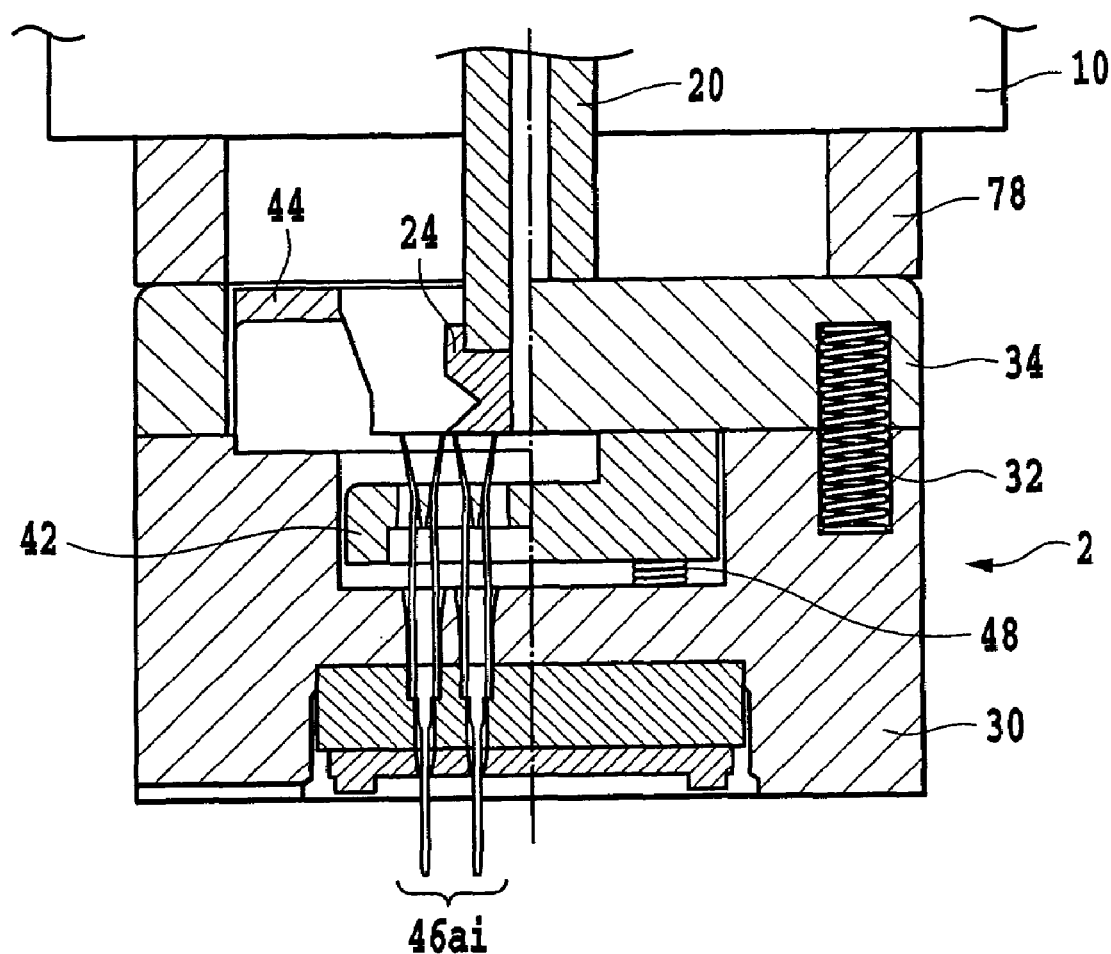
FIG. 22 is a block diagram schematically showing a state of the example shown in FIG. 8 in which an absorption pad has hit a contact terminal.

Therefore, since the gap CL is formed by providing the suction pipe 80 having such a flange portion 80F, for example, in the above-described second embodiment, it is possible to avoid such a situation that the absorption pad 24 holding no semiconductor device 26 is erroneously moved down for some reason to hit and damage the contact terminals 46ai, as shown in FIG. 22.

In such an embodiment, a control unit 50 as shown in FIG. 13 is similarly provided.

When a semiconductor device is mounted in a socket 2' for a semiconductor device in such a configuration, the control unit 50 forms control signals CM and CP and supplies them to the motor control portion 56 and the suction pump control portion 60, respectively, such that the transport robot having the material handling portion (MH) 10 will move down to the semiconductor device 26 on a tray, hold the semiconductor device 26, and moves up thereafter based on control command data group CD representing a mount command when the robot is moved to a position directly above the tray from a predetermined home position.

Thus, the absorption pad 24 of the material handling portion (MH) 10 holds the semiconductor device 26. At this time, the center axis of the absorption pad 24 coincides with the center axis of the semiconductor device 26.

Then, the transport robot is moved to a position directly above the socket 2 for a semiconductor device as shown in FIG. 15.

First, when it is determined based on the data DP1 that the absorption pad 24 is in the state shown in FIG. 15, the control unit 50 forms a control signal CM and supplies it to the motor control portion 56 such that the material handling portion (MH) 10 is moved down a predetermined amount and held at the lower end as shown in FIGS. 16 and 17 with the IC socket operating member 78 kept touching on a top surface of the slider 42'.

Since the slider 42' is thus moved down against the urging force of the return spring 48, the movable contact portions 46M and 46F of the contact terminal 46 are moved away from each other.

Next, the control unit 50 stops supplying the control signal CP to the suction pump control portion 60. As a result, as shown in FIG. 17, the semiconductor device 26 is released from the absorption pad 24 and is guided to be dropped and placed on the bottom of the positioning member 44'. At this time, each electrode portion 26a of the semiconductor device 26 is disposed between the movable contact portions 46M and 46F of a contact terminal 46.

Figure 18:
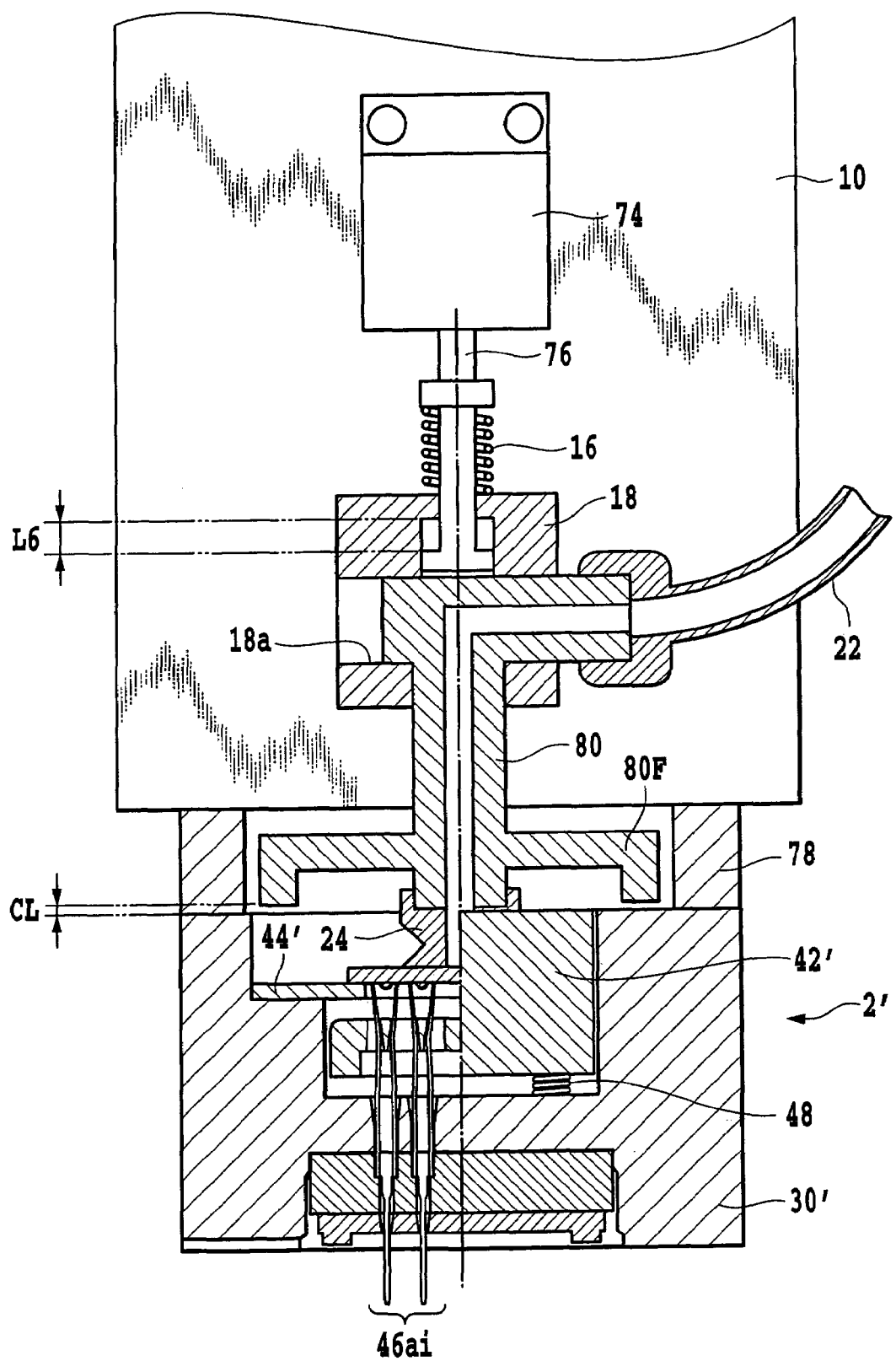
FIG. 18 is a block diagram for explaining the operation of the example shown in FIG. 15.

Subsequently, the control unit 50 forms a control signal CA and supplies it to the air cylinder control portion 58 such that the absorption pad 24 will be moved down further in touch on the surface of the semiconductor device 26 to urge the same by a predetermined length L6 against the urging force of the coil spring 16 while extending (moving down) the piston rod 76 further by a predetermined length. As a result, as shown in FIG. 18, a gap having the predetermined length L6 is formed between the inner circumferential surface of the floating member 18 that forms the recess 18b and the flange portion of the piston rod 76. As shown in FIG. 18, the gap CL is also formed between the end face of the flange portion 80F and the upper end of the socket main body 30'.

At this time, a jump of the semiconductor device 26 is prevented by the absorption pad 24.

Figure 19:
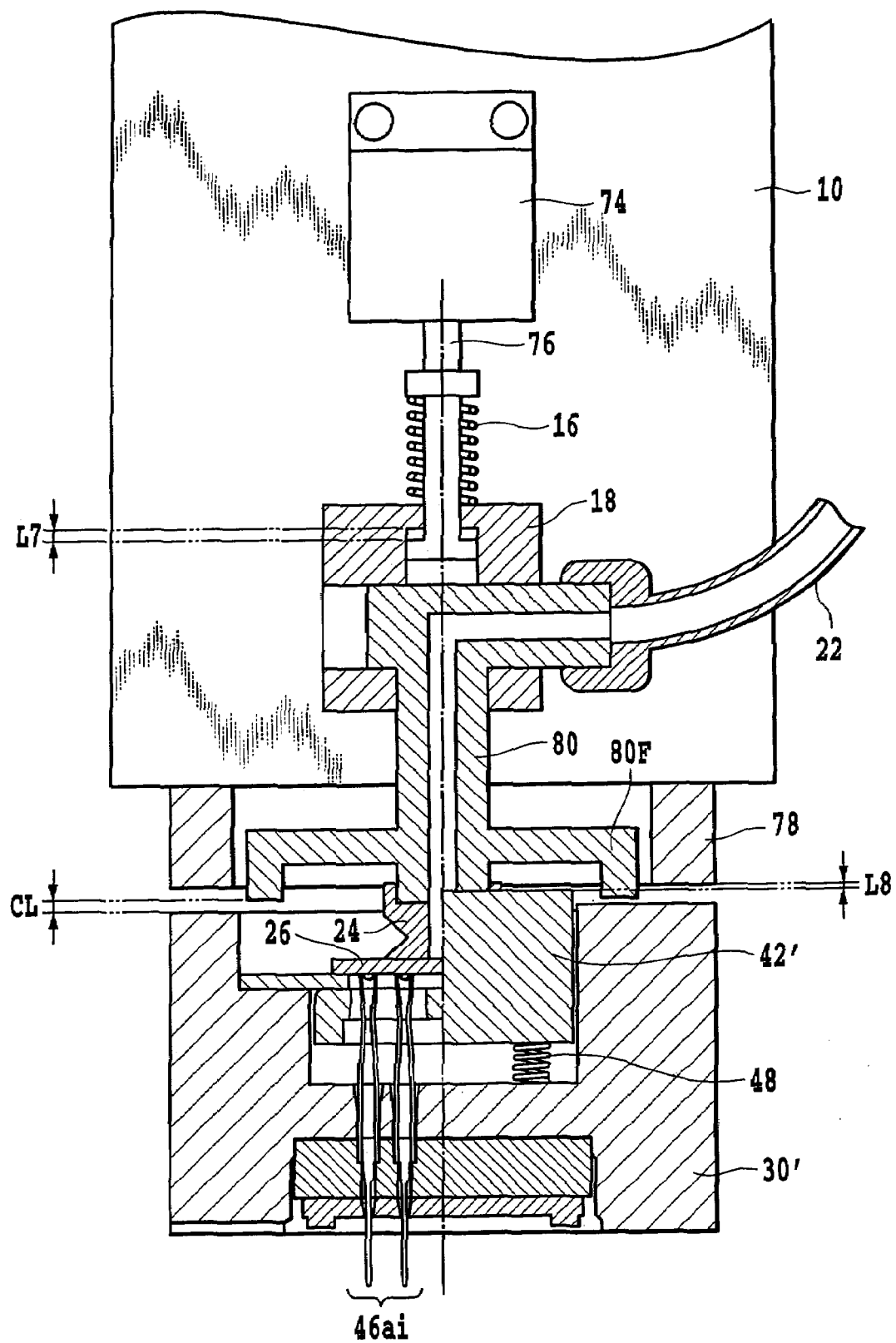
FIG. 19 is a block diagram for explaining the operation of the example shown in FIG. 15.

Subsequently, in order to pinch each electrode portion 26a of the semiconductor device 26 held by the absorption pad 24 with the movable contact portions 46M and 46F of the respective contact terminal 46, the control unit 50 forms a control signal CM and supplies it to the motor control portion 56 to move the material handling portion (MH) 10 and the IC socket operating member 78 upward a predetermined distance L8 as shown in FIG. 19.

As a result, the slider 42' is moved upward by the urging force of the return spring 48 in the state that the gap CL is formed between the end face of the flange portion 80F and the upper end of the socket main body 30', and the IC socket operating member 78 is moved away from the upper end of the slider 42', whereby the movable contact portions 46M and 46F of each contact terminal 46 pinch the respective electrode portion 26a of the semiconductor device 26. Thus, the mounting of the semiconductor device 26 to be tested is completed, and each electrode portion 26a of the semiconductor device 26 is electrically connected to the movable contact portions 46M and 46F. At this time, as shown in FIG. 19, a gap having a length L7 smaller than the predetermined length L6 is formed between the inner circumferential surface of the floating member 18 forming the recess 18b and the flange portion of the piston rod 76.

Figure 20:
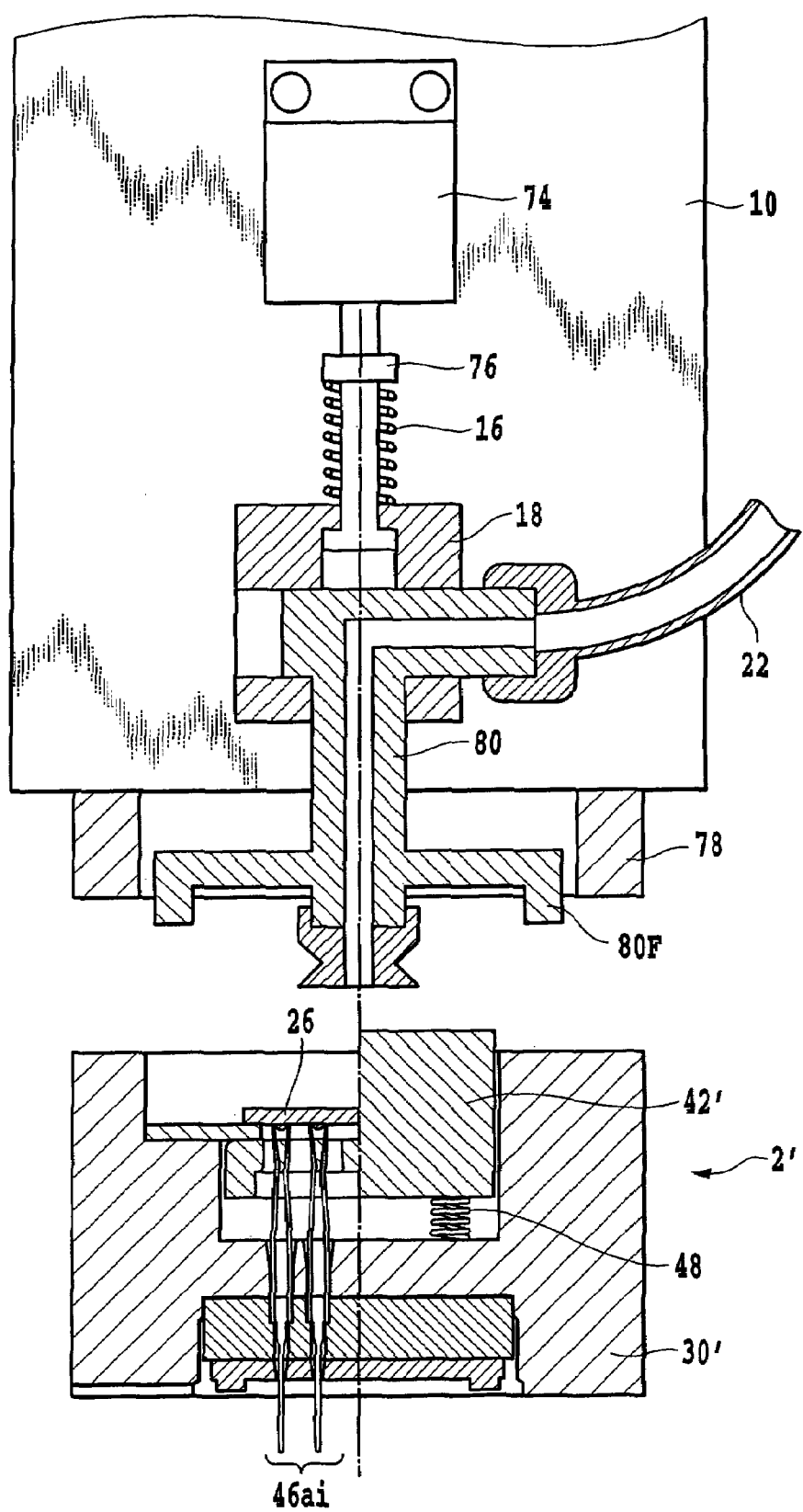
FIG. 20 is a block diagram for explaining the operation of the example shown in FIG. 15.

Subsequently, the control unit 50 forms a control signal CM based on the data DP1 and DP2 and supplies it to the motor control portion 56 to move up the material handling portion (MH) 10 and the IC socket operating portion 78 to a predetermined position shown in FIG. 20 based on test starting command data before stating a test. Thus, the slider 42' is moved up to its uppermost position by the urging force of the coil spring 48.

Subsequently, after the period of a predetermined test on the socket 2' for a semiconductor device passes, in order to remove the semiconductor device which has been tested from the socket 2' for a semiconductor device, the control unit 50 forms control signals CM and CP based on test ending command data and supplies them to the motor control portion 56 and the suction pump control portion 60 to move the IC socket operating member 78 and the material handling portion (MH) 10 down to the position shown in FIG. 17, to absorb and hold the semiconductor device which has been tested with the absorption pad 24, and to thereafter move up the IC socket operating member 78 and the material handling portion (MH) 10 with the semiconductor device held thereon based on the data DP1 and DP2. Thus, the semiconductor device which has been test is removed from the socket 2 for a semiconductor device.

In each of the above-described embodiments of the invention, photographic data obtained by a camera is used for detecting the predetermined positions of the IC socket operating member and the material handling portion (HM). However, the invention is not limited to such examples, and a configuration may be employed, in which the IC socket operating member and the material handling portion (MH) are controlled based on detection output signals from proximity sensors disposed in predetermined positions to detect the predetermined positions of the IC socket operating member and the material handling portion (MH).

Figure 23:
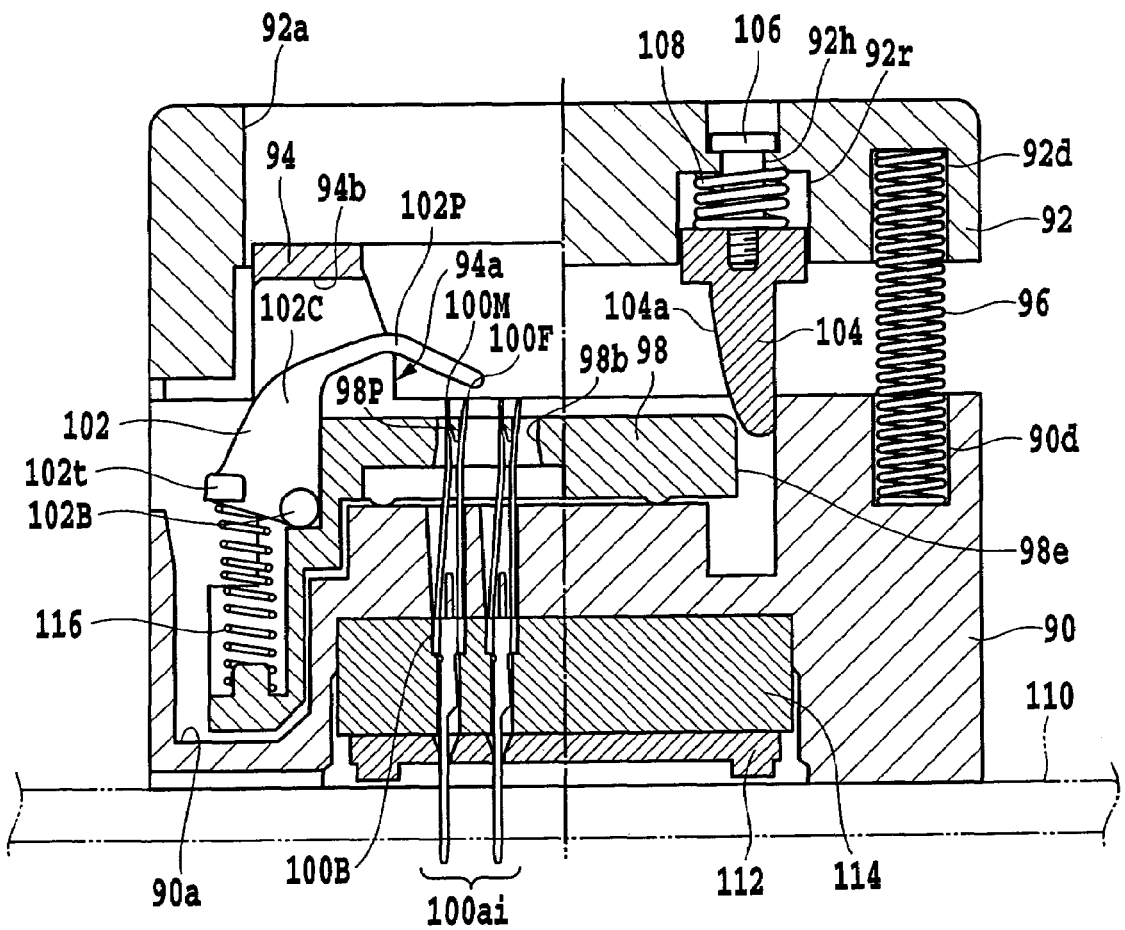
FIG. 23 is a sectional view schematically showing a configuration of a first embodiment of a socket for a semiconductor device according to the present invention.

FIG. 23 schematically shows a first embodiment of a socket for a semiconductor device according to the invention.

As shown in FIG. 23, the socket for a semiconductor device comprises a socket main body 90 which is disposed on a printed wiring board 110 and which houses contact terminals 100ai (i=1 to n where n represents a positive integer) for electrically connecting a semiconductor device 118 to be described later to the printed wiring board 110; a positioning member 94 which is disposed in a position inside the socket main body 90 above the contact terminals 100ai and which has a housing portion 94a for mounting the semiconductor device 118; a latch mechanism which is disposed around the positioning member 94 and which has a pair of presser members 102 for selectively holding the semiconductor device 118 relative to the housing portion 94a of the positioning member 94; and a cover member 92 which transmits an operating force applied thereto to the presser members 102 through a transmission mechanism to be described later.

The positioning member 94 positions the periphery of the BGA type semiconductor device 118 mounted in the housing portion 94a thereof to position electrode portions 118a of the semiconductor device 118 relative to movable contact portions 100F and 100M of the contact terminals 100ai.

For example, the positioning member 94 is disposed on an upper surface of a slider 98 such that it can be moved a predetermined distance in moving directions of the movable contact portions 100F and 100M of the contact terminals 100ai by movably engaging a pair of nails provided on the positioning member 94 with respective slots formed on the upper surface of the slider 98. Further, the positioning member 94 has an opening 94b therein to allow the presser members 102 to be described later to pass.

Figure 24:
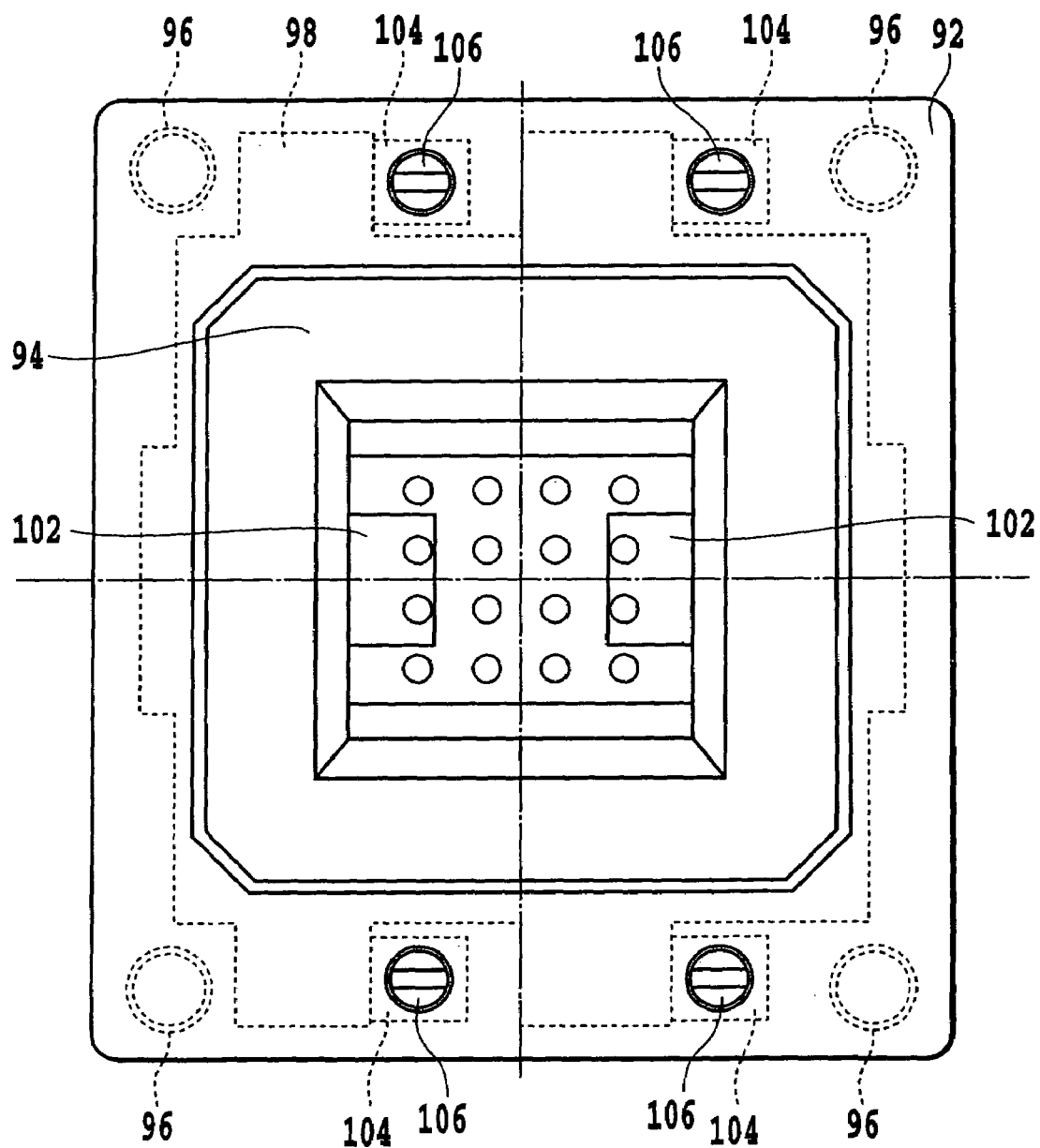
FIG. 24 is a plan view of the example shown in FIG. 23.

As shown in FIGS. 23 and 24, the pair of presser members 102 of the latch mechanism are disposed on both ends of the slider 98, respectively, such that they face each other with the housing portion 94a pinched between them. The presser member 102 comprises a proximal end portion 102B which is rotatably supported in the slider 98, an touching portion 102P which is selectively made to touch on or move away from an outer circumferential part of the semiconductor device 118, and a connecting portion 102C which connects the proximal end portion 102B and the touching portion 102P.

Figure 25:
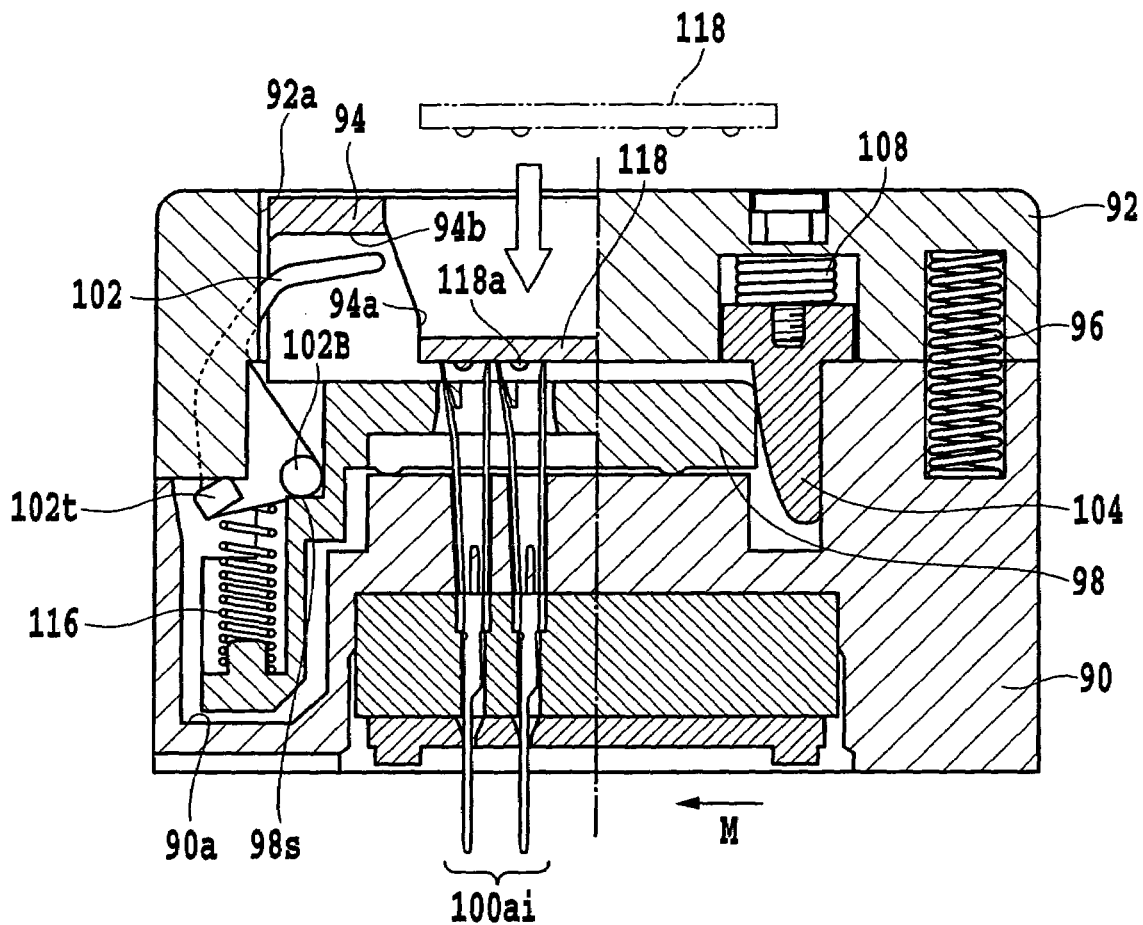
FIG. 25 is a sectional view for explaining the operation of the example shown in FIG. 23.

As shown in FIG. 25, the proximal end portion 102B is formed with a protruding portion 102t which is engaged with a lower end of the cover member 92 when the cover member 92 is in its lowermost position. A coil spring 116 for urging the touching portion 102P of the presser member 102 in the direction of approaching the contact terminals 100ai is provided between the proximal end portion 102B and a bottom wall of a recess formed in the slider 98 facing the same.

Figure 28:
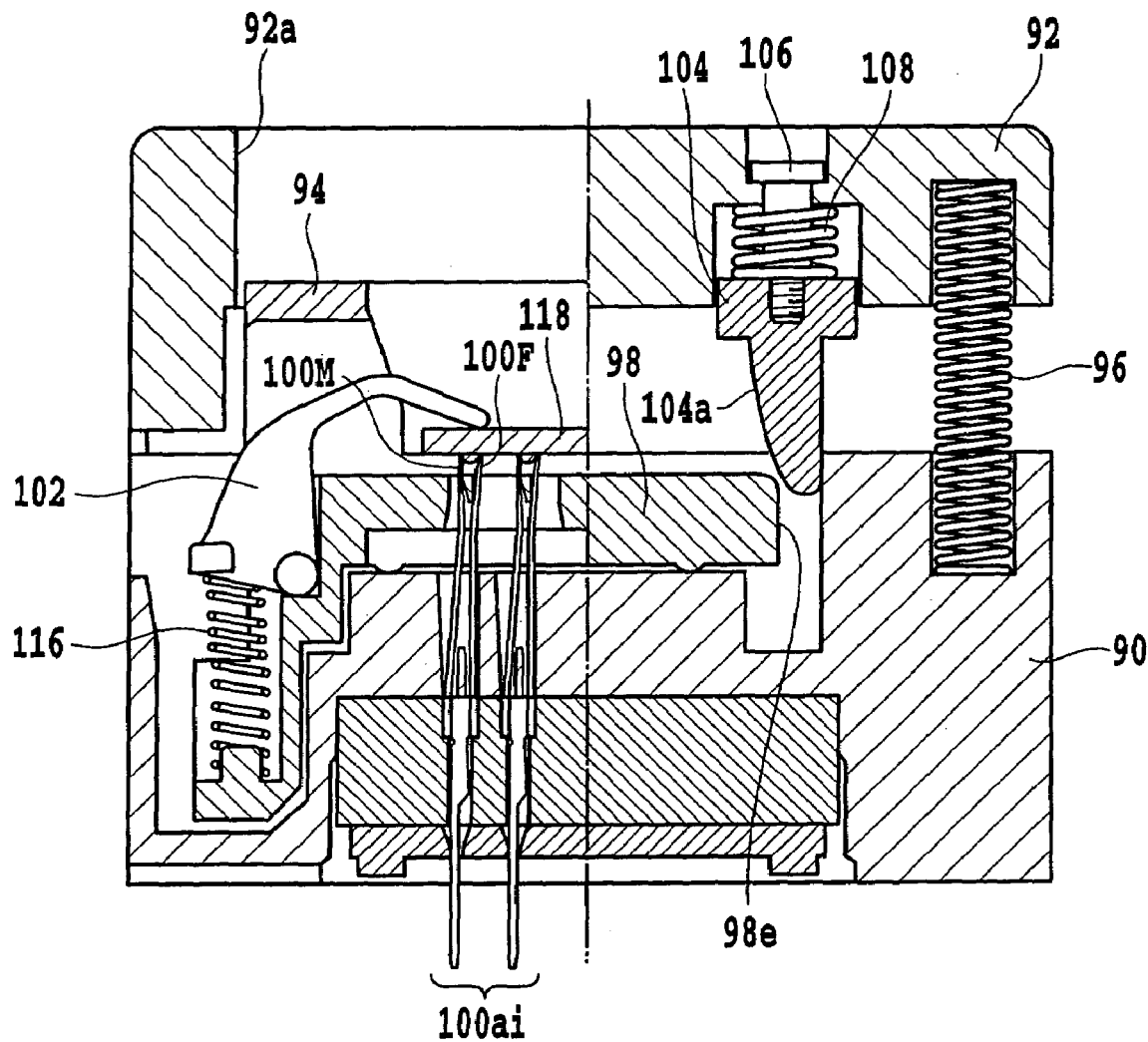
FIG. 28 is a sectional view for explaining the operation of the example shown in FIG. 23.

When the semiconductor device 118 is mounted in the housing portion 94a, as shown in FIG. 25, the touching portions 102P of the presser members 102 assume a standby position spaced away from the housing portion 94a to avoid interference with the semiconductor device 118. After the semiconductor device 118 is mounted in the housing portion 94a, the touching portions 102P of the presser members 102 enter the housing portion 94a and assume a holding position to depress and hold the semiconductor device 118, as shown in FIG. 28.

Each contact terminal 100ai comprises a terminal 100B on the base end side which is provided on the socket main body 90 in association with each electrode portion 118a of the semiconductor device 118 to be mounted and a pair of movable contact portions 100F and 100M which are coupled with the terminal 100B and which selectively pinch each electrode portion 118a of the semiconductor device 118. In accordance with a movement of the slider 98, the pair of movable contact portions 100F and 100M approach each other to pinch each electrode portion 118a of the semiconductor device 118 or move away from each other to release each electrode portion 118a of the semiconductor device 118.

The terminal 100B is inserted into a through hole on the bottom wall of the housing portion 90a on which the slider 98 is slid, and it is supported by a contact support member 114 and an aligning plate 112 which are disposed in a part of the socket main body 90 under the housing portion 90a.

The slider 98 is supported on the bottom wall of the housing portion 90a of the socket main body 90 such that it can slide in the moving directions of the movable contact portions 100M and 100F of the contact terminals 100ai.

The slider 98 has openings 98b therein provided in the longitudinal and transverse directions thereof, the movable contact portions 100M and 100F of each contact terminal 100ai protruding through the openings. Openings 98b in different rows are partitioned from each other by partition walls. The partition walls are formed in a direction substantially perpendicular to the plane of the drawing at predetermined intervals in association with each contact terminal 100ai.

A movable contact pressing portion 98P is provided on the slider 98 between each pair of the openings 98b in each row, the pressing portion being formed to serve as a partition between the openings 98b and to serve as a partition between the movable contact portion 100M and the movable contact portion 100F. Step portions 98s for rotatably supporting the proximal end portions 102B of the above-described presser members 102 are formed on both ends of the slider 98, respectively. A spring receiving portion for supporting the coil spring 116 is formed further outward from the step portions 98s of the slider 98.

Further, a return spring (not shown) for urging the slider 98 to return it from the position shown in FIG. 25 to the position shown in FIG. 23 is provided between an end face of the slider 42 on the left side thereof as viewed in FIG. 23 and a side surface of the housing portion 90a of the socket main body 90.

The cover member 92 has an opening 92a in the middle thereof, through which the semiconductor device 118 and the positioning member 94 pass when the semiconductor device 118 is mounted and removed in and from the housing portion 94a of the positioning member 94. The cover member 92 is disposed such that it can be moved up and down relative to the socket main body 90. As shown in FIG. 24, coil springs 96 are disposed at four corners between the cover member 92 and the socket main body 90 to urge the cover member 92 in the direction of moving away from the socket main body 90. One end of a coil spring 96 is disposed in a recess 92d on the cover member 92, and another end of the coil spring 96 is disposed in a recess 90d on the socket main body 90.

Further, as shown in FIGS. 23 and 24, cam mechanisms as timing adjusting mechanisms for adjusting the timing of the movement of the slider 98 are provided in four locations at predetermined intervals, the mechanisms being provided in recesses 92r on an inner surface at the periphery of the cover member 92 facing the slider 98. FIG. 23 shows an enlarged view of one of the cam mechanisms as a representative.

Each of the cam mechanisms comprises a cam piece 104 inserted between an engaging edge portion 98e of the slider 98 and an inner surface of a sidewall of the housing portion 90a, a fixing pin 106 for supporting the cam piece 104 in the recess 92r of the cover member 92, and a coil spring 108 which is wound around a shaft portion of the fixing pin 106 and which urges the cam piece 104 toward the gap between the engaging edge portion 98e of the slider 98 and the inner surface of the sidewall of the housing portion 90a.

As shown in FIG. 23, each of the cam pieces 104 is formed so as to protrude into the gap between the engaging edge portion 98e of the slider 98 and the inner surface of the sidewall of the housing portion 90a with its tapered tip directed downward. Each cam piece 104 has a cam surface 104a formed by a predetermined curved surface in a face-to-face relationship with the slider 98. The part of the cam piece 104 opposite to the cam surface 104a is formed by a flat surface which is substantially in parallel with the sidewall of the housing portion 90a located below opposite to the same. A female thread is formed to a predetermined depth at the base end of the cam piece 104, a male thread on the fixing pin 106 being screwed in the female thread. The base end of the cam piece 104 is disposed such that it can move relative to the recess 92r.

The shaft portion of a fixing pin 106 is fitted in a hole 92*h* formed in the recess 92*r*. A head portion of the fixing pin 106 is engaged with a circumferential edge at an open end of the hole 92*h*. As a result, the cam piece 104 is movably mounted in the recess 92*r* of the cover member 92 with the intervention of the fixing pin 106.

The spring constant of the coil spring 108 is set at a value such that the cam piece 104 does not come out from the gap between the engaging edge portion 98*e* of the slider 98 and the inner surface of the sidewall of the housing portion 90*a* when the slider 98 is returned in the direction opposite to the direction indicated by the arrow M shown in FIG. 25 after the cover member 92 is moved up.

When a semiconductor device 118 is tested in such a configuration, as shown in FIG. 25, the end of an arm of a working robot which is omitted in the illustration is first touched on an upper surface of the cover member 92 and is urged downward against the urging force of the coil springs 96. As a result, a lower end of the cover member 92 urges the protruding pieces 102*t*, and the presser members 102 move away from each other to be in an open state. The engaging edge portion 98*e* of the slider 98 is urged by the cam surface 104*a* of the cam piece 104 in the direction of the arrow M shown in FIG. 25, which moves the slider 98. Therefore, as shown in FIG. 25, the movable contact portions 100M of the contact terminals 100*ai* move away from the movable contact portions 100F with a maximum amount of opening.

For example, the semiconductor device 118 as a material to be inspected is absorbed and held by a transport arm of a transport robot which is omitted in the illustration and transported to a position directly above the opening 92*a* of the cover member 92 and the positioning member 94.

Next, as shown in FIG. 25, the semiconductor device 118 absorbed and held by the transport arm is moved down through the opening 92*a* of the cover member 92 and positioned and mounted in the housing portion 94*a*.

Subsequently, when the end of the working robot is moved upward in touch on the upper surface of the cover member 92, the cover member 92 is moved upward by the urging force of the coil springs 96 from the lowermost position thereof shown in FIG. 25 to the uppermost position thereof.

As a result, immediately after the cover member 92 begins to move upward, the touching portions 102P of the presser members 102 are rotated by the urging force of the coil springs 116 at substantially the same timing in the respective directions of approaching each other to urge the semiconductor device 118 toward the contact terminals 100*ai*.

Figure 26:
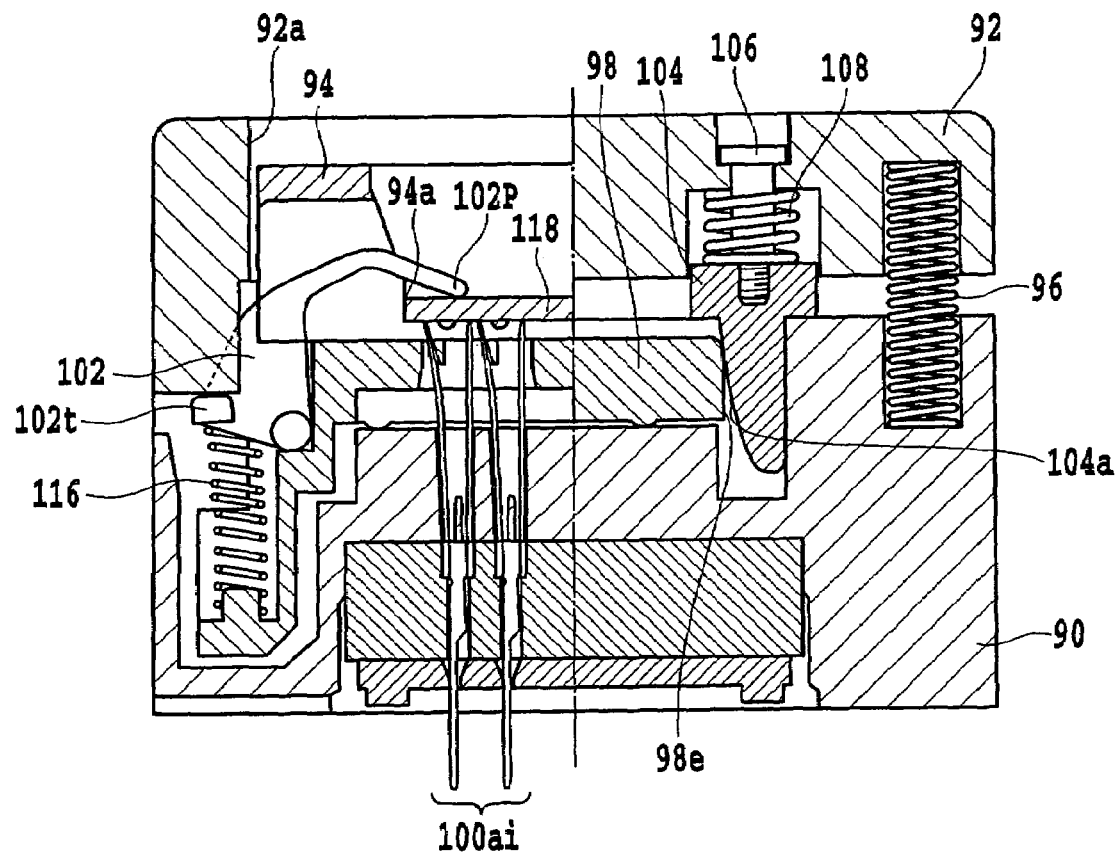
FIG. 26 is a sectional view for explaining the operation of the example shown in FIG. 23.
Figure 27:
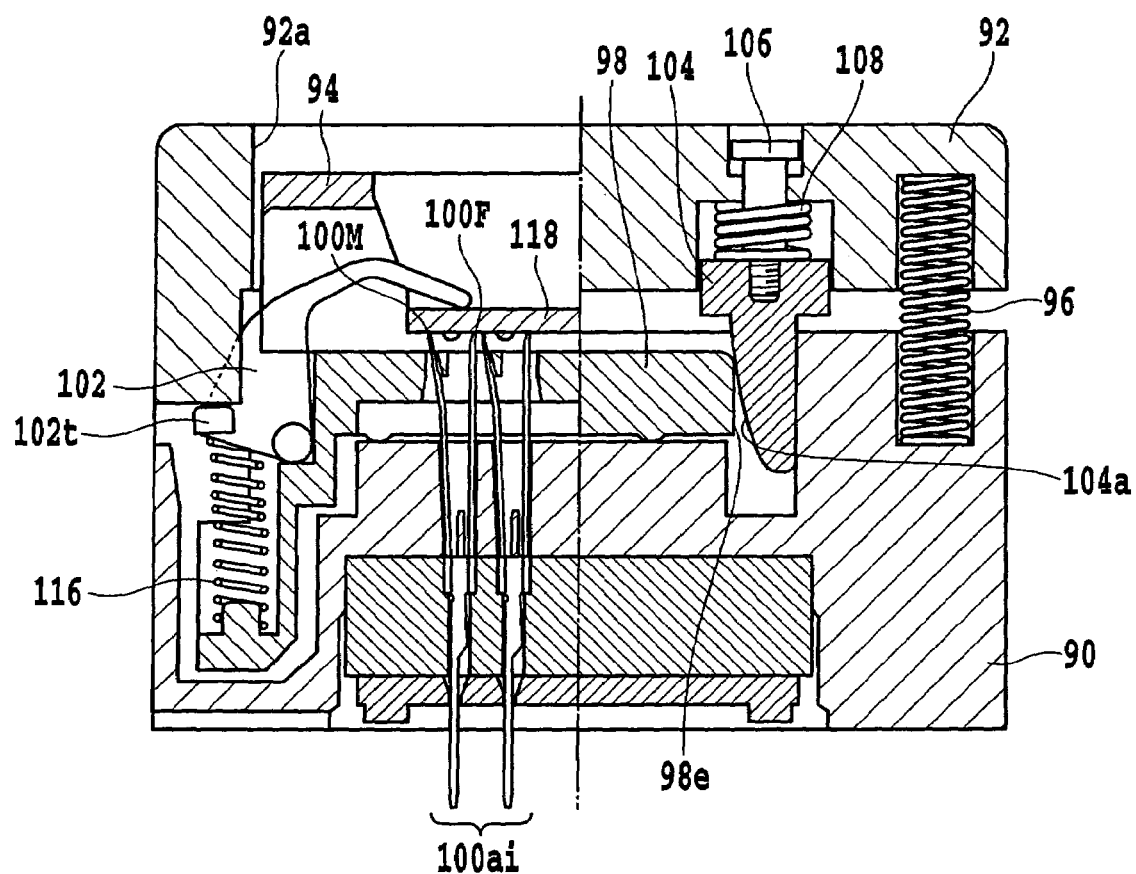
FIG. 27 is a sectional view for explaining the operation of the example shown in FIG. 23.

At this time, as shown in FIGS. 26 and 27, since the engaging edge portions 98*e* of the slider 98 touch on the cam surfaces 104*a* of the cam pieces 104, the amount of opening between the movable contact portions 100M and the movable contact portions 100F of the contact terminals 100*ai* is maintained at the maximum amount of opening mentioned above. Therefore, since the touching portions 102P of the presser members 102 touch on the semiconductor device 118 before the amount of opening between the movable contact portions 100M and the movable contact portions 100F becomes small, a jump of the semiconductor device 118 is avoided.

Subsequently, the cover member 92 is further moved upward along with the cam pieces 104 as shown in FIG. 28, whereby the slider 98 is returned to allow the electrode portions 118*a* of the semiconductor device 118 to be pinched between the movable contact portions 100M and the movable contact portions 100F.

Then, an inspection signal is supplied to an input/output portion of the printed wiring board 110 with the cover member 92 kept in the uppermost position, which allows a predetermined test to be conducted.

When the test of the semiconductor device 118 is finished, the semiconductor device 118 is removed, and the end of the arm of the working robot is urged downward against the urging force of the coil springs 96 while being touched on the upper surface of the cover member 92 in the same way as described above to mount a new semiconductor device 118. The semiconductor device 118 which has been tested is removed by the transport arm, and the new semiconductor device 118 to be tested is mounted in the same way as described above.

In such an embodiment, therefore, the timing adjusting mechanism portion makes it possible to easily adjust the timing for pinching the electrode portions of a semiconductor device with the contact portions of the contact terminals after the presser members touch on the upper surface of the semiconductor device.

Figure 29:
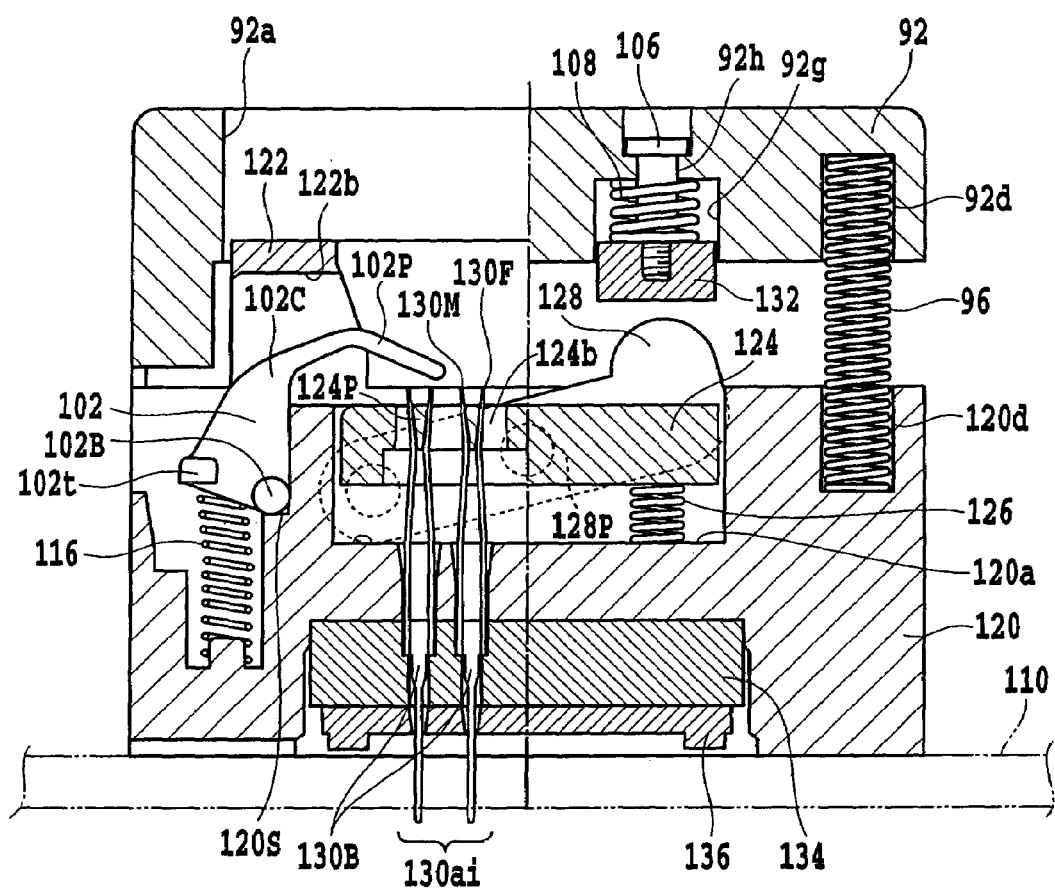
FIG. 29 is a sectional view schematically showing a configuration of a second embodiment of a socket for a semiconductor device according to the present invention.

FIG. 29 schematically shows a second embodiment of a socket for a semiconductor device according to the invention. In FIG. 29, elements identical to those in the example shown in FIG. 23 are indicated by like reference numerals, and the description will omit them to avoid duplication.

As shown in FIG. 29, the socket for a semiconductor device comprises a socket main body 120 which is disposed on a printed wiring board 110 and which houses contact terminals 130*ai* (i=1 to n where n represents a positive integer) for electrically connecting a semiconductor device 118 to the printed wiring board 110; a positioning member 122 which is disposed in a position inside the socket main body 120 above the contact terminals 130*ai* and which has a housing portion 122*a* for mounting the semiconductor device 118; a slider 124 for bringing movable contacts 130M and 130F of the contact terminals 130*ai* close to each other or moving them away from each other; a latch mechanism which is disposed around the positioning member 122 and which has a pair of presser members 102 for selectively holding the semiconductor device 118 relative to the housing portion 122*a* of the positioning member 122; and a cover member 92 which transmits an operating force applied thereto to the presser members 102 through a transmission mechanism to be described later.

Each contact terminal 130*ai* comprises a terminal 130B on the base end side which is provided on the socket main body 120 in association with each electrode portion 118*a* of the semiconductor device 118 to be mounted and a pair of movable contact portions 130F and 130M which are coupled with the terminal 130B and which selectively pinch each electrode portion 118*a* of the semiconductor device 118. In accordance with a movement of the slider 124, the pair of movable contact portions 130F and 130M approach each other to pinch each electrode portion 118*a* of the semiconductor device 118 or move away from each other to release each electrode portion 118*a* of the semiconductor device 118.

The terminal 130B is inserted into a through hole on the bottom wall of the housing portion 120*a* on which the slider 124 is slid, and it is supported by a contact support member 134 and an aligning plate 136 which are disposed in a part of the socket main body 120 under the housing portion 120*a*.

The slider 124 is supported on a sidewall of the housing portion 120*a* of the socket main body 120 such that it can slide in a direction that is substantially orthogonal to the moving directions of the movable contact portions 130M and 130F. of the contact terminals 130*ai*.

The slider 124 has openings 124*b* therein provided in the longitudinal and transverse directions thereof, the movable contact portions 130M and 130F. of each contact terminal 130*ai* protruding through the openings. Openings 124*b* in different rows are partitioned from each other by partition walls. The partition walls are formed in a direction substantially perpendicular to the plane of the drawing at predetermined intervals in association with each contact terminal 130*ai*.

A movable contact pressing portion 124P is provided on the slider 124 between each pair of the openings 124*b* in each row, the pressing portion being formed to serve as a partition between the openings 124*b* and to serve as a partition between the movable contact portion 130M and the movable contact portion 130F. The movable contact pressing portion 124P has a section that is substantially in the form of an isosceles triangle.

Step portions 120*s* for rotatably supporting the proximal end portions 102B of the above-described presser members 102 are formed on opposite ends of the outer circumference of the housing portion 120*a*, respectively. A spring receiving portion for supporting the coil spring 116 is formed further outward from the step portions 120*s*.

Further, a return spring 126 for urging the slider 124 in the direction of moving away from the bottom of the housing portion 120*a* is provided between a bottom surface of the slider 124 in FIG. 29 and the bottom of the housing portion 120*a* of the socket main body 120.

The cover member 92 is disposed such that it can be moved up and down relative to the socket main body 120. As shown in FIG. 29, coil springs 96 are disposed at four corners between the cover member 92 and the socket main body 130 to urge the cover member 92 in the direction of moving away from the socket main body 120. One end of a coil spring 96 is disposed in a recess 92*d* on the cover member 92, and another end of the coil spring 96 is disposed in a recess 120*d* on the socket main body 120.

Figure 30:
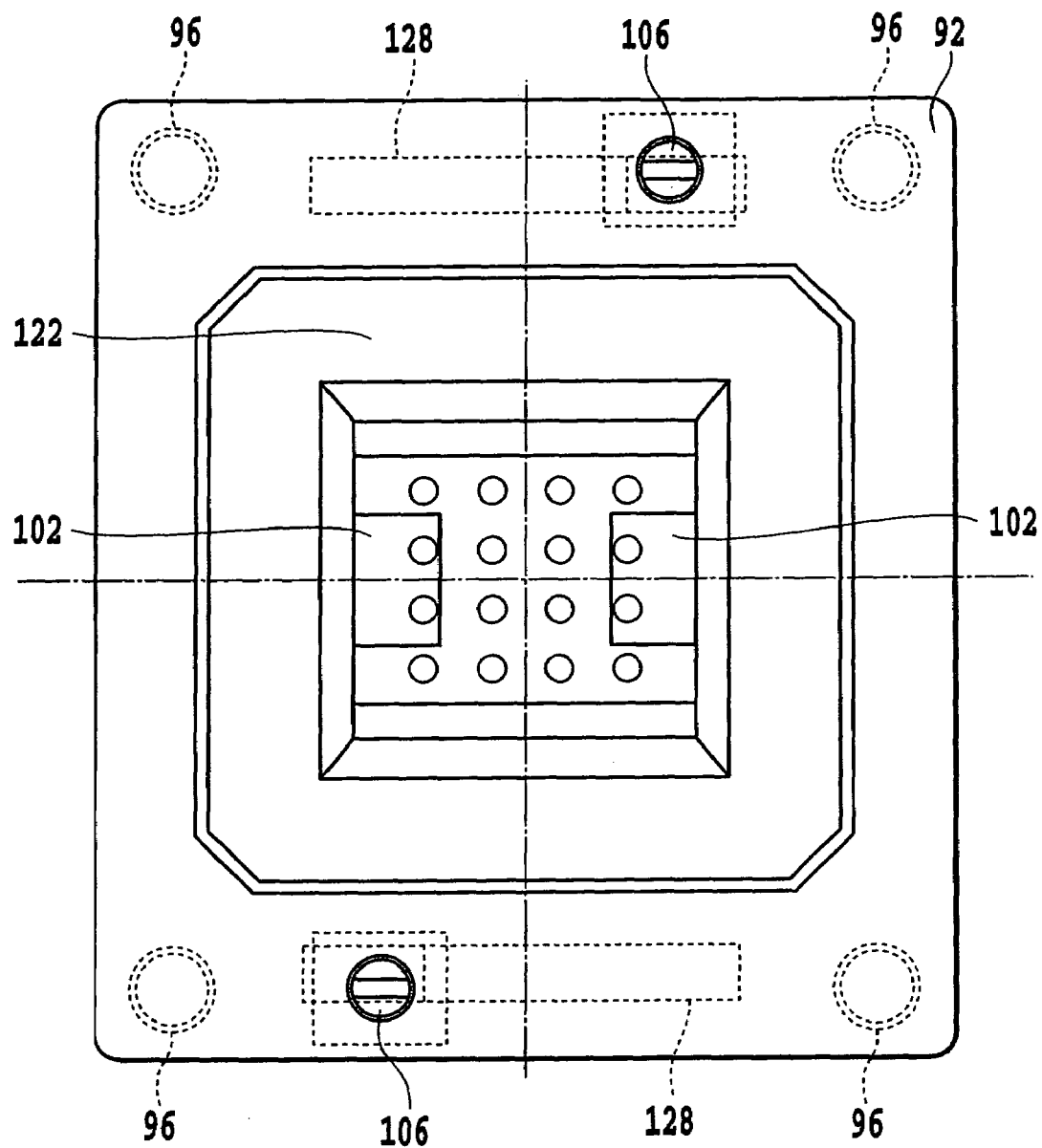
FIG. 30 is a plan view of the example shown in FIG. 29.

Further, as shown in FIGS. 29 and 30, a pair of lever members 128 for transmitting an operating force of the cover member 92 to be described later to the slider 124 is provided substantially in parallel with ends of the slider 124.

One end of a lever member 128 is rotatably supported on the socket main body 120. An intermediate part of a lever member 128 is connected to the slider 124 with a pin member 128P. As a result, when the other ends of the lever members 128 are urged downward, the slider 124 is moved downward against the urging force of the return spring 126.

Further, timing adjusting mechanisms for adjusting the timing of upward and downward movements of the slider 124 are provided in two locations, the mechanisms being provided in recesses 92*g* on an inner surface at the periphery of the cover member 92 facing the lever member 128, as shown in FIGS. 29 and 30.

Each of the timing adjusting mechanisms comprises a pressing piece 132 for pressing the other end of the lever member 128, a fixing pin 106 for supporting the pressing piece 132 in the recess 92*g* of the cover member 92, and a coil spring 108 which is wound around a shaft portion of the fixing pin 106 and which urges the pressing piece 132 toward the lever member 128.

As shown in FIG. 29, an end of each pressing piece 132 protrudes downward from an inner surface of the cover member 92. For example, the end has a flat surface which is in parallel with the inner surface of the cover member 92. A female thread is formed to a predetermined depth at the base end of the pressing piece 132, a male thread on the fixing pin 106 being screwed in the female thread. The pressing pieces 132 are movably disposed in the recesses 92*g*.

A shaft portion of a fixing pin 106 is fitted in a hole 92*h* formed in the recess 92*g*. A head portion of the fixing pin 106 is engaged with a circumferential edge at an open end of the hole 92*h*. As a result, the pressing piece 132 is movably mounted in the recess 92*g* of the cover member 92 with the intervention of the fixing pin 106.

The spring constant of the coil spring 108 is set at a value such that the pressing piece 132 is not pushed upward by the other end of the lever member 128 immediately after the cover member 92 is moved upward.

Figure 31:
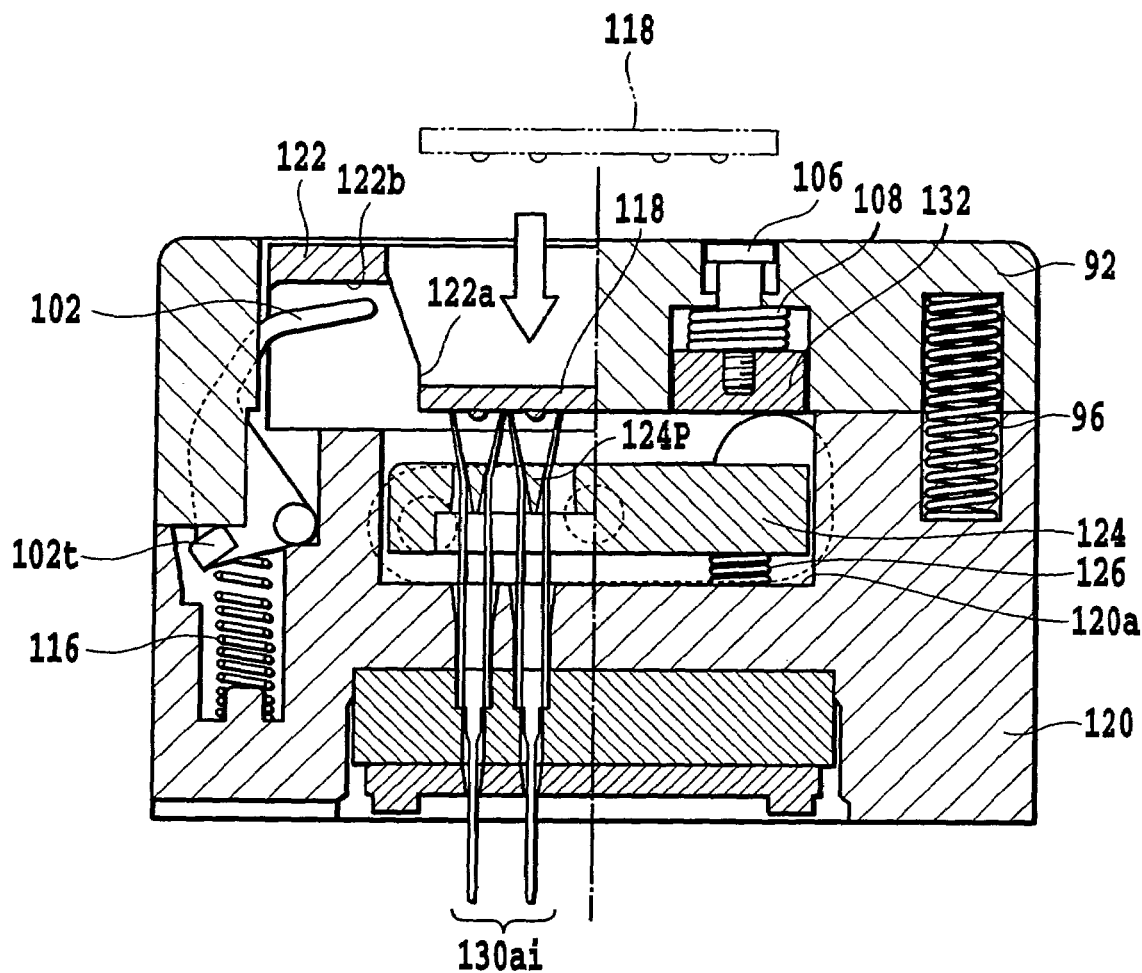
FIG. 31 is a sectional view for explaining the operation of the example shown in FIG. 29.

When a semiconductor device 118 is tested in such a configuration, as shown in FIG. 31, the end of an arm of a working robot which is omitted in the illustration is first touched on an upper surface of the cover member 92 and is urged downward against the urging force of the coil springs 96. As a result, a lower end of the cover member 92 urges the protruding pieces 102*t*, and the presser members 102 move away from each other to be in an open state. The lever members 128 are urged by the pressing pieces 132 to move downward against the urging force of the return spring 126, which moves the slider 124. Therefore, as shown in FIG. 31, the movable contact portions 130M of the contact terminals 130*ai* move away from the movable contact portions 130F with a maximum amount of opening as the movable contact pressing portion 124P moves downward.

For example, the semiconductor 118 as a material to be inspected is absorbed and held by a transport arm of a transport robot which is omitted in the illustration and transported to a position directly above the opening 92*a* of the cover member 92 and the positioning member 122.

Next, as shown in FIG. 31, the semiconductor device 118 absorbed and held by the transport arm is moved down through the opening 92*a* of the cover member 92 and positioned and mounted in the housing portion 122*a*.

Subsequently, when the end of the working robot is moved upward in touch on the upper surface of the cover member 92, the cover member 92 is moved upward by the urging force of the coil springs 96 from the lowermost position thereof shown in FIG. 31 toward the uppermost position thereof.

As a result, immediately after the cover member 92 begins to move upward, the touching portions 102P of the presser members 102 are rotated by the urging force of the coil springs 116 at substantially the same timing in the respective directions of approaching each other to urge the semiconductor device 118 toward the contact terminals 130*ai*.

Figure 32:
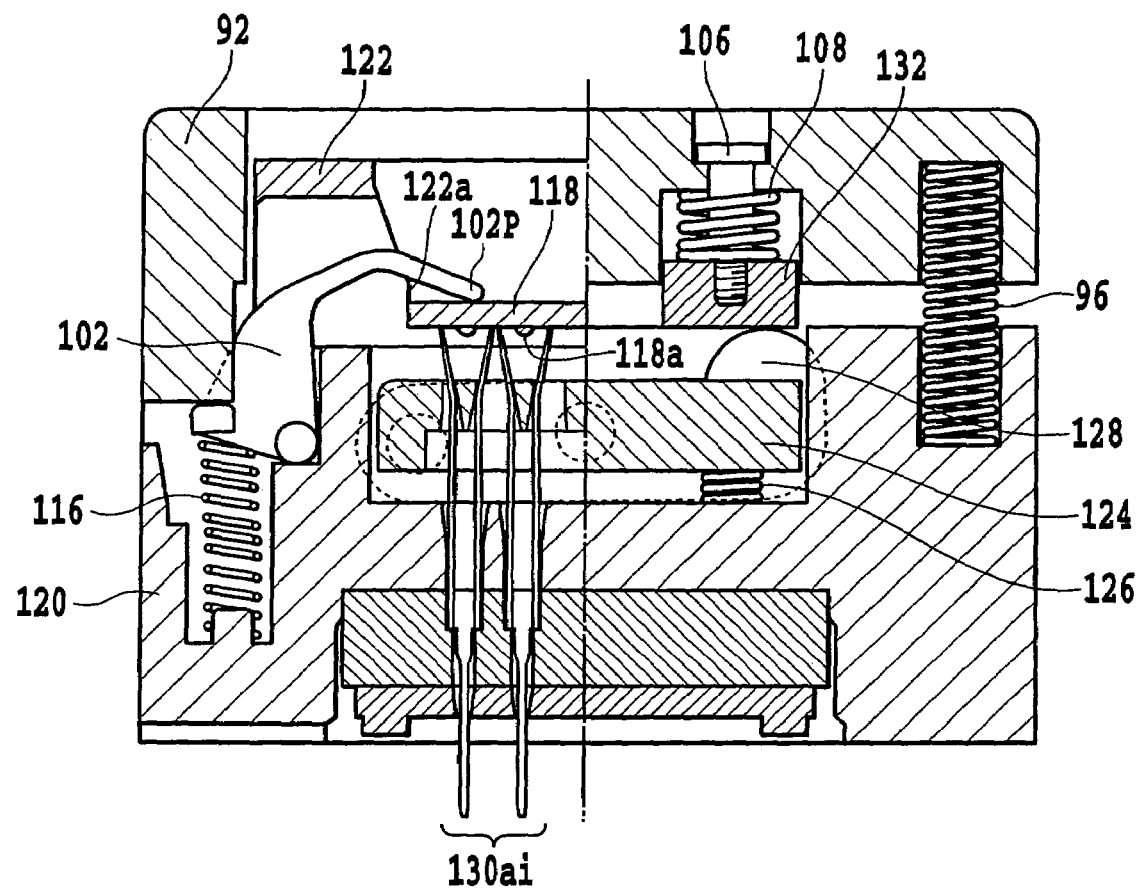
FIG. 32 is a sectional view for explaining the operation of the example shown in FIG. 29.

At this time, as shown in FIG. 32, since the lever members 128 touch on flat surfaces of the pressing pieces 132, the amount of opening between the movable contact portions 130M and the movable contact portions 130F of the contact terminals 130*ai* is maintained at the maximum amount of opening mentioned above. Therefore, since the touching portions 102P of the presser members 102 touch on the semiconductor device 118 before the amount of opening between the movable contact portions 130M and the movable contact portions 130F becomes small, a jump of the semiconductor device 118 is avoided.

Figure 33:
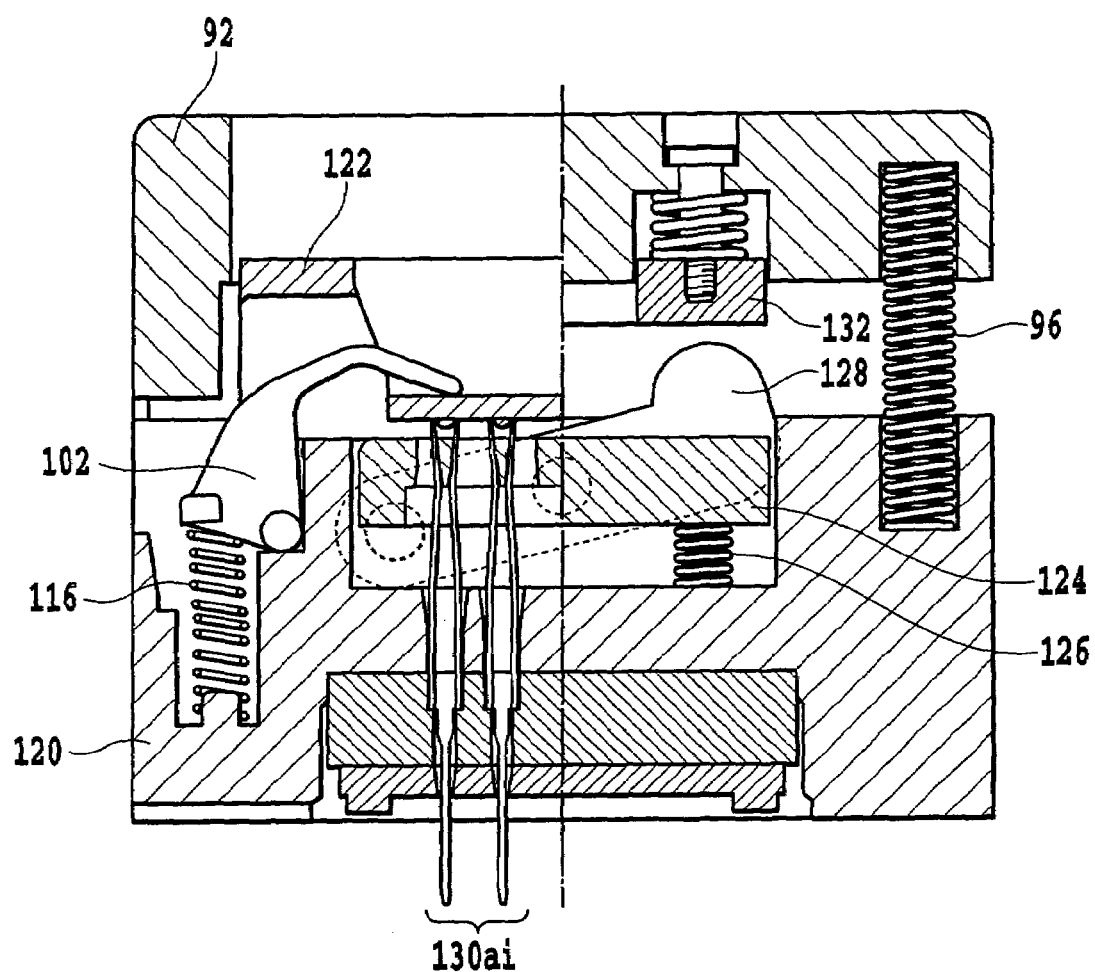
FIG. 33 is a sectional view for explaining the operation of the example shown in FIG. 29.

Subsequently, the cover member 92 is further moved upward as shown in FIG. 33, whereby the pressing pieces 132 are moved away from the other end of the lever members 128, and the slider 124 is moved upward by the urging force of the coil springs 126 to allow the electrode portions 118*a* of the semiconductor device 118 to be pinched between the movable contact portions 130M and the movable contact portions 130F.

Figure 34:
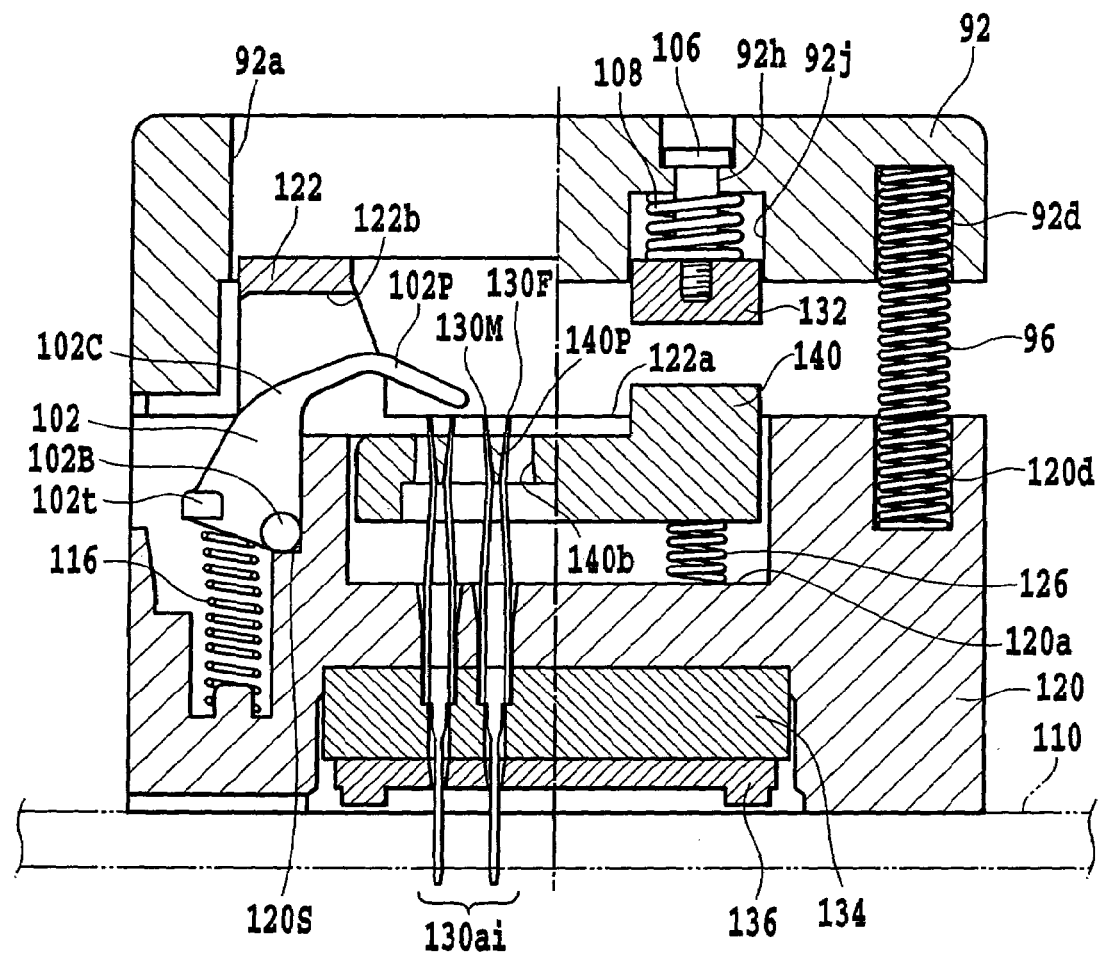
FIG. 34 is a sectional view schematically showing a configuration of a third embodiment of a socket for a semiconductor device according to the present invention.

FIG. 34 schematically shows a third embodiment of a socket for a semiconductor device according to the invention. In FIG. 34, elements identical to those in the example shown in FIG. 29 are indicated by like reference numerals, and the description will omit them to avoid duplication.

As shown in FIG. 34, the socket for a semiconductor device comprises a socket main body 120 which is disposed on a printed wiring board 110 and which houses contact terminals 130ai (i=1 to n where n represents a positive integer) for electrically connecting a semiconductor device 118 to the printed wiring board 110; a positioning member 122 which is disposed in a position inside the socket main body 120 above the contact terminals 130ai and which has a housing portion 122a for mounting the semiconductor device 118; a latch mechanism which is disposed around the positioning member 122 and which has a pair of presser members 102 for selectively holding the semiconductor device 118 relative to the housing portion 122a of the positioning member 122; and a cover member 92 which transmits an operating force applied thereto to the presser members 102 through a transmission mechanism to be described later.

A slider 140 is supported on a sidewall of the housing portion 120a of the socket main body 120 such that it can slide in a direction that is substantially orthogonal to the moving directions of the movable contact portions 130M and 130F of the contact terminals 130ai.

The slider 140 has openings 140b therein provided in the longitudinal and transverse directions thereof, the movable contact portions 130M and 130F of each contact terminal 130ai protruding through the openings. Openings 140b in different rows are partitioned from each other by partition walls. The partition walls are formed in a direction substantially perpendicular to the plane of the drawing at predetermined intervals in association with each contact terminal 130ai.

A movable contact pressing portion 140P is provided on the slider 140 between each pair of the openings 140b in each row, the pressing portion being formed to serve as a partition between the openings 140b and to serve as a partition between the movable contact portion 130M and the movable contact portion 130F. The movable contact pressing portion 140P has a section that is substantially in the form of an isosceles triangle.

A return spring 126 for urging the slider 140 in the direction of moving away from the bottom of the housing portion 120a is provided between a bottom surface of the slider 140 in FIG. 29 and the bottom of the housing portion 120a of the socket main body 120.

Figure 35:
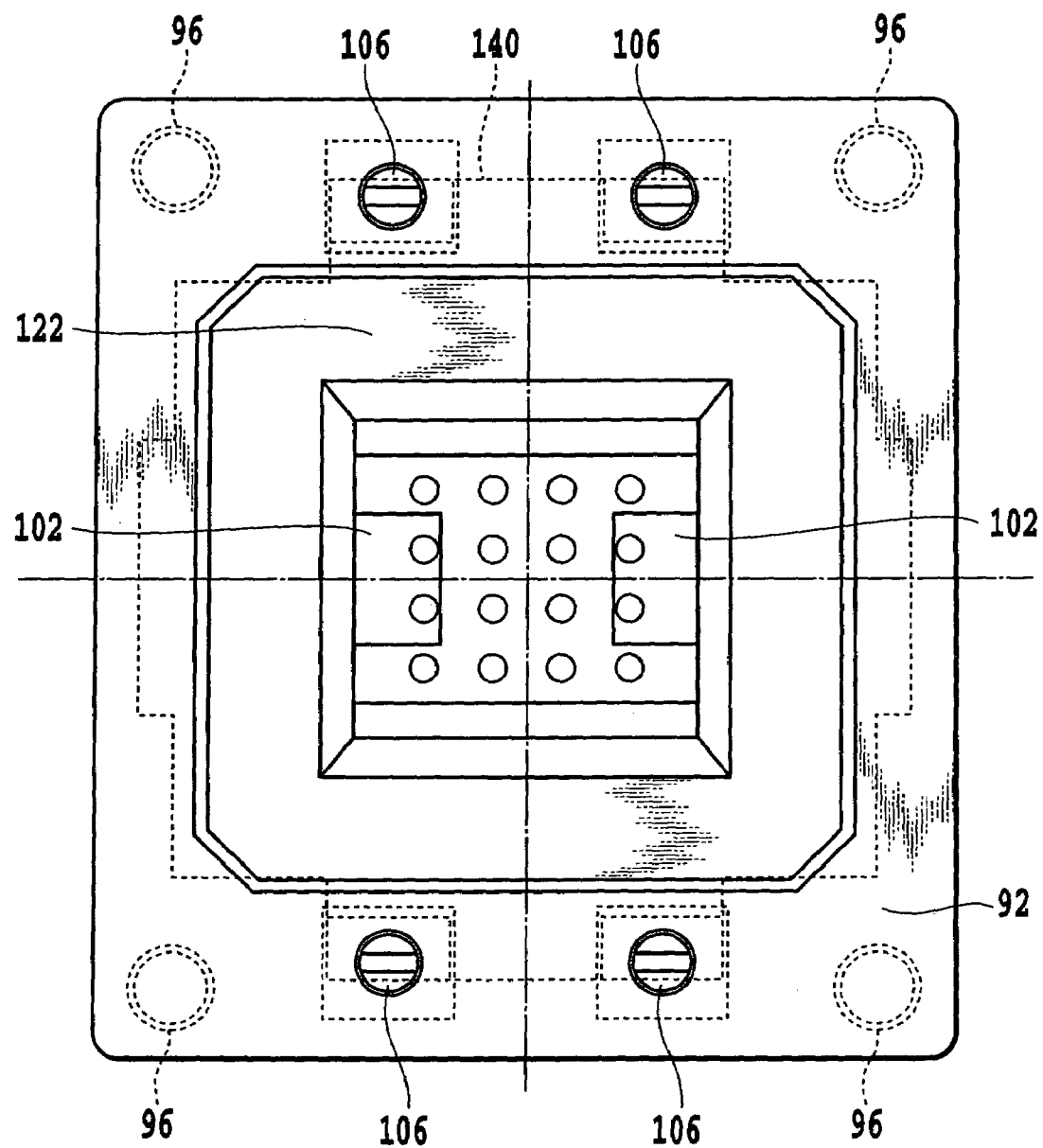
FIG. 35 is a plan view of the example shown in FIG. 34.

Further, timing adjusting mechanisms for adjusting the timing of upward and downward movements of the slider 140 are provided in four locations, the mechanisms being provided in recesses 92j on an inner surface at the periphery of the cover member 92 facing ends of the slider 140, as shown in FIGS. 34 and 35.

Each of the timing adjusting mechanisms comprises a pressing piece 132 for pressing an upper end of the slider 140, a fixing pin 106 for supporting the pressing piece 132 in the recess 92j of the cover member 92, and a coil spring 108 which is wound around a shaft portion of the fixing pin 106 and which urges the pressing piece 132 toward the upper end of the slider 140.

As shown in FIG. 34, an end of each pressing piece 132 protrudes downward from an inner surface of the cover member 92. For example, the end has a flat surface which is in parallel with the inner surface of the cover member 92. A female thread is formed to a predetermined depth at the base end of the pressing piece 132, a male thread on the fixing pin 106 being screwed in the female thread. The pressing pieces 132 are movably disposed in the recesses 92j.

A shaft portion of a fixing pin 106 is fitted in a hole 92h formed in the recess 92g. A head portion of the fixing pin 106 is engaged with a circumferential edge at an open end of the hole 92h. As a result, the pressing piece 132 is movably mounted in the recess 92j of the cover member 92 with the intervention of the fixing pin 106.

The spring constant of the coil spring 108 is set at a value such that the pressing piece 132 is not pushed upward by the upper end of the slider 140 immediately after the cover member 92 is moved upward.

Figure 36:
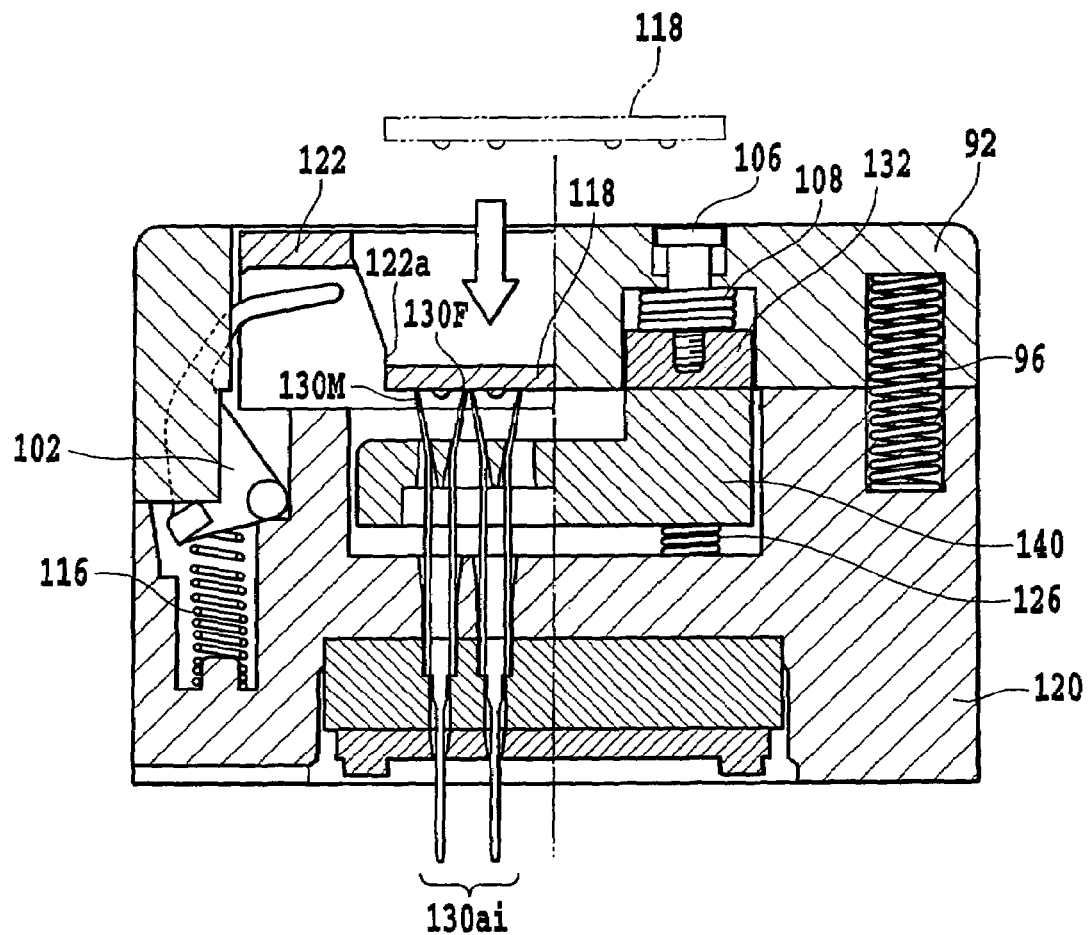
FIG. 36 is a sectional view for explaining the operation of the example shown in FIG. 34.

When a semiconductor device 118 is tested in such a configuration, as shown in FIG. 36, the end of an arm of a working robot which is omitted in the illustration is first touched on an upper surface of the cover member 92 and is urged downward against the urging force of the coil springs 96. As a result, a lower end of the cover member 92 urges the protruding pieces 102t, and the presser members 102 move away from each other to be in an open state. The upper end of the slider 140 is urged by the four pressing pieces 132 to be moved downward against the urging force of the return spring 126. Therefore, as shown in FIG. 36, the movable contact portions 130M of the contact terminals 130ai move away from the movable contact portions 130F with a maximum amount of opening as the movable contact pressing portion 140P moves downward.

For example, the semiconductor device 118 as a material to be inspected is absorbed and held by a transport arm of a transport robot which is omitted in the illustration and transported to a position directly above the opening 92a of the cover member 92 and the positioning member 122.

Next, as shown in FIG. 36, the semiconductor device 118 absorbed and held by the transport arm is moved down to be positioned and mounted in the housing portion 122a.

Subsequently, when the end of the working robot is moved upward in touch on the upper surface of the cover member 92, the cover member 92 is moved upward by the urging force of the coil springs 96 from the lowermost position thereof shown in FIG. 36 toward the uppermost position thereof shown in FIG. 34.

As a result, immediately after the cover member 92 begins to move upward, the touching portions 102P of the presser members 102 are rotated by the urging force of the coil springs 116 at substantially the same timing in the respective directions of approaching each other to urge the semiconductor device 118 toward the contact terminals 130ai.

Figure 37:
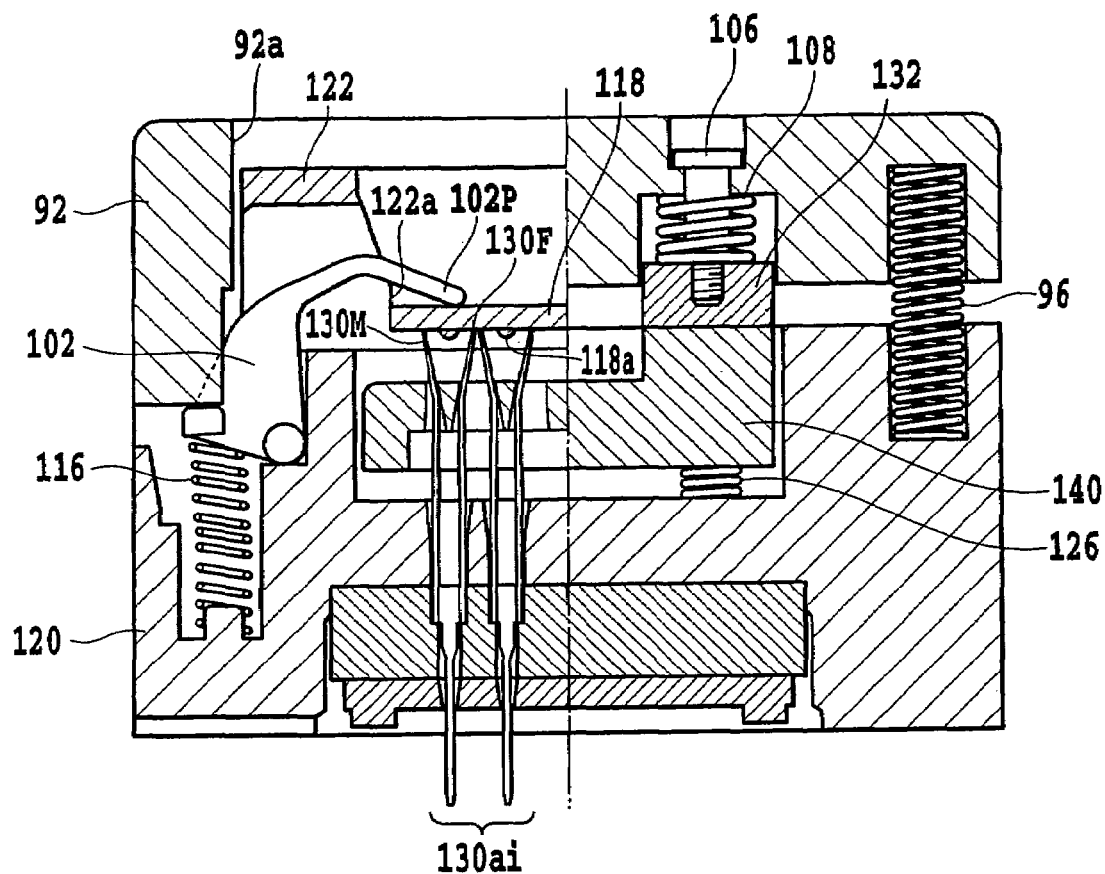
FIG. 37 is a sectional view for explaining the operation of the example shown in FIG. 34.

At this time, as shown in FIG. 37, since the upper end of the slider 140 touches on flat surfaces of the pressing pieces 132, the amount of opening between the movable contact portions 130M and the movable contact portions 130F of the contact terminals 130ai is maintained at the maximum amount of opening mentioned above. Therefore, since the touching portions 102P of the presser members 102 reliably touch on the semiconductor device 118 before the amount of opening between the movable contact portions 130M and the movable contact portions 130F becomes small, a jump of the semiconductor device 118 is avoided.

Figure 38:
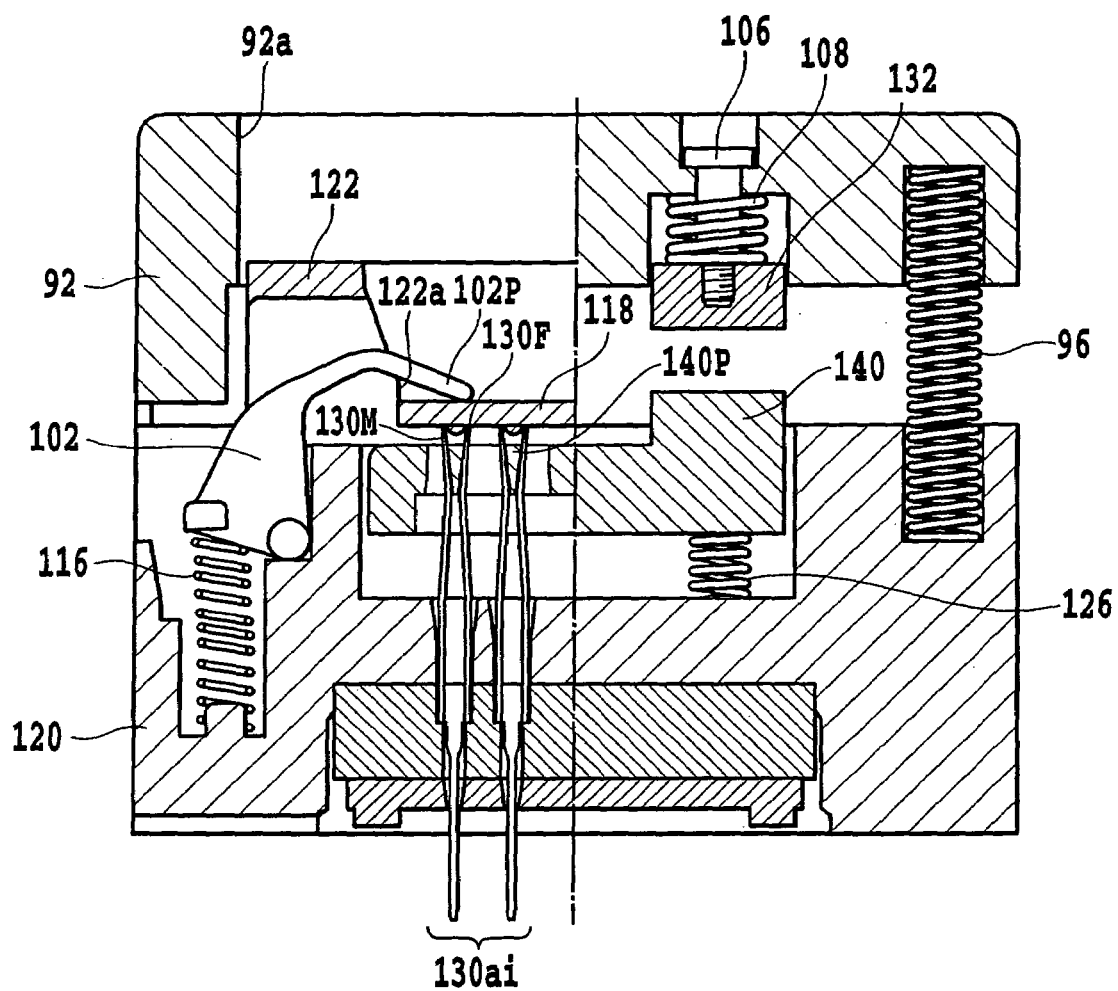
FIG. 38 is a sectional view for explaining the operation of the example shown in FIG. 34.

Subsequently, the cover member 92 is further moved upward as shown in FIG. 38, whereby each pressing piece 132 is moved away from the slider 140, and the slider 140 and the movable contact pressing portions 140P are moved upward by the urging force of the coil springs 126 to allow the electrode portions 118a of the semiconductor device 118 to be pinched between the movable contact portions 130M and the movable contact portions 130F.

Figure 39:
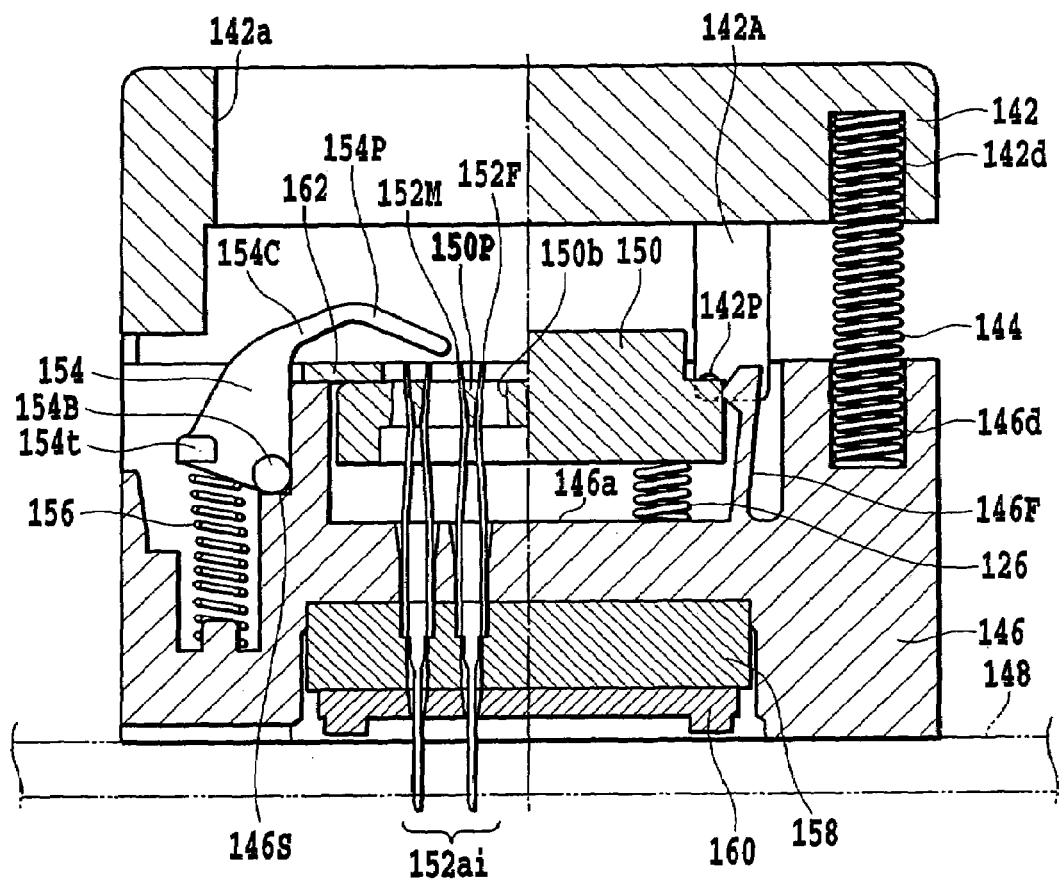
FIG. 39 is a sectional view schematically showing a configuration of a fourth embodiment of a socket for a semiconductor device according to the present invention.

FIG. 39 schematically shows a fourth embodiment of a socket for a semiconductor device according to the invention.

As shown in FIG. 39, the socket for a semiconductor device comprises a socket main body 146 which is disposed on a printed wiring board 148 and which houses contact terminals 152ai (i=1 to n where n represents a positive integer) for electrically connecting a BGA type semiconductor device 164 to the printed wiring board 148; a positioning member 162 which is disposed in a position inside the socket main body 146 above the contact terminals 152ai and which has a mounting portion for mounting the semiconductor device 164; a slider 150 for bringing a pair of movable contacts 152M and 152F of the contact terminals 152 close to each other or moving them away from each other; a latch mechanism which is disposed around the positioning member 162 and which has a pair of presser members 154 for selectively holding the semiconductor device 164 relative to the mounting portion of the positioning member 162; and a cover member 142 which transmits an operating force applied thereto to the presser members 154 through a transmission mechanism to be described later.

An opening is formed in the mounting portion of the positioning member 162, and electrode portions located on the four corners of the semiconductor 164 engage circumferential edges at the respective corners of the opening to position the semiconductor device 164.

Figure 49:
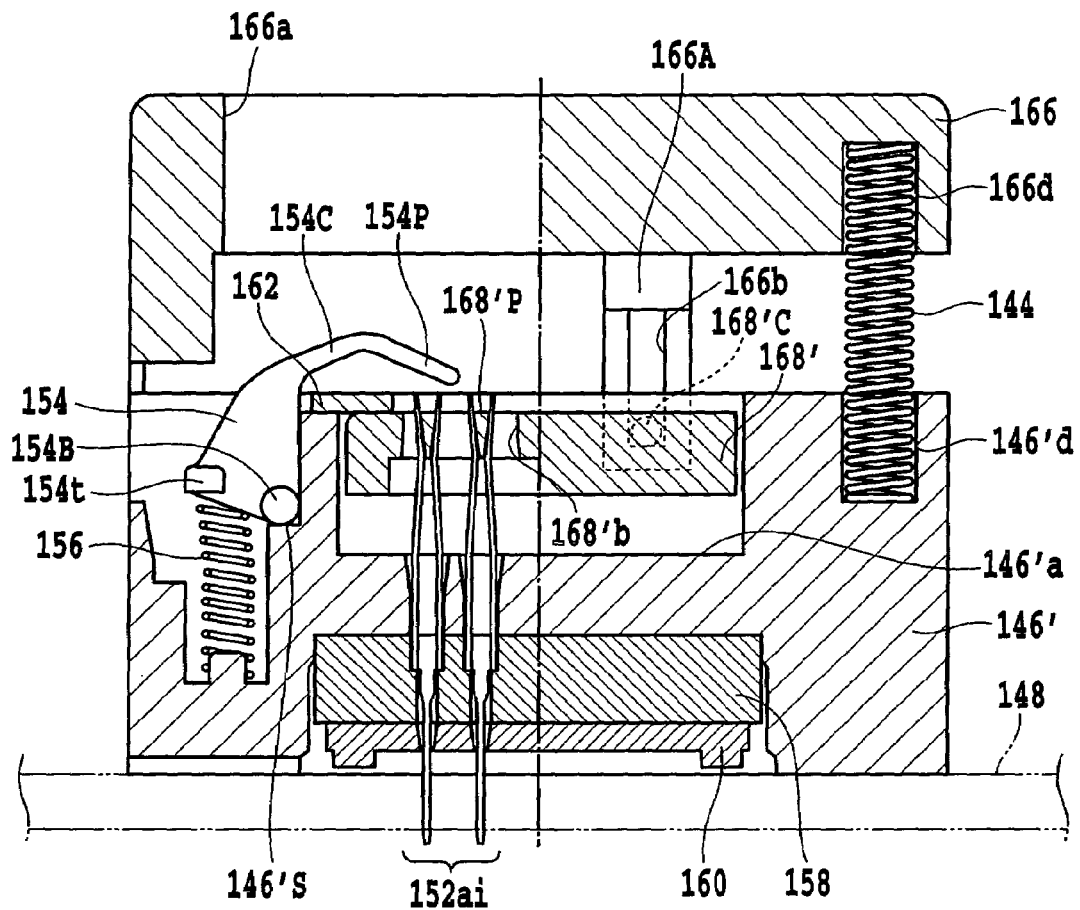
FIG. 49 is a sectional view schematically showing a configuration of a sixth embodiment of a socket for a semiconductor device according to the present invention.

As shown in FIGS. 39 and 49, the pair of presser members 154 of the latch mechanism are disposed on both ends of the slider 150, respectively, so as to face each other with the housing portion 146a interposed between the. The presser member 154 comprises a proximal end portion 154B which is rotatably supported by at a step portion 146s of the socket main body 146, an touching portion 154P which selectively touches on or moves away from an outer circumferential part of the semiconductor device 118, and a connecting portion 154C which connects the proximal end portion 154B and the touching portion 154P.

As show in FIG. 41, thee proximal end portion 154B is formed with a protruding piece 154t which is engaged by a lower end of the cover member 142 when the cover member 142 to be described later is in its lowermost position. A coil spring 156 for urging the touching portion 154P of the presser member 154 in the direction of approaching the contact terminals 152ai is provided between the proximal end portion 154B and a bottom wall of a recess formed in a peripheral part of the housing portion 146a. A step portion 146s for rotatably supporting the proximal end portion 154B is formed in the peripheral part of the housing portion 146a adjacent to the recess.

Figure 41:
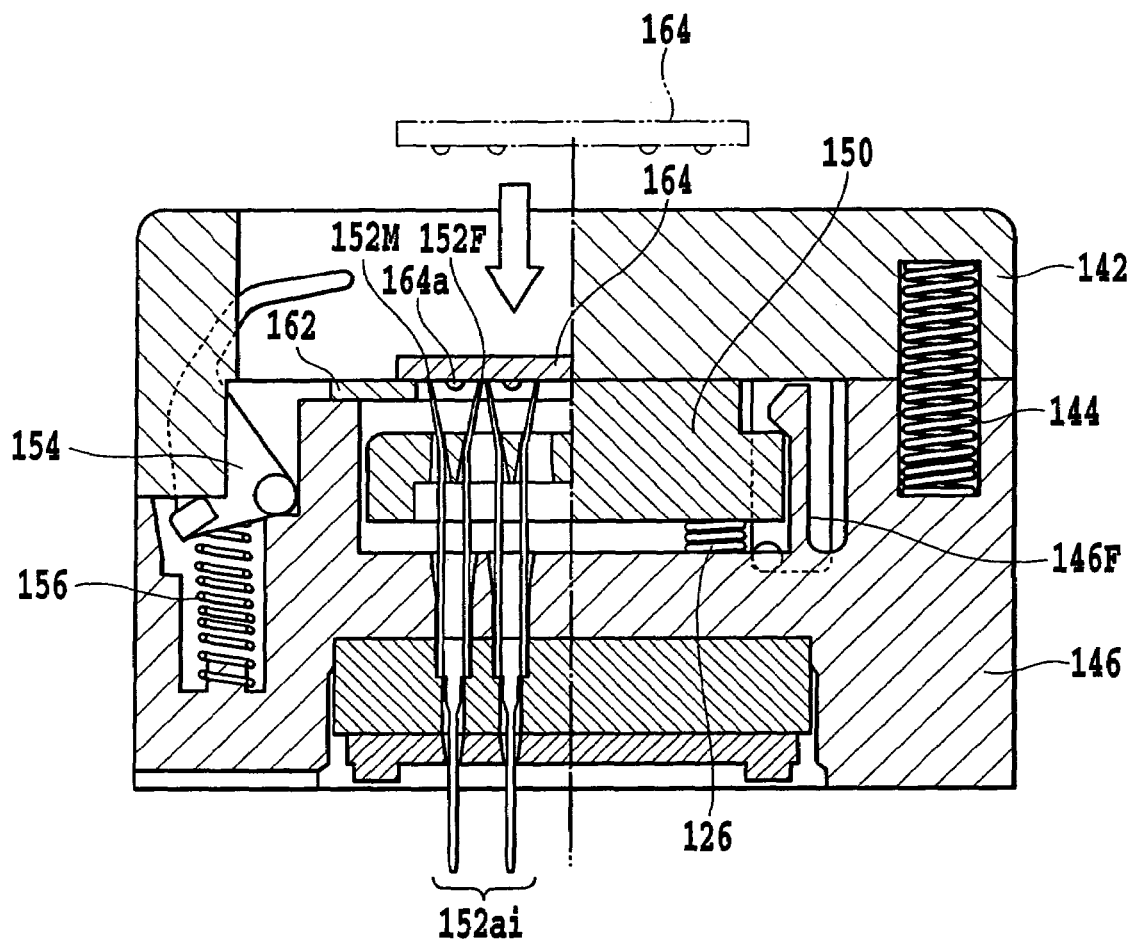
FIG. 41 is a sectional view for explaining the operation of the example shown in FIG. 39.
Figure 42:
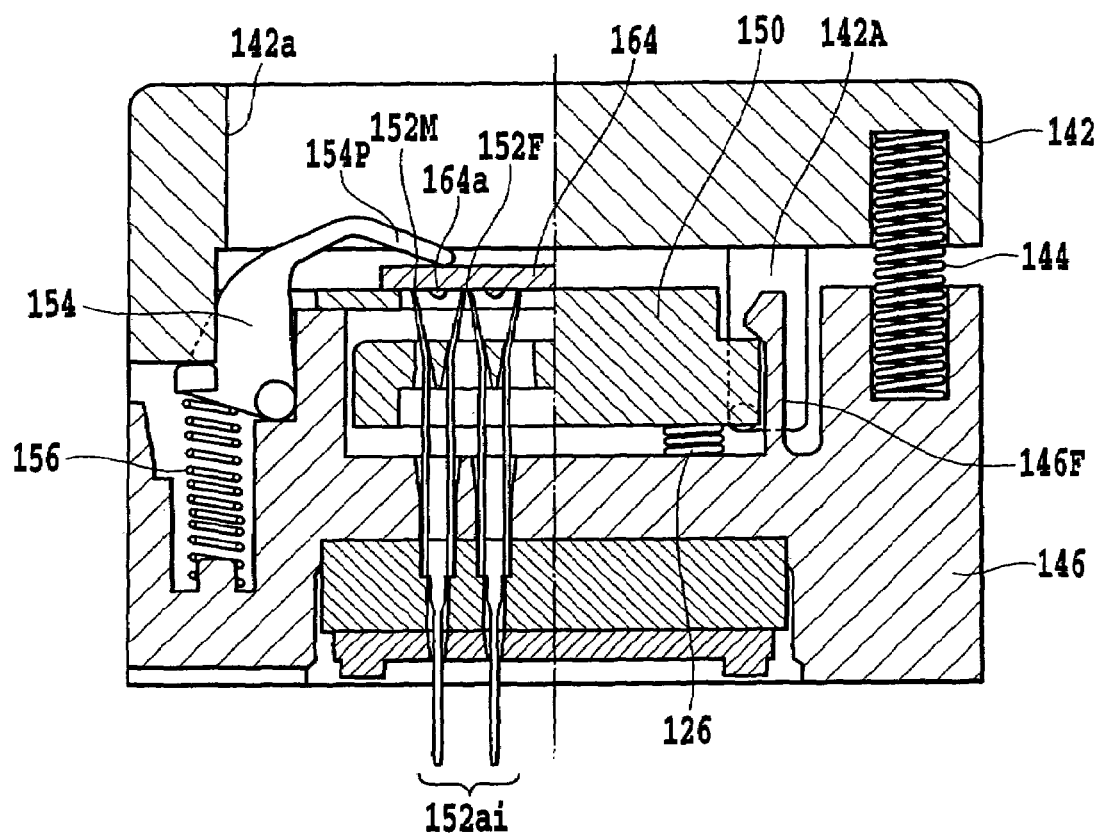
FIG. 42 is a sectional view for explaining the operation of the example shown in FIG. 39.

When the semiconductor device 118 is mounted on the mounting portion of the positioning member 162, as shown in FIG. 41, the touching portions 154P of the presser members 154 assume a standby position spaced away from the mounting portion to avoid interference with the semiconductor device 164. After the semiconductor device 164 is mounted on the mounting portion, the touching portions 154P of the presser members 154 assume a holding position to depress and hold the semiconductor device 164, as shown in FIG. 42.

Each contact terminal 152ai comprises a terminal 152B on the base end side which is provided on the socket main body 146 in association with each electrode portion 164a of the semiconductor device 164 to be mounted and a pair of movable contact portions 152F and 152M which are coupled with the terminal 152B and which selectively pinch each electrode portion 164a of the semiconductor device 164. In accordance with a movement of the slider 150, the pair of movable contact portions 152F and 152M approach each other to pinch each electrode portion 164a of the semiconductor device 164 or move away from each other to release each electrode portion 164a of the semiconductor device 164.

The terminal 152B is inserted into a through hole on the bottom wall of the housing portion 146a on which the slider 150 is slid, and it is supported by a contact support member 158 and an aligning plate 160 which are disposed in a part of the socket main body 146 under the housing portion 146a.

The slider 150 is supported on a sidewall of the housing portion 146a of the socket main body 146 such that it can slide in a direction substantially orthogonal to the moving directions of the movable contact portions 152M and 152F of the contact terminals 152ai.

The slider 150 has openings 150b therein provided in the longitudinal and transverse directions thereof, the movable contact portions 152M and 152F of each contact terminal 152ai protruding through the openings. Openings 150b in different rows are partitioned from each other by partition walls. The partition walls are formed in a direction substantially perpendicular to the plane of the drawing at predetermined intervals in association with each contact terminal 152ai.

Figure 40:
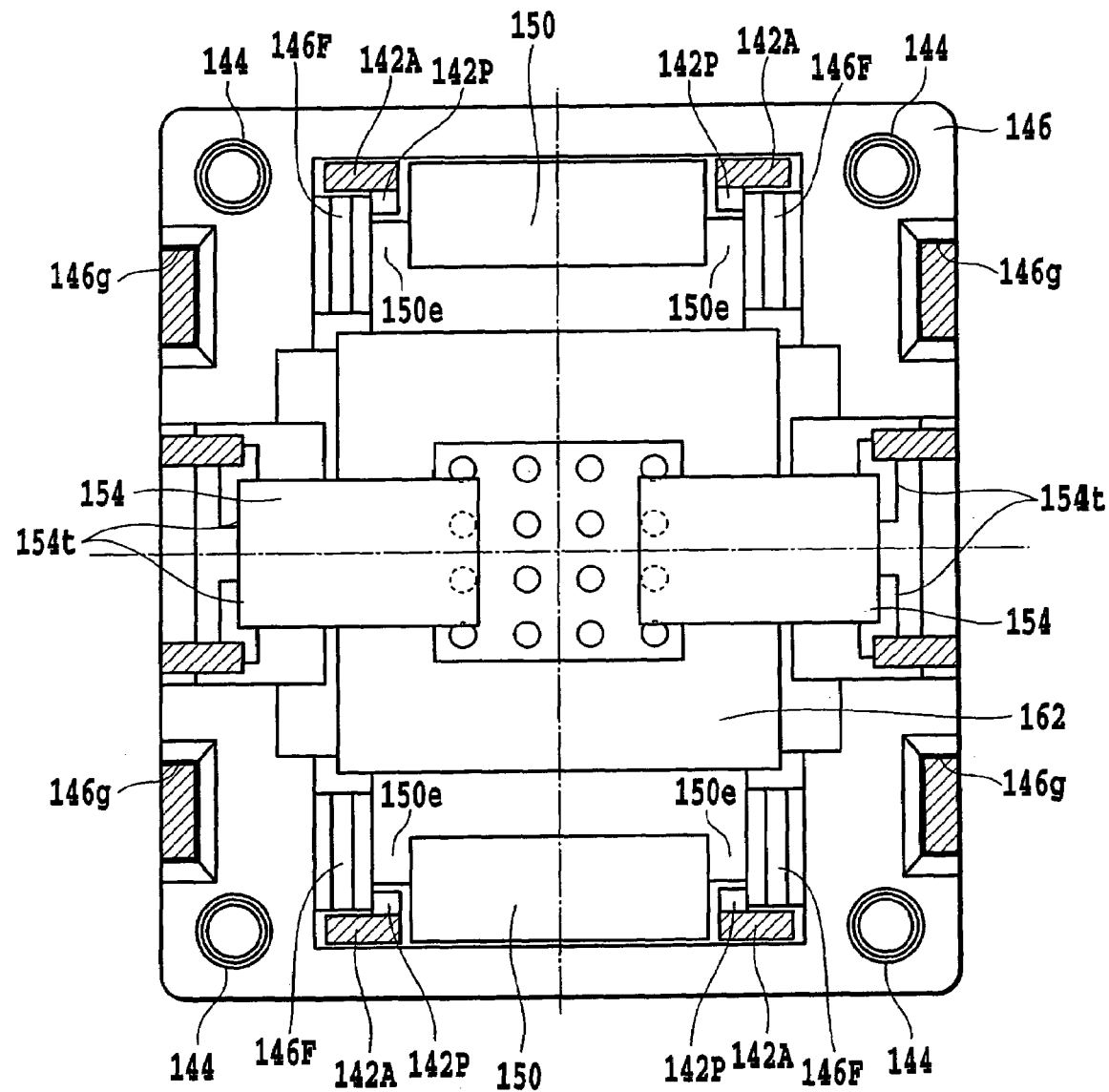
FIG. 40 is a plan view of the example shown in FIG. 39.

A movable contact pressing portion 150P is provided on the slider 150 between each pair of the openings 150b in each row, the pressing portion being formed to serve as a partition between the openings 150b and to serve as a partition between the movable contact portion 152M and the movable contact portion 152F. The movable contact pressing portion 150P has a sectional shape substantially in the form of an isosceles triangle. As shown in FIG. 40, engaging edge portions 150e which are engaged with hook portions 146F to be described later are formed in four locations at edges of the slider 150.

As shown in FIGS. 39 and 40, hook members 146F in the form of hooks are formed integrally with the housing portion 146a in four locations adjacent to the edges of the slider 150. One end of a hook member 146F is integral with the bottom wall of the housing portion 146a, and another end of the hook member 146F, which can be elastically displaced, is extended substantially perpendicularly to the bottom wall to engage an engaging edge portion 150e of the slider 150 selectively, as shown in FIG. 41. The slider 150 is thus held in its lowermost position by the hook members 146F.

Referring to FIG. 39, a return spring 126 for urging the slider 150 in the direction of moving away from the bottom of the housing portion 146a is provided between a bottom surface of the slider 150 and the bottom of the housing portion 146a of the socket main body 146.

The cover member 142 having the opening 142a is supported such that it can move up and down relative to the socket main body 146 with nails in four locations of the member guided by grooves 146g formed in a peripheral part of the socket main body 146. As shown in FIG. 39, coil springs 144 are disposed at four corners between the cover member 142 and the socket main body 146 to urge the cover member 142 in the direction of moving away from the socket main body 146. One end of a coil spring 144 is disposed in a recess 142d on the cover member 142, and another end of the coil spring 144 is disposed in a recess 146d on the socket main body 146.

As shown in FIGS. 39 and 40, arms 142A having a release pin 142P protrude into spaces surrounded by edges of the slider 150 and side surfaces of the hook members 146F of the socket main body 146 at the periphery of the cover member 142. One end of an arm 142A is secured to the cover member 142 in association with each corner of the housing portion 146a. When the cover member 142 is in its uppermost position, the release pins 142P provided on the other ends of the arms 142A touch on the ends of the hook members 146F to keep the hook members 146F disengaged with the engaging edge portions 150e, as shown in FIG. 39.

On the contrary, when the cover member 142 is in its lowermost position as shown in FIG. 41, the release pins 142P of the arms 142A are moved down close to the bottom of the housing portion 146a, and the hook members 146F are thereby engaged with the engaging edge portions 150e of the slider 150.

Therefore, a timing adjusting mechanism is formed by the hook members 146F and the release pins 142P provided on the other ends of the arms 142A.

When a semiconductor device 164 is tested in such a configuration, as shown in FIG. 41, the end of an arm of a working robot which is omitted in the illustration is first touched on an upper surface of the cover member 142 and is urged downward against the urging force of the coil springs 144. As a result, a lower end of the cover member 142 urges the protruding pieces 154t, and the presser members 154 move away from each other to be in an open state. An upper end of the slider 150 is urged by the cover member 142 to be moved downward against the urging force of the return spring 126. Therefore, as shown in FIG. 41, the movable contact portions 152M of the contact terminals 152ai move away from the movable contact portions 152F with a maximum amount of opening as the movable contact pressing portions 150P are moved downward.

For example, the semiconductor 164 as a material to be inspected is absorbed and held by a transport arm of a transport robot which is omitted in the illustration and transported to a position directly above the opening 142a of the cover member 142 and the positioning member 162.

Next, as shown in FIG. 41, the semiconductor device 164 absorbed and held by the transport arm is moved down to be positioned and mounted on the mounting portion of the positioning member 162.

Subsequently, when the end of the working robot is moved upward in touch on the upper surface of the cover member 142, the cover member 142 is moved upward by the urging force of the coil springs 144 from the lowermost position thereof shown in FIG. 41 to the uppermost position thereof shown in FIG. 39.

As a result, immediately after the cover member 142 begins to move upward, the touching portions 154P of the presser members 154 are rotated by the urging force of the coil springs 156 at substantially the same timing in the respective directions of approaching each other to press the semiconductor device 164 toward the contact terminals 152ai.

At this time, as shown in FIG. 42, since the engaging edge portions 150e of the slider 150 are engaged with the hook members 146F, the amount of opening between the movable contact portions 152M and the movable contact portions 152F of the contact terminals 152ai is maintained at the maximum amount of opening mentioned above. Therefore, since the touching portions 154P of the presser members 154 reliably touch on the semiconductor device 164 before the amount of opening between the movable contact portions 152M and the movable contact portions 152F becomes small, a jump of the semiconductor device 164 is avoided.

Figure 43:
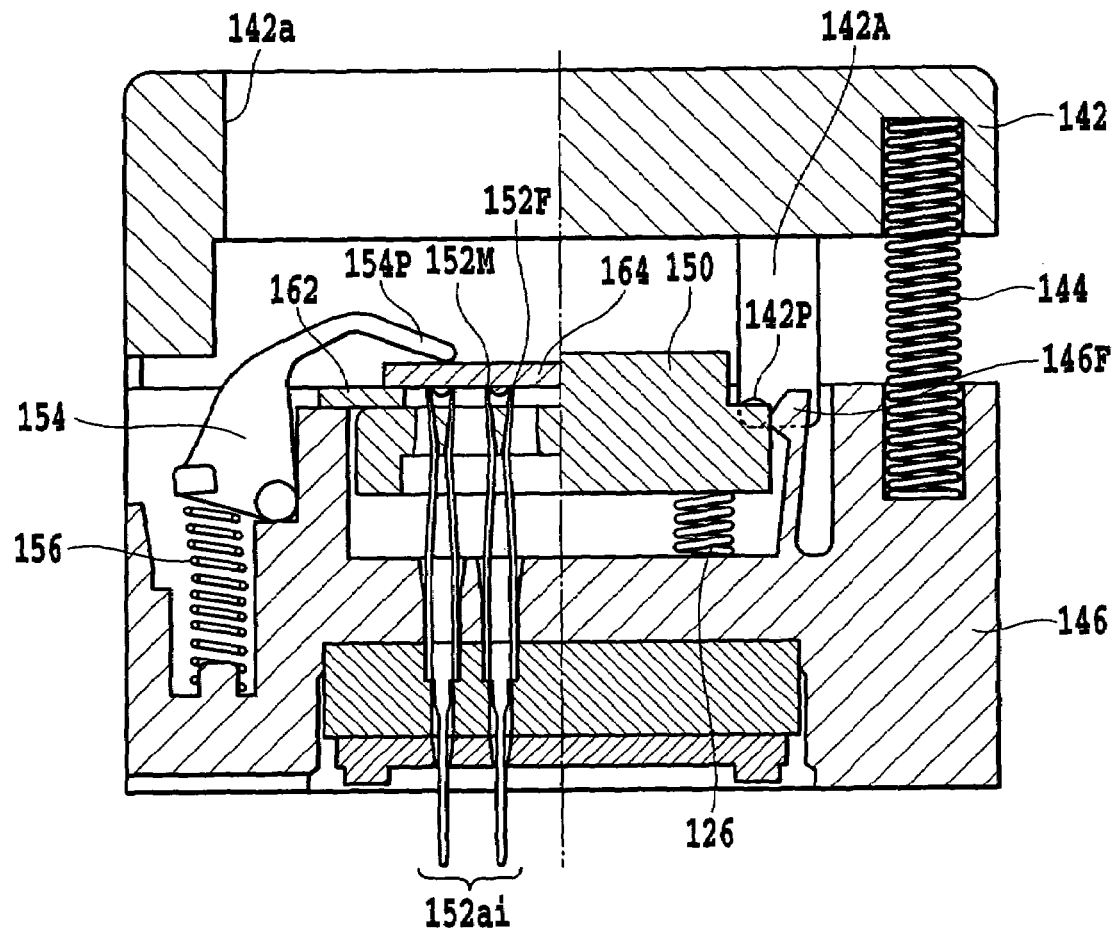
FIG. 43 is a sectional view for explaining the operation of the example shown in FIG. 39.

Subsequently, the cover member 142 is further moved upward as shown in FIG. 43, and each of the release pins 142P disengages the hook member 146F from the engaging edge portion 150e of the slider 150. Thus, the slider 150 and the movable contact pressing portions 150P are moved upward by the urging force of the coil springs 162 to allow the electrode portions 164a of the semiconductor device 164 to be pinched between the movable contact portions 152M and the movable contact portions 152F.

Figure 44:
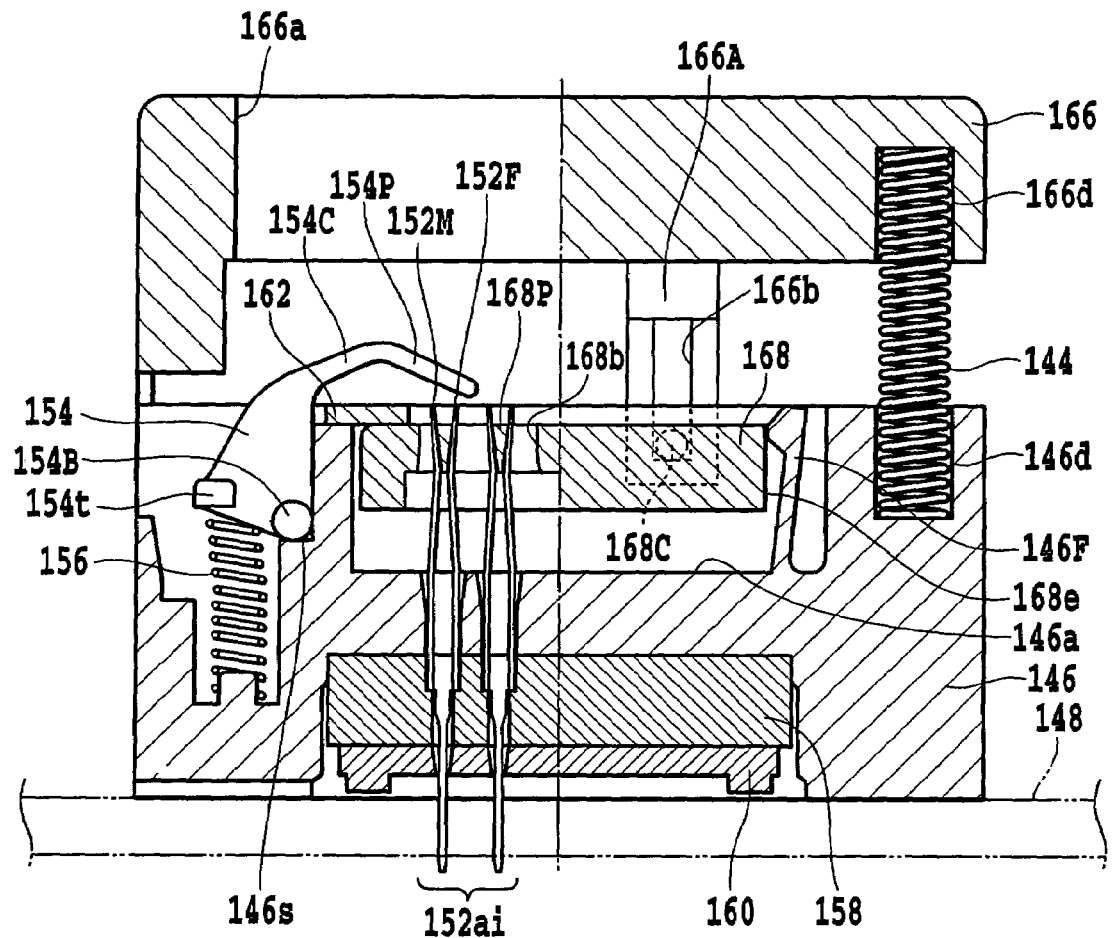
FIG. 44 is a sectional view schematically showing a configuration of a fifth embodiment of a socket for a semiconductor device according to the present invention.

FIG. 44 schematically shows a fifth embodiment of a socket for a semiconductor device according to the invention.

In the example shown in FIG. 39, the hook members 146F and the engaging edge portions 150e of the slider 150 are disengaged by displacing the hook members 146F with the release pins 142P if the arm portions 142A provided separately from the slider 150. As an alternative, in the example shown in FIG. 44, the hook members 146F and the engaging edge portions 168e of the slider 168 are disengaged by moving up arm portions 166A of a cover member 166 connected with a slider 168 to forcibly disengage the engaging edge portions 150e of the slider 150 from the hook members 146F against an elastic force of the same.

In FIG. 44, elements identical to those in the example shown in FIG. 39 are indicated by like reference numerals, and the description will omit them to avoid duplication.

As shown in FIG. 44, the socket for a semiconductor device comprises a socket main body 146 which is disposed on a printed wiring board 148 and which houses contact terminals 152ai (i=1 to n where n represents a positive integer) for electrically connecting a BGA type semiconductor device 164 to the printed wiring board 148; a positioning member 162 which is disposed in a position inside the socket main body 146 above the contact terminals 152ai and which has a mounting portion for mounting the semiconductor device 164; a slider 168 for bringing a pair of movable contacts 152M and 152F of the contact terminals 152ai close to each other or moving them away from each other; a latch mechanism which is disposed around the positioning member 162 and which has a pair of presser members 154 for selectively holding the semiconductor device 164 relative to the mounting portion of the positioning member 162; and a cover member 166 which transmits an operating force applied thereto to the presser members 154 through a transmission mechanism to be described later.

The slider 168 is supported on a sidewall of the housing portion 146a of the socket main body 146 such that it can slide in a direction substantially orthogonal to the moving directions of the movable contact portions 152M and 152F of the contact terminals 152ai.

The slider 168 has openings 168b therein provided in the longitudinal and transverse directions thereof, the movable contact portions 152M and 152F of each contact terminal 152ai protruding through the openings. Openings 168b in different rows are partitioned from each other by partition walls. The partition walls are formed in a direction substantially perpendicular to the plane of the drawing at predetermined intervals in association with each contact terminal 152ai.

Figure 45:
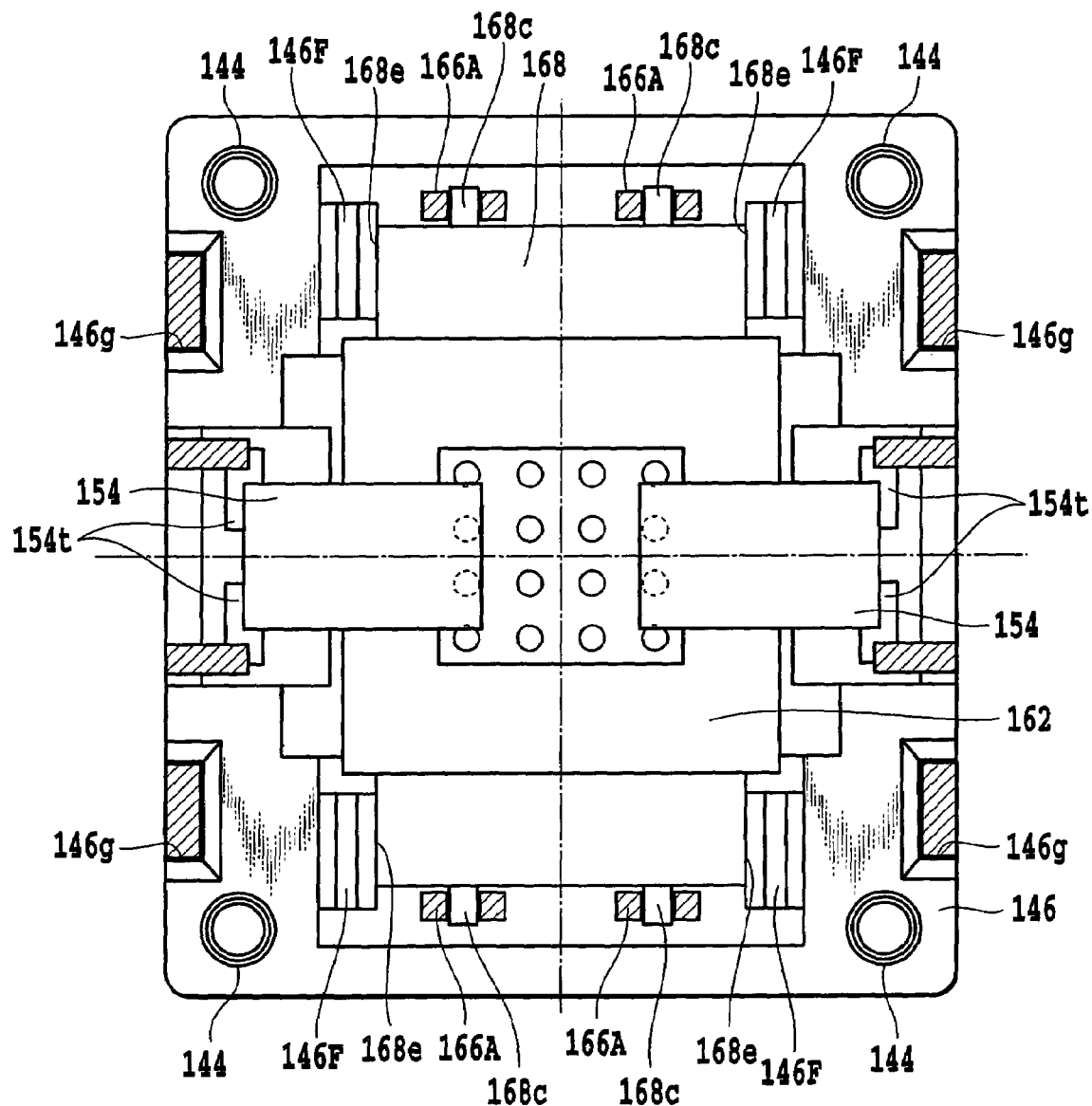
FIG. 45 is a plan view of the example shown in FIG. 44.

A movable contact pressing portion 168P is provided on the slider 168 between each pair of the openings 168b in each row, the pressing portion being formed to serve as a partition between the openings 168b and to serve as a partition between the movable contact portion 152M and the movable contact portion 152F. The movable contact pressing portion 168P has a sectional shape substantially in the form of an isosceles triangle. As shown in FIG. 45, engaging edge portions 168e which are engaged with hook portions 146F in the form of hooks to be described later are formed in four locations at edges of the slider 168.

The cover member 166 having the openings 166a is supported such that it can move up and down relative to the socket main body 146 with nails in four locations of the member guided by grooves 146g formed in a peripheral part of the socket main body 146. As shown in FIG. 44, coil springs 144 are disposed at four corners between the cover member 166 and the socket main body 146 to urge the cover member 166 in the direction of moving away from the socket main body 146. One end of a coil spring 144 is disposed in a recess 166d on the cover member 166, and another end of the coil spring 144 is disposed in a recess 146d on the socket main body 146.

As shown in FIGS. 44 and 45, four arm portions 166A having a narrow slit 166b protrude between edges of the slider 168 and an inner circumferential surface of the housing portion 146a of the socket main body 146 at the periphery of the cover member 166. One end of each arm portion 166A is secured to the cover member 166. Connection pin 168C provided at predetermined intervals along the edges of the slider 168 are movably inserted in the slits 166b of the arm portions 166A.

When the cover member 166 is in its uppermost position, as shown in FIG. 44, the connection pins 168C touch on the circumferential edges of the arm portions 166A on one side of the slits 166b to disengage the hook members 146F from the engaging edge portions 150e of the slider 150.

Figure 46:
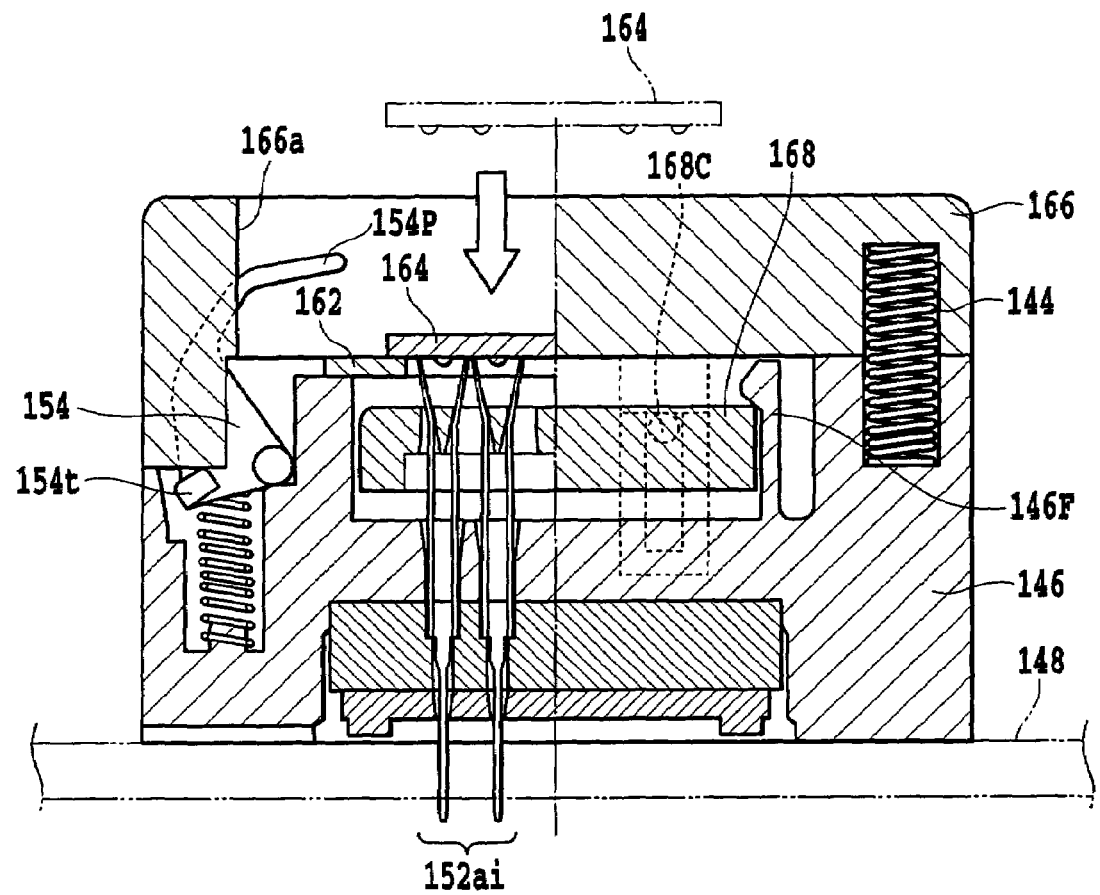
FIG. 46 is a sectional view for explaining the operation of the example shown in FIG. 44.

On the contrary, when the cover member 166 is in its lowermost position as shown in FIG. 46, the lower ends of the arm portions 166A are moved down close to the bottom of the housing portion 146a. As a result, the connection pins 168C touch on the circumferential edges of the arm portions 166A on the other side of the slits 166b to urge the engaging edge portions 168e of the slider 168 downward, whereby the hook members 146F engages the engaging edge portions 168e of the slider 168.

When a semiconductor device 164 is tested in such a configuration, as shown in FIG. 44, the end of an arm of a working robot which is omitted in the illustration is first touched on an upper surface of the cover member 166 and is pressed downward against the urging force of the coil springs 144. As a result, a lower end of the cover member 166 urges the protruding pieces 154t, and the presser members 154 move away from each other to be in an open state. The slider 150 is pressed downward because the connection pins 168C touch on the circumferential edges of the arm portions 166A of the cover member 166 on the other side of the slits 166b. Therefore, as shown in FIG. 46, the movable contact portions 152M of the contact terminals 152ai move away from the movable contact portions 152F with a maximum amount of opening as the movable contact pressing portions 150P are moved downward.

For example, the semiconductor device 164 as a material to be inspected is absorbed and held by a transport arm of a transport robot which is omitted in the illustration and transported to a position directly above the openings 166a of the cover member 166 and the positioning member 162.

Next, as shown in FIG. 46, the semiconductor device 164 absorbed and held by the transport arm is moved down to be positioned and mounted on the mounting portion of the positioning member 162.

Subsequently, when the end of the working robot is moved upward in touch on the upper surface of the cover member 166, the cover member 166 is moved upward by the urging force of the coil springs 144 from the lowermost position thereof shown in FIG. 46 to the uppermost position thereof shown in FIG. 44.

As a result, immediately after the cover member 166 begins to move upward, the touching portions 154P of the presser members 154 are rotated by the urging force of the coil springs 156 at substantially the same timing in the respective directions of approaching each other to press the semiconductor device 164 toward the contact terminals 152ai.

Figure 47:
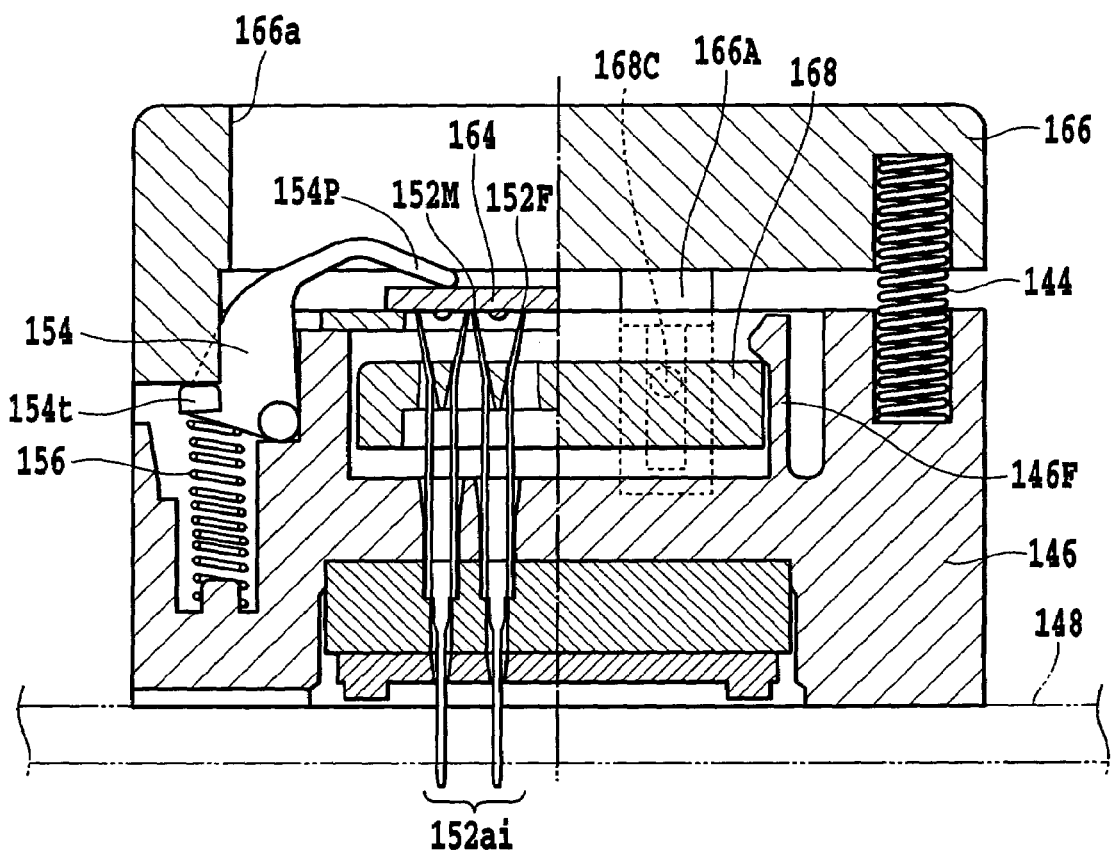
FIG. 47 is a sectional view for explaining the operation of the example shown in FIG. 44.

At this time, as shown in FIG. 47, since the engaging edge portions 168e of the slider 168 are engaged with the hook members 146F, the amount of opening between the movable contact portions 152M and the movable contact portions 152F of the contact terminals 152ai is maintained at the maximum amount of opening mentioned above. Therefore, since the touching portions 154P of the presser members 154 reliably touch on the semiconductor device 164 before the amount of opening between the movable contact portions 152M and the movable contact portions 152F becomes small, a jump of the semiconductor device 164 is avoided.

Figure 48:
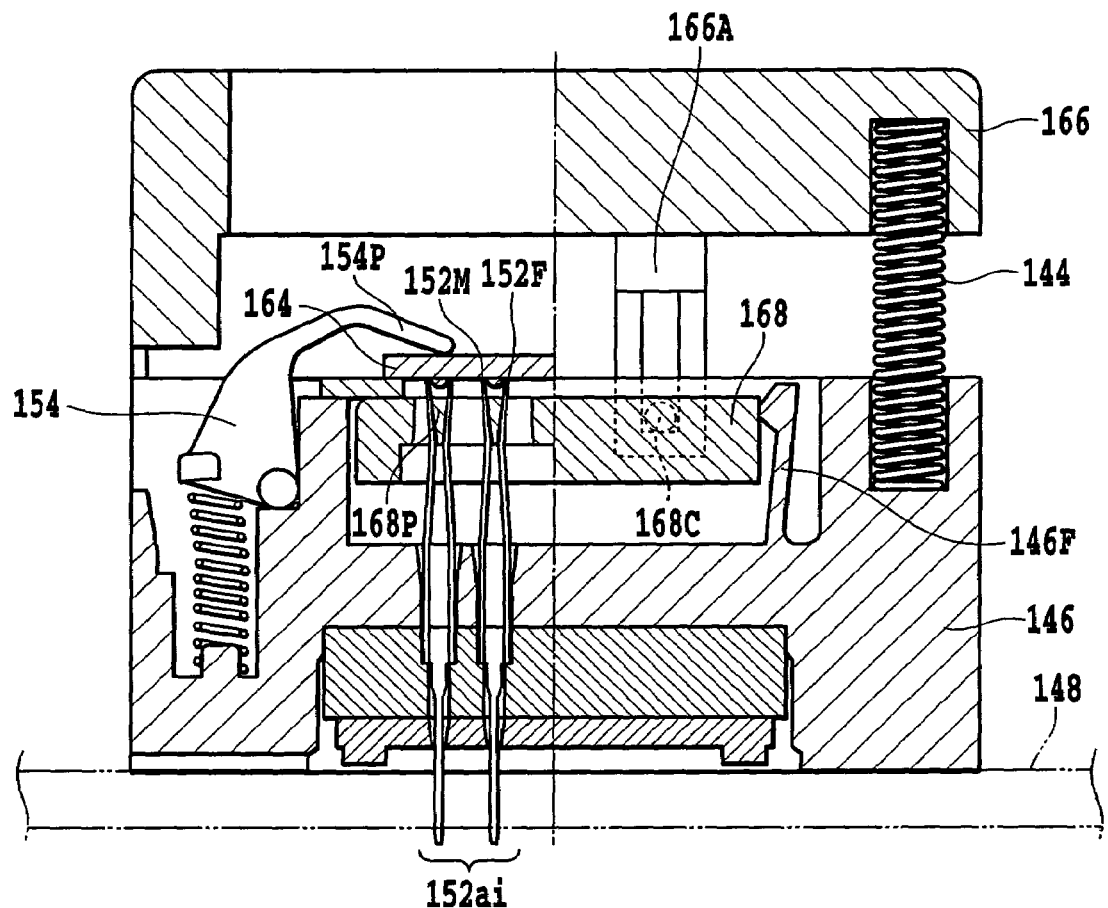
FIG. 48 is a sectional view for explaining the operation of the example shown in FIG. 44.

Subsequently, the cover member 166 is further moved upward as shown in FIG. 48, and each of the connection pins 168C touches on the circumferential edge on one side of the respective slit 166b to pull the slider 168 upward, whereby the hook members 146F are forcibly disengaged from the engaging edge portions 168e of the slider 168, and the electrode portions 164a of the semiconductor device 164 are pinched by the movable contact portions 152M and the movable contact portions 152F.

FIG. 49 schematically shows a sixth embodiment of a socket for a semiconductor device according to the invention.

The example shown in FIG. 44 employs a configuration in which the slider 168 is held in a predetermined position or released from the predetermined position according to upward and downward movements of the cover member 166 caused by the hook members 146F. As an alternative, the example shown in FIG. 49 employs a configuration in which a slider 168' is held in a predetermined position by the pressure applied by the movable contact portions 152M and 152F of the contact terminals 152ai to pinch flat surfaces of movable contact pressing portions 168'P without using the hook members 146F.

In FIG. 49, elements identical to those in the example shown in FIG. 44 are indicated by like reference numerals, and the description will omit them to avoid duplication.

As shown in FIG. 49, the socket for a semiconductor device comprises a socket main body 146' which is disposed on a printed wiring board 148 and which houses contact terminals 152ai (i=1 to n where n represents a positive integer) for electrically connecting a BGA type semiconductor device 164 to the printed wiring board 148; a positioning member 162 which is disposed in a position inside the socket main body 146' above the contact terminals 152ai and which has a mounting portion for mounting the semiconductor device 164; a slider 168' for bringing a pair of movable contacts 152M and 152F of the contact terminals 152ai close to each other or moving them away from each other; a latch mechanism which is disposed around the positioning member 162 and which has a pair of presser members 154 for selectively holding the semiconductor device 164 relative to the mounting portion of the positioning member 162; and a cover member 166 which transmits an operating force applied thereto to the presser members 154 through a transmission mechanism to be described later.

The slider 168' is supported on a sidewall of a housing portion 146'a of the socket main body 146 such that it can slide in a direction substantially orthogonal to the moving directions of the movable contact portions 152M and 152F of the contact terminals 152ai.

The slider 168' has openings 168'b therein provided in the longitudinal and transverse directions thereof, the movable contact portions 152M and 152F of each contact terminal 152ai protruding through the openings. Openings 168'b in different rows are partitioned from each other by partition walls. The partition walls are formed in a direction substantially perpendicular to the plane of the drawing at predetermined intervals in association with each contact terminal 152ai.

A movable contact pressing portion 168'P is provided on the slider 168 between each pair of the openings 168'b in each row, the pressing portion being formed to serve as a partition between the openings 168'b and to serve as a partition between the movable contact portion 152M and the movable contact portion 152F.

The movable contact pressing portion 168'P has flat surfaces FS which are substantially in parallel with each other and which are pinched by the movable contact portion 152M and the movable contact portion 152F. The movable contact pressing portion 168'P has a sectional shape substantially in the form of an isosceles triangle at the lower end thereof such that the portion is downwardly tapered below the flat surfaces FS.

When a semiconductor device 164 is tested in such a configuration, as shown in FIG. 49, the end of an arm of a working robot which is omitted in the illustration is first touched on an upper surface of the cover member 166 and is pressed downward against the urging force of the coil springs 144. As a result, a lower end of the cover member 166 urges the protruding pieces 154t, whereby the presser members 154 whose proximal end portions 154B are supported on a stepped portion 146'S move away from each other to be in an open state. The slider 168' is urged downward because connection pins 168'C touch on the circumferential edges of the arm portions 166A of the cover member 166 on the other side of the slits 166b. Therefore, as shown in FIG. 50, the movable contact portions 152M of the contact terminals 152ai move away from the movable contact portions 152F with a maximum amount of opening as the movable contact pressing portions 168'P are moved downward.

For example, the semiconductor device 164 as a material to be inspected is absorbed and held by a transport arm of a transport robot which is omitted in the illustration and transported to a position directly above the openings 166a of the cover member 166 and the positioning member 162.

Figure 50:
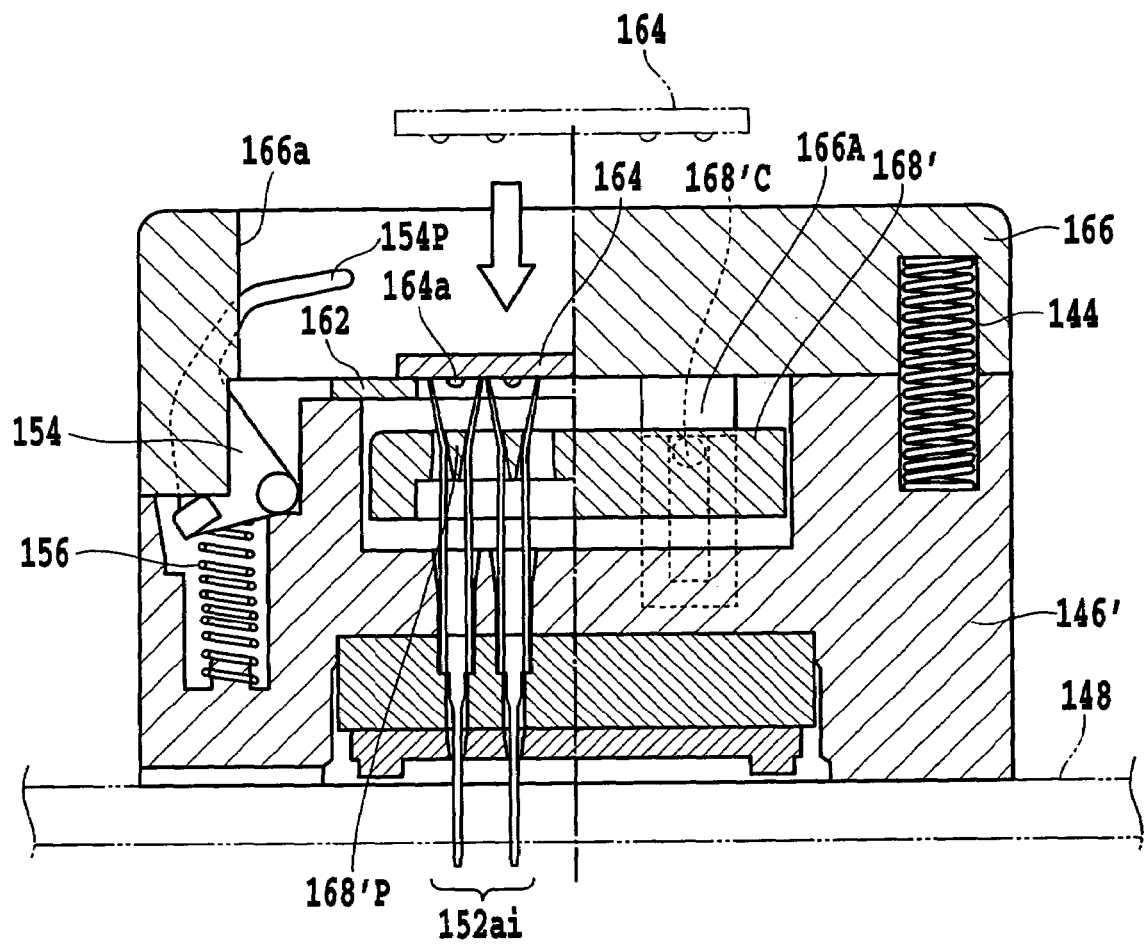
FIG. 50 is a sectional view for explaining the operation of the example shown in FIG. 49.

Next, as shown in FIG. 50, the semiconductor device 164 absorbed and held by the transport arm is moved down to be positioned and mounted on the mounting portion of the positioning member 162.

Subsequently, when the end of the working robot is moved upward in touch on the upper surface of the cover member 166, the cover member 166 is moved upward from the lowermost position thereof shown in FIG. 50 to the uppermost position thereof shown in FIG. 49 by the urging force of the coil springs 144 which are supported in recesses 146'd of the socket main body 146' at one end thereof.

As a result, immediately after the cover member 166 begins to move upward, the touching portions 154P of the presser members 154 are rotated by the urging force of the coil springs 156 at substantially the same timing in the respective directions of approaching each other to press the semiconductor device 164 toward the contact terminals 152ai.

Figure 51:
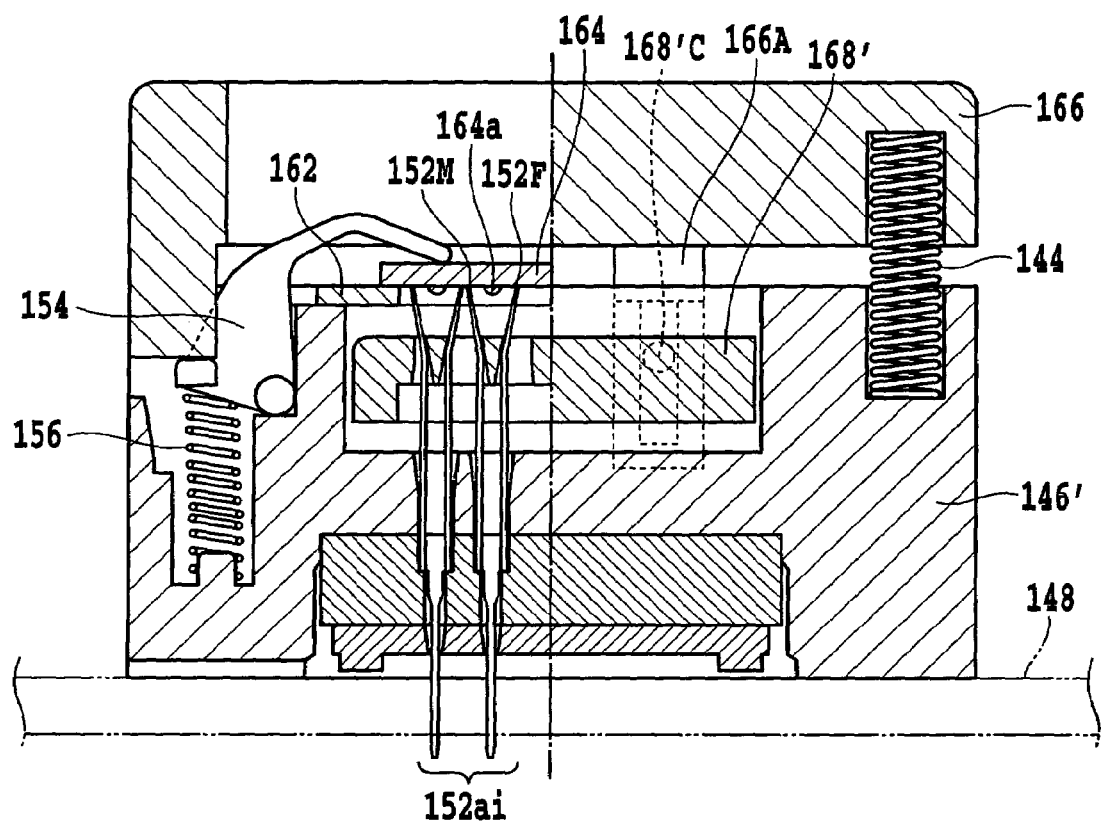
FIG. 51 is a sectional view for explaining the operation of the example shown in FIG. 49.

At this time, as shown in FIG. 51, the flat surfaces FS of the movable contact pressing portions 168'P of the slider 168' are pinched at a predetermined pressure by the movable contact portions 152M and the movable contact portions 152F of the contact terminals 152ai. As a result, the slider 168' is held by the frictional force, and the amount of opening between the movable contact portions 152M and the movable contact portions 152F of the contact terminals 152ai is maintained at the maximum amount of opening mentioned above. Therefore, since the touching portions 154P of the presser members 154 reliably touch on the semiconductor device 164 before the amount of opening between the movable contact portions 152M and the movable contact portions 152F becomes small, a jump of the semiconductor device 164 is avoided.

Figure 52:
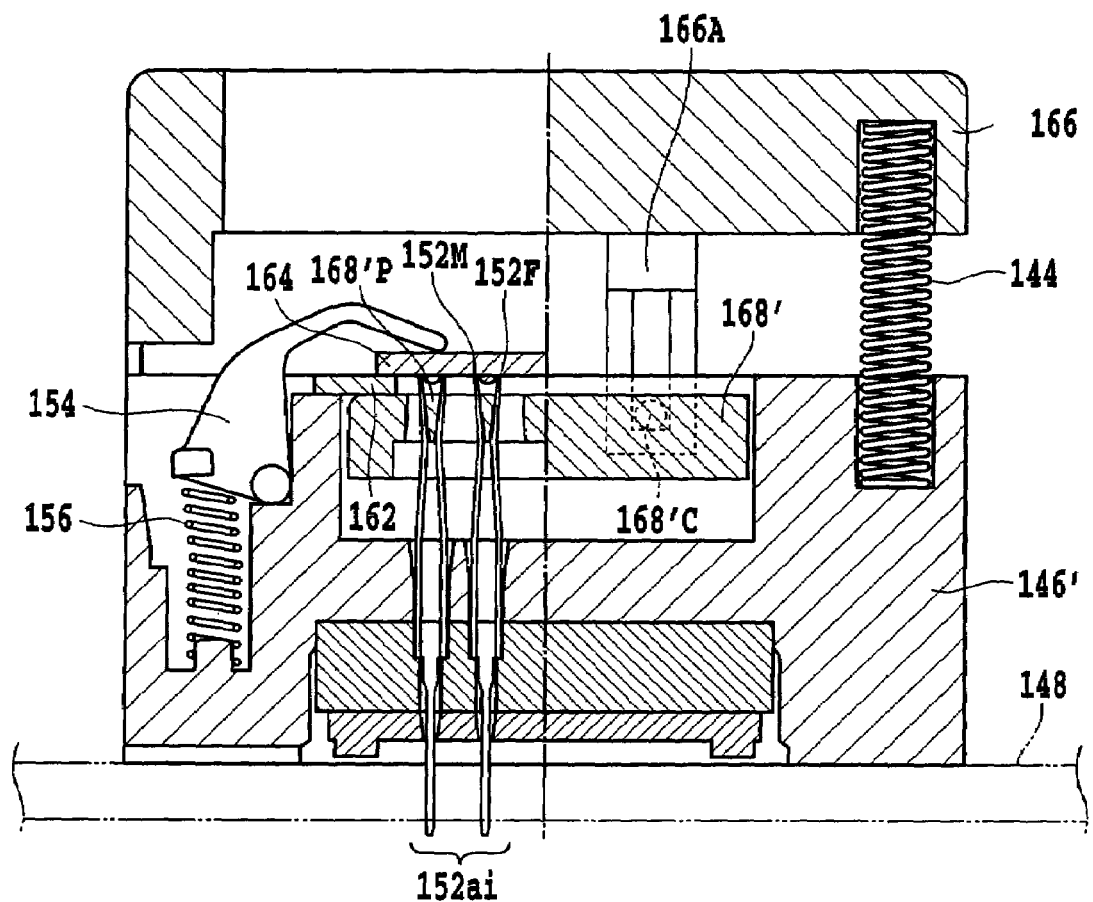
FIG. 52 is a sectional view for explaining the operation of the example shown in FIG. 49.

When the cover member 166 is further moved upward as shown in FIG. 52, each of the connection pins 168'C touches on the circumferential edge on one side of the respective slit 166b to pull the slider 168' upward. As a result, the flat surfaces FS of the movable contact pressing portions 168'P of the slider 168' are slid upward between the movable contact portions 152M and the movable contact portions 152F, and the electrode portions 164a of the semiconductor device 164 are pinched by the movable contact portions 152M and the movable contact portions 152F.

The examples shown in FIGS. 53 to 57 schematically represent seventh, eighth, ninth, and tenth embodiments of a socket for a semiconductor device according to the invention, respectively.

A timing adjusting mechanism is provided at a cover member in the first, second, third, and fourth embodiments of a socket for a semiconductor device described above. As an alternative, each of the seventh, eighth, ninth, and tenth embodiments employs a configuration in which a timing adjusting mechanism is provided at a material handling portion that is provided separately from a socket main body.

The seventh, eighth, ninth, and tenth embodiments are examples corresponding to the above-described first, second, third, and fourth embodiments, respectively, In FIGS. 53 to 57, elements identical to those in FIGS. 23, 29, 34, and 39 are indicated by like reference numerals, and the description will omit them to avoid duplication.

Figure 53:
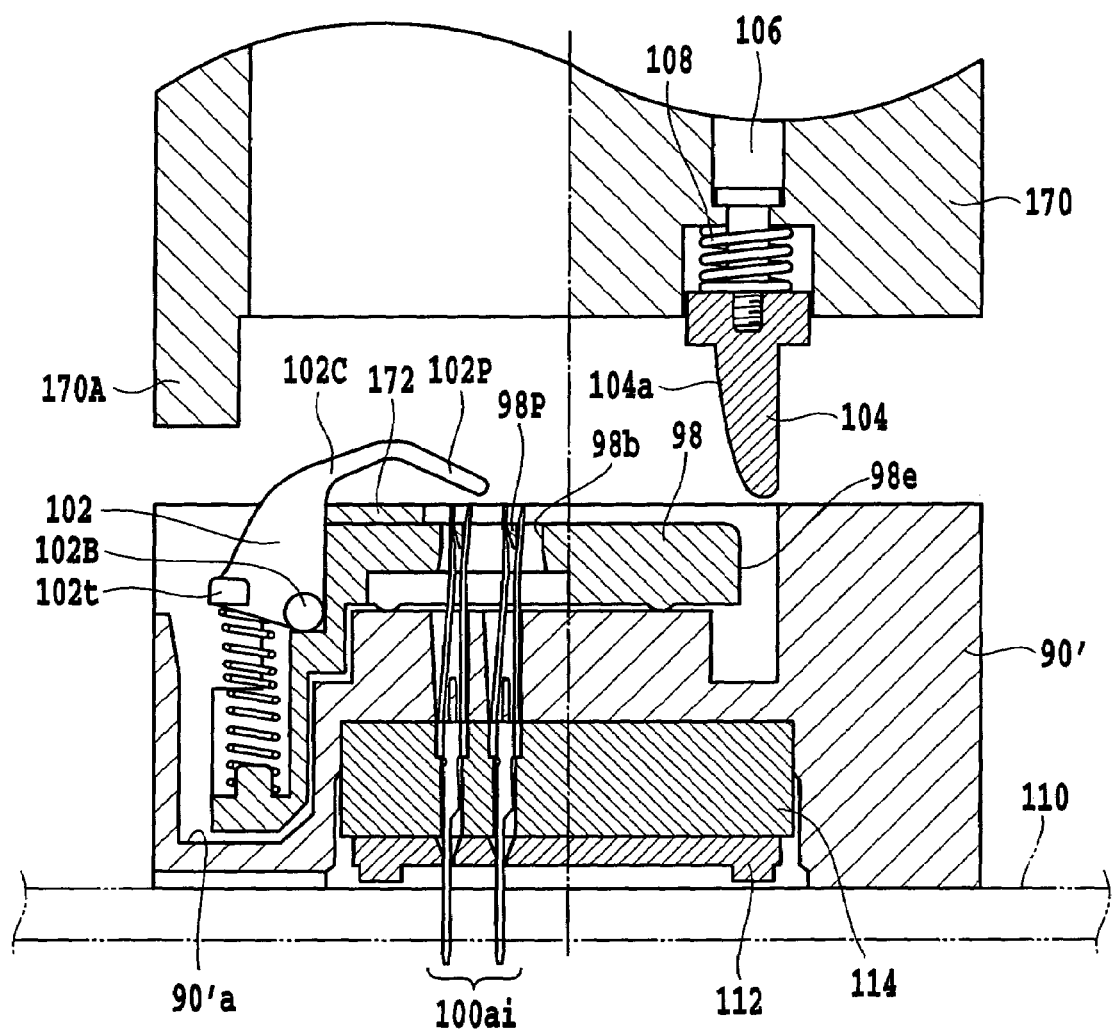
FIG. 53 is a sectional view schematically showing important portions of a configuration of a seventh embodiment of a socket for a semiconductor device according to the present invention.

In the seventh embodiment shown in FIG. 53, cam mechanisms as timing adjusting mechanisms for adjusting the timing of movement of a slider 98 are provided in four locations at predetermined intervals on a material handling portion 170 which is disposed above a socket main body 90' such that it can move up and down. FIG. 53 shows an enlarged view of one of the cam mechanisms as a representative.

Each of the cam mechanisms comprises a cam piece 104 inserted between an engaging edge portion 98e of the slider 98 and an inner surface of a sidewall of a housing portion 90a, a fixing pin 106 for supporting the cam piece 104 in a recess 170r of a material handling portion 170, and a coil spring 108 which is wound around a shaft portion of the fixing pin 106 and which urges the cam piece 104 toward the gap between the engaging edge portion 98e of the slider 98 and the inner surface of the sidewall of the housing portion 90'a.

A pressing portion 170A for pressing a protruding piece 102t of a presser member 102 is provided on a lower end of the material handling portion 170.

Figure 54:
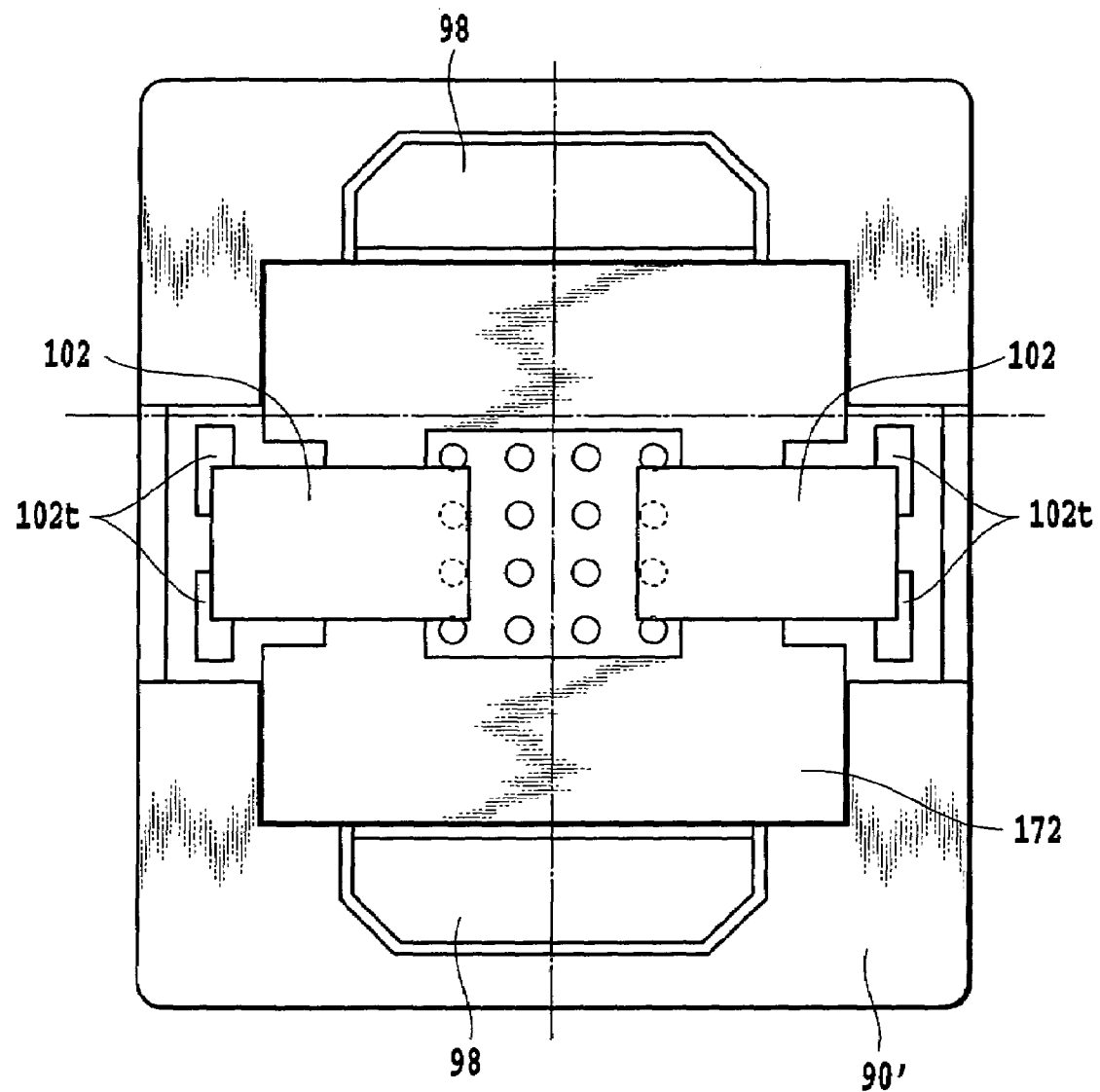
FIG. 54 is a plan view of the example shown in FIG. 53.

As shown in FIG. 54, a positioning member 172 for positioning a semiconductor device which is omitted in the illustration relative to contact terminals 100ai is provided above the slider 98 inside the socket main body 90'.

When a test is conducted on the semiconductor device in such a configuration, the protruding piece 102t is first pressed by the pressing portion 170A of the material handling portion 170 which is moved down, and the presser members 102 are moved away from each other to be in an open state, just as in the above-described first embodiment. Thereafter, the test is conducted according to a procedure similar to that in the above-described first embodiment. Therefore, the present embodiment provides effects and advantages similar to those of the above-described first embodiment.

Since no timing adjusting mechanism portion is required at the socket main body, the number of components of the socket main body can be reduced, and the configuration of the socket main body can be simplified. Therefore, the IC socket will have a high cost/performance ratio.

Figure 55:
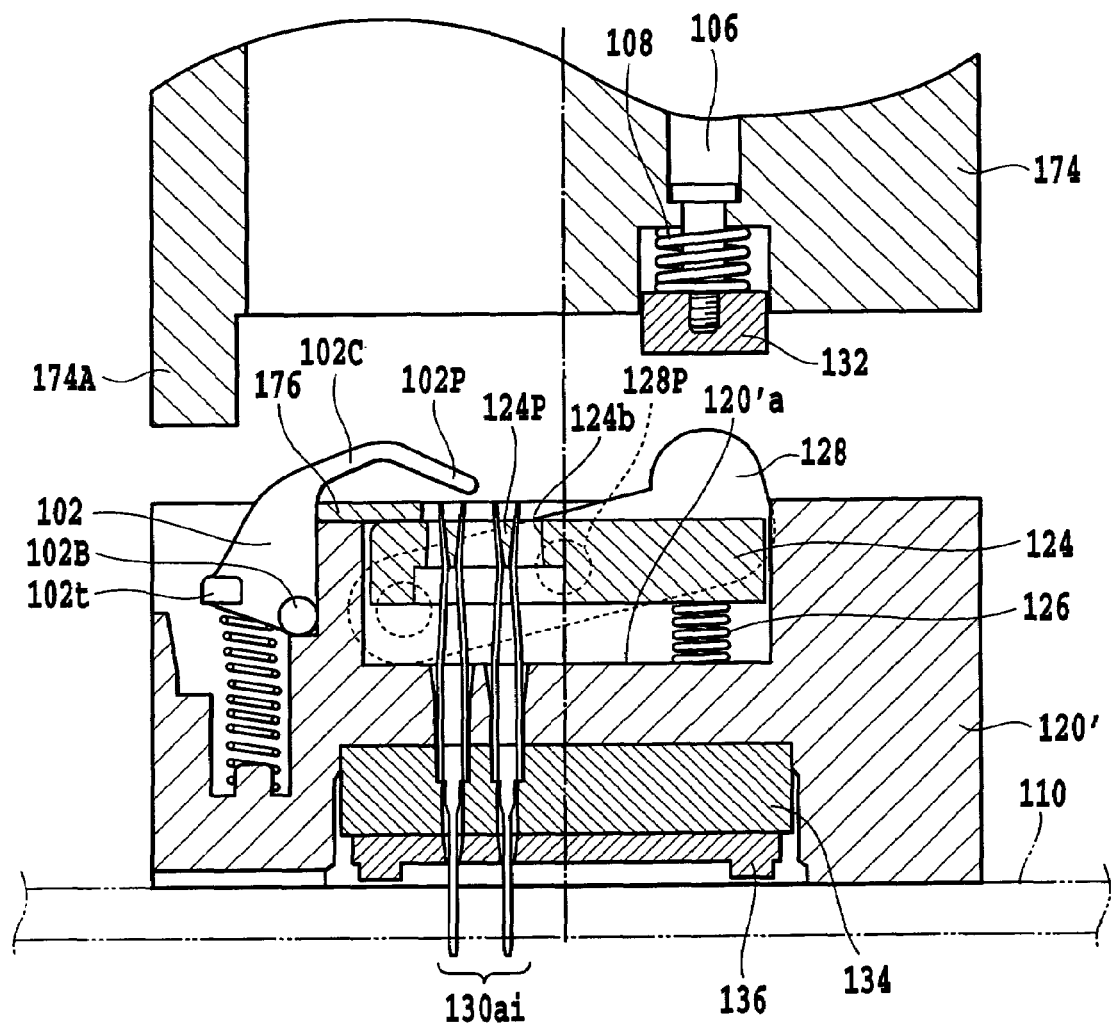
FIG. 55 is a sectional view schematically showing important portions of a configuration of an eighth embodiment of a socket for a semiconductor device according to the present invention.

In the eighth embodiment shown in FIG. 55, a timing adjusting mechanism for adjusting the timing of upward and downward movements of a slider 124 is provided in each of two locations on a material handling portion 174 disposed above a socket main body 120' such that it can be moved up and down.

Each of the timing adjusting mechanisms comprises a pressing piece 132 for pressing the other end of the lever member 128, a fixing pin 106 for supporting the pressing piece 132 in a recess 174g of the material handling portion 174, and a coil spring 108 which is wound around a shaft portion of the fixing pin 106 and which urges the pressing piece 132 toward the lever member 128.

A pressing portion 174A for pressing a protruding piece 102t of a presser member 102 is provided on a lower end of the material handling portion 174.

As shown in FIG. 55, a positioning member 176 for positioning a semiconductor device which is omitted in the illustration relative to contact terminals 130ai is provided above a slider 124 in a housing portion 120' of a socket main body 120'.

When a test is conducted on the semiconductor device in such a configuration, the protruding piece 102t is first urged by the pressing portion 174A of the material handling portion 174 which is moved down, and the presser members 102 are moved away from each other to be in an open state, just as in the above-described second embodiment. Thereafter, the test is conducted according to a procedure similar to that in the above-described second embodiment. Therefore, the present embodiment provides effects and advantages similar to those of the above-described second embodiment.

Figure 56:
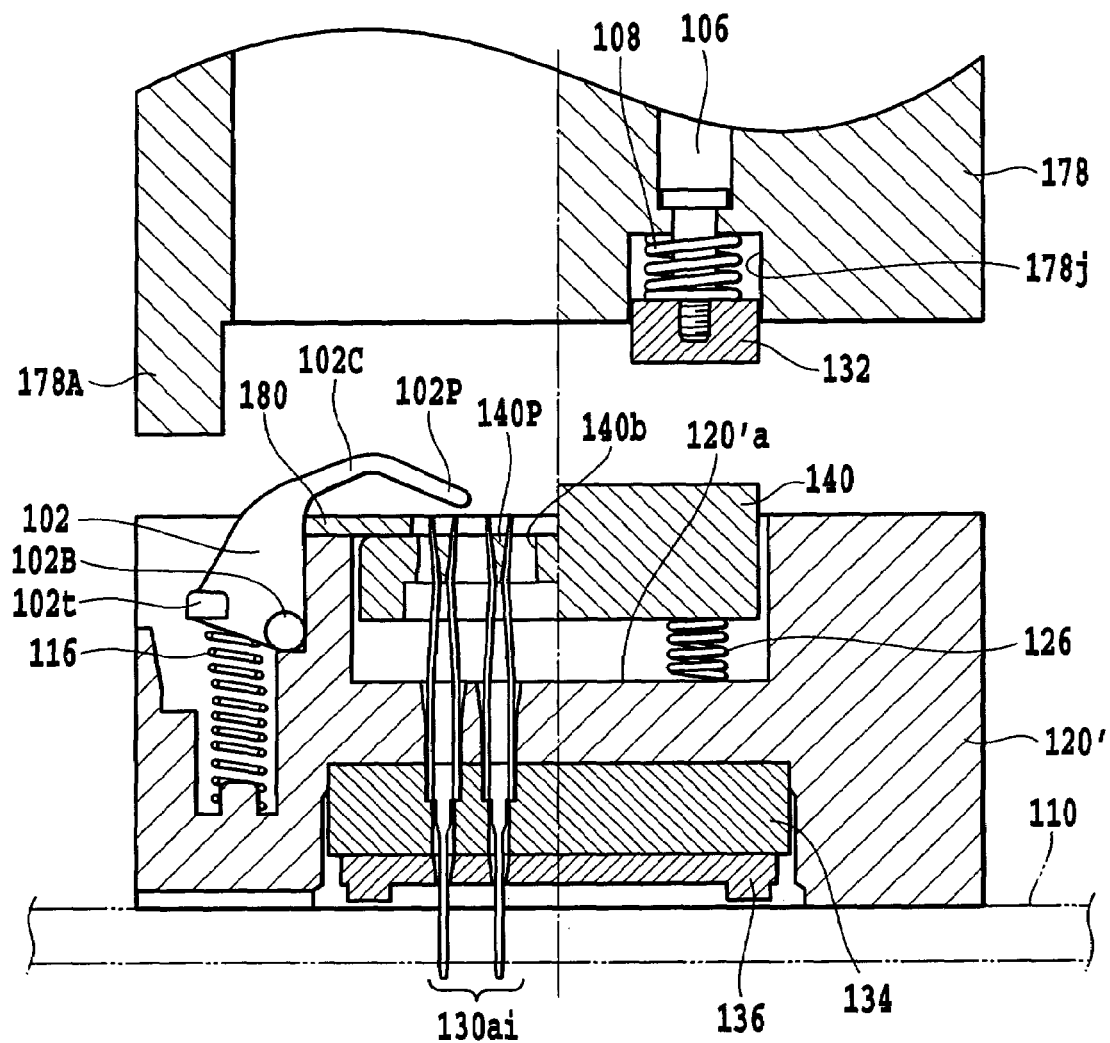
FIG. 56 is a sectional view schematically showing important portions of a configuration of a ninth embodiment of a socket for a semiconductor device according to the present invention.

In the ninth embodiment shown in FIG. 56, a timing adjusting mechanism for adjusting the timing of upward and downward movements of a slider 140 is provided in each of recesses 178j in four locations on a material handling portion 178 disposed above a socket main body 120' such that it can be moved up and down.

Each of the timing adjusting mechanisms comprises a pressing piece 132 for pressing un upper end of the slider 140, a fixing pin 106 for supporting the pressing piece 132 in a recess 92j of a cover member 92, and a coil spring 108 which is wound around a shaft portion of the fixing pin 106 and which urges the pressing piece 132 toward the upper end of the slider 140.

A pressing portion 178A for pressing a protruding piece 102t of a presser member 102 is provided on a lower end of the material handling portion 178.

As shown in FIG. 56, a positioning member 180 for positioning a semiconductor device which is omitted in the illustration relative to contact terminals 130ai is provided above the slider 140 in the socket main body 120'.

When a test is conducted on the semiconductor device in such a configuration, the protruding piece 102t is first pressed by the pressing portion 178A of the material handling portion 178 which is moved down, and the presser members 102 are moved away from each other to be in an open state, just as in the above-described third embodiment. Thereafter, the test is conducted according to a procedure similar to that in the above-described third embodiment. Therefore, the present embodiment provides effects and advantages similar to those of the above-described third embodiment.

Figure 57:
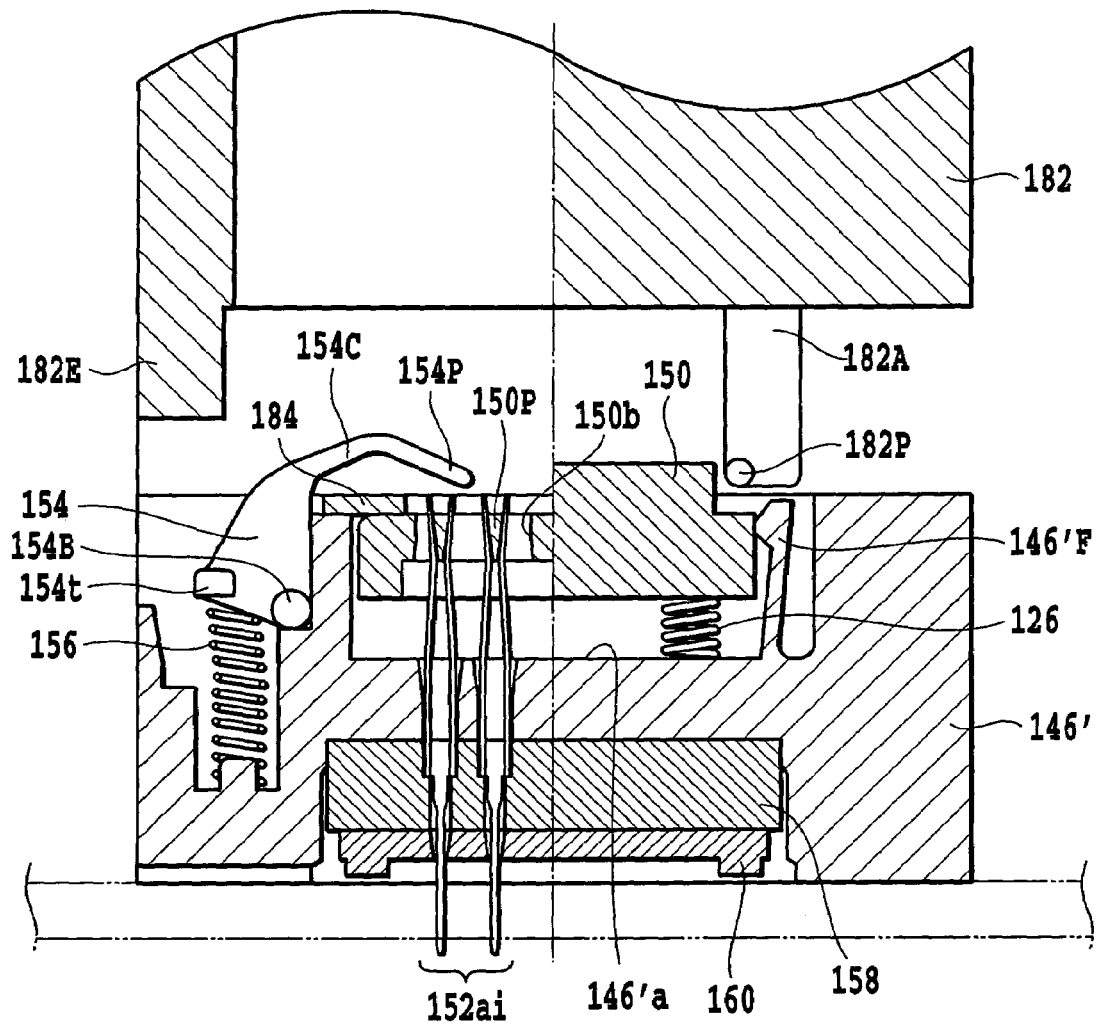
FIG. 57 is a sectional view schematically showing important portions of a configuration of a tenth embodiment of a socket for a semiconductor device according to the present invention.

In the tenth embodiment shown in FIG. 57, arms 182A having a release pin 182P protrude into spaces surrounded by edges of a slider 150 and side surfaces of hook members 146'F of a socket main body 146' at a material handling portion 182. One end of an arm 182A is secured to the material handling portion 182 in association with each corner of a housing portion 146'a.

A positioning member 184 for positioning a semiconductor device which is omitted in the illustration relative to contact terminals 152ai is provided above the slider 150 in the socket main body 146'.

When a test is conducted on the semiconductor device in such a configuration, the protruding piece 102t is first pressed by a pressing portion 182E of the material handling portion 182 which is moved down, and the presser members 102 are moved away from each other to be in an open state, just as in the above-described fourth embodiment. Thereafter, the test is conducted according to a procedure similar to that in the above-described fourth embodiment. Therefore, the present embodiment provides effects and advantages similar to those of the above-described fourth embodiment.

Although the positioning members 172, 176, 180, and 182 are used in the above-described seventh, eighth, ninth, and tenth embodiments, respectively, such examples are not limiting, and the above-described positioning members 94 and 122 may be used, for example.

Furthermore, in the above-described first and second embodiments of a device for mounting and demounting a semiconductor device according to the invention (FIGS. 1 and 8), the IC socket operating members 28 and 78 and the socket 2 for a semiconductor device may be replaced with the socket main bodies 90', 120', and 146', respectively, in the above-described seventh, eighth, ninth, and tenth embodiments of a socket for a semiconductor device. Further, a configuration may be employed in which the timing adjusting mechanisms according to the seventh, eighth, ninth, and tenth embodiments are provided at a material handling portion (MH) 10.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A socket for a semiconductor device comprising:
 a cover member configured to move between a first position and a second position;
 a socket main body disposed below said cover member, said socket main body having one or more contact terminals having a pair of contact portions configured to electrically connect to an electrode portion of the semiconductor device;
 a slider movably disposed in said socket main body and configured to direct the contact portions for electrical connection with the electrode portion of the semiconductor device;
 a cam mechanism configured to move said slider as said cover member moves from said first position to said second position, thereby directing said pair of contact portions to electrically connect to the electrode portion of the semiconductor device; and
 a latch mechanism having touch portions, wherein the touch portions engage the semiconductor device as said cover member moves from the first position to the second position and engage the semiconductor device prior to said contact portions electrically connecting to said electrode portion of the semiconductor device.

2. The socket of claim 1, wherein said cam mechanism having includes a cam surface that is configured to contact said slider; and
 wherein the cam surface is curved in a manner such that when the cam surface contacts said slider, said slider moves to electrically connect said pair of contact portions to the electrode portion of the semiconductor device after said latch mechanism engages the semiconductor device.

3. The socket for a semiconductor device of claim 1, wherein said cam mechanism is configured to move in response to said cover member.

4. The socket for a semiconductor device of claim 3, wherein said latch mechanism moves to hold the semiconductor device in place as said cover member moves up and said latch mechanism moves to release the semiconductor device as said cover member moves down.

5. A socket for a semiconductor device comprising:
a cover member configured to move between a first position and a second position;
a socket main body disposed below said cover member, said socket main body having one or more contact terminals and each contact terminal having a pair of contact portions configured to electrically connect to an electrode portion of the semiconductor device;
a slider movably disposed in said socket main body and configured to direct the contact portions for electrical connection with the electrode portion of the semiconductor device;
a timing adjusting mechanism configured to move said slider as said cover member moves from said first position to said second position, thereby directing said pair of contact portions to electrically connect to the electrode portion of the semiconductor device;
a latch mechanism having touch portions, wherein the touch portions engage the semiconductor device as said cover member moves from the first position to the second position and engage the semiconductor device prior to said contact portions electrically connecting to said electrode portion of the semiconductor device.

6. The socket of claim 5, wherein said timing adjusting mechanism comprises a cam mechanism having a cam surface, said cam surface configured to contact said slider; and
wherein the cam surface is curved in a manner such that when the cam surface contacts said slider, said slider moves to electrically connect said pair of contact portions to the electrode portion of the semiconductor device after said latch mechanism engages the semiconductor device.

7. The socket for a semiconductor device of claim 5, wherein said timing adjusting mechanism is configured to move in response to said cover member.

8. The socket for a semiconductor device of claim 7, wherein said latch mechanism moves to hold the semiconductor in place as the cover member moves up and said latch mechanism moves to release the semiconductor device as the cover member moves down.

9. A socket for a semiconductor device comprising:
a cover member configured to move between a first position, a second position, and a third position;
a socket main body disposed below said cover member, said socket main body having one or more contact terminals having a pair of contact portions configured to electrically connect to an electrode portion of the semiconductor device;
a slider movably disposed in said socket main body and configured to direct the contact portions for electrical connection with the electrode portion;
a latch mechanism having touch portions, and
a timing adjusting mechanism configured to engage said slider to allow the contact terminals to electrically connect to the electrode portion, wherein
when the cover member occupies the first position, the touch portions of the latch mechanism occupy a first position and the slider causes the contact portions of the one or more contact terminals to occupy a first position,
when the cover member occupies the second position, the touch portions of the latch mechanism occupy a second position and the slider causes the contact portions of the one or more contact terminals to occupy the first position, and
when the cover member occupies the third position, the touch portions of the latch mechanism occupy the second position and the slider causes the contact portions of the one or more contact terminals to occupy a second position.

10. The socket for a semiconductor device of claim 9, wherein
the first position occupied by the touch portions of the latch mechanism is an open position, and
the second position occupied by the touch portions of the latch mechanism is a closed position.

11. The socket for a semiconductor device of claim 10, wherein
the first position occupied by the contact portions of the of the one or more contact terminals is an open position, and
the second position occupied by the contact portions of the of the one or more contact terminals is a closed position.

12. A socket for a semiconductor device comprising:
a cover member configured to move between a first position and a second position;
a socket main body disposed below said cover member, said socket main body having one or more contact terminals and each contact terminal having a pair of contact portions configured to electrically connect to an electrode portion of the semiconductor device;
a slider movably disposed in said socket main body and configured to direct the contact portions for electrical connection with the electrode portion of the semiconductor device;
a timing adjusting mechanism movably provided in said cover member via a coil spring for biasing said timing adjusting mechanism in a direction in which the contact portions are away from each other through said slider, said timing adjusting mechanism configured to move said slider as said cover member moves from said first position to said second position, thereby directing said pair of contact portions to electrically connect to the electrode portion of the semiconductor device;
a latch mechanism having touch portions, wherein the touch portions engage the semiconductor device as said cover member moves from the first position to the second position and engage the semiconductor device prior to said contact portions electrically connecting to said electrode portion of the semiconductor device.

13. The socket for a semiconductor device as claimed in claim 12, wherein said timing adjusting mechanism comprises a cam mechanism having a cam surface, said cam surface configured to contact said slider; and
wherein the cam surface is curved in a manner such that when the cam surface contacts said slider, said slider moves to electrically connect said pair of contact portions to the electrode portion of the semiconductor device after said latch mechanism engages the semiconductor device.

14. The socket for a semiconductor device as claimed in claim 13, wherein a spring constant of the coil spring is set at a value such that the cam surface does not come out from a gap between an edge of said slider and an inner surface of said socket main body after said cover member is moved up.

* * * * *